(12) United States Patent
Lo et al.

(10) Patent No.: US 7,960,269 B2
(45) Date of Patent: Jun. 14, 2011

(54) METHOD FOR FORMING A DOUBLE EMBOSSING STRUCTURE

(75) Inventors: Hsin-Jung Lo, Yonghe (TW);
Mou-Shiung Lin, Hsin-Chu (TW);
Chiu-Ming Chou, Kao-hsiung (TW);
Chien-Kang Chou, Tainan Hsien (TW)

(73) Assignee: Megica Corporation, Hsin-Chu (TW)

( * ) Notice: Subject to any disclaimer, the term of this patent is extended or adjusted under 35 U.S.C. 154(b) by 187 days.

(21) Appl. No.: 11/491,117

(22) Filed: Jul. 24, 2006

(65) Prior Publication Data

US 2007/0045855 A1 Mar. 1, 2007

Related U.S. Application Data

(60) Provisional application No. 60/701,849, filed on Jul. 22, 2005.

(51) Int. Cl.
*H01L 21/44* (2006.01)

(52) U.S. Cl. ........ 438/598; 438/584; 438/597; 257/777; 257/778

(58) Field of Classification Search .................. 438/598; 257/777, 778, E21.004, 508, E23.021, E25.021, 257/173, 174

See application file for complete search history.

(56) References Cited

U.S. PATENT DOCUMENTS

| | | |
|---|---|---|
| 3,668,484 A | 6/1972 | Greig |
| 4,021,838 A | 5/1977 | Warwick |
| 4,051,508 A | 9/1977 | Sato et al. |
| 4,598,307 A | 7/1986 | Wakabayashi |
| 4,606,998 A | 8/1986 | Clodgo |
| 4,685,998 A | 8/1987 | Quinn et al. |
| 4,825,276 A | 4/1989 | Kobayashi |
| 4,885,841 A | 12/1989 | McNabb |
| 5,008,102 A | 4/1991 | York |

(Continued)

FOREIGN PATENT DOCUMENTS

EP 0884783 12/1998

(Continued)

OTHER PUBLICATIONS

Burghartz et al., "Sprial Inductors and Transmission Lines in Silicon Technology Using Copper-Damoscene Inter Connects and Low-Loss Substrates", *IEEE*, Theory and Techniques, vol. 45, No. 10, pp. 1961-1968, Oct. 1997.

(Continued)

*Primary Examiner* — Thao X Le
*Assistant Examiner* — Eric W Jones
(74) *Attorney, Agent, or Firm* — McDermott Will & Emery, LLP

(57) ABSTRACT

A method for fabricating a circuitry component comprises depositing a first metal layer over a substrate; forming a first pattern-defining layer over said first metal layer, a first opening in said first pattern-defining layer exposing said first metal layer; depositing a second metal layer over said first metal layer exposed by said first opening; removing said first pattern-defining layer; forming a second pattern-defining layer over said second metal layer, a second opening in said second pattern-defining layer exposing said second metal layer; depositing a third metal layer over said second metal layer exposed by said second opening; removing said second pattern-defining layer; removing said first metal layer not under said second metal layer; and forming a polymer layer over said second metal layer, wherein said third metal layer is used as a metal bump bonded to an external circuitry.

23 Claims, 55 Drawing Sheets

U.S. PATENT DOCUMENTS

| | | | |
|---|---|---|---|
| 5,049,979 A | 9/1991 | Hashemi | |
| 5,055,907 A | 10/1991 | Jacobs | |
| 5,083,187 A | 1/1992 | Lamson | |
| 5,095,357 A | 3/1992 | Andoh et al. | |
| 5,095,402 A | 3/1992 | Hernandez et al. | |
| 5,106,461 A * | 4/1992 | Volfson et al. | 205/125 |
| 5,108,950 A | 4/1992 | Wakabayashi et al. | |
| 5,212,403 A | 5/1993 | Nakanishi et al. | |
| 5,226,232 A | 7/1993 | Boyd | |
| 5,227,012 A | 7/1993 | Brandli et al. | |
| 5,310,699 A | 5/1994 | Chikawa et al. | |
| 5,328,553 A | 7/1994 | Poon | |
| 5,370,766 A | 12/1994 | Desaigoudar et al. | |
| 5,372,967 A | 12/1994 | Sundaram et al. | |
| 5,384,274 A | 1/1995 | Kanehachi | |
| 5,387,551 A | 2/1995 | Mizoguchi | |
| 5,391,901 A | 2/1995 | Tanabe | |
| 5,406,512 A | 4/1995 | Kagenishi | |
| 5,416,356 A | 5/1995 | Staudinger et al. | |
| 5,422,315 A | 6/1995 | Kobayashi | |
| 5,446,311 A | 8/1995 | Ewen et al. | |
| 5,455,064 A | 10/1995 | Chou et al. | |
| 5,455,885 A | 10/1995 | Cameron | |
| 5,465,879 A | 11/1995 | La et al. | |
| 5,468,984 A | 11/1995 | Efland | |
| 5,478,773 A | 12/1995 | Dow et al. | |
| 5,485,038 A | 1/1996 | Licari et al. | |
| 5,501,006 A | 3/1996 | Gehman, Jr. et al. | |
| 5,508,561 A | 4/1996 | Tago et al. | |
| 5,519,582 A | 5/1996 | Matsuzaki | |
| 5,527,998 A | 6/1996 | Anderson et al. | |
| 5,532,512 A | 7/1996 | Fillion et al. | |
| 5,534,442 A * | 7/1996 | Parker et al. | 438/25 |
| 5,534,465 A | 7/1996 | Frye et al. | |
| 5,539,241 A | 7/1996 | Abidi et al. | |
| 5,576,680 A | 11/1996 | Ling | |
| 5,608,262 A | 3/1997 | Degani et al. | |
| 5,629,240 A | 5/1997 | Malladi et al. | |
| 5,631,499 A | 5/1997 | Hosomi et al. | |
| 5,635,767 A | 6/1997 | Wenzel et al. | |
| 5,656,849 A | 8/1997 | Burghartz et al. | |
| 5,659,201 A | 8/1997 | Wollesen | |
| 5,686,764 A | 11/1997 | Fulcher | |
| 5,691,248 A | 11/1997 | Cronin et al. | |
| 5,726,502 A | 3/1998 | Beddingfield | |
| 5,742,100 A | 4/1998 | Schroeder et al. | |
| 5,763,108 A | 6/1998 | Chang et al. | |
| 5,767,564 A | 6/1998 | Kunimatsu et al. | |
| 5,789,303 A | 8/1998 | Leung et al. | |
| 5,792,594 A | 8/1998 | Brown et al. | |
| 5,795,818 A | 8/1998 | Marrs | |
| 5,818,110 A | 10/1998 | Cronin | |
| 5,827,776 A | 10/1998 | Bandyopadhyay et al. | |
| 5,827,778 A | 10/1998 | Yamada | |
| 5,834,844 A | 11/1998 | Akagawa et al. | |
| 5,838,067 A | 11/1998 | Baek | |
| 5,842,626 A | 12/1998 | Bhansali et al. | |
| 5,854,513 A | 12/1998 | Kim | |
| 5,874,770 A | 2/1999 | Saia et al. | |
| 5,883,422 A | 3/1999 | Anand et al. | |
| 5,883,435 A | 3/1999 | Geffken et al. | |
| 5,884,990 A | 3/1999 | Burghartz et al. | |
| 5,902,686 A | 5/1999 | Mis | |
| 5,904,546 A | 5/1999 | Wood | |
| 5,910,020 A | 6/1999 | Yamada | |
| 5,915,169 A | 6/1999 | Heo | |
| 5,929,508 A | 7/1999 | Delgado et al. | |
| 5,930,637 A | 7/1999 | Chuang | |
| 5,949,654 A | 9/1999 | Fukuoka | |
| 5,953,626 A | 9/1999 | Hause | |
| 5,969,422 A | 10/1999 | Ting et al. | |
| 5,969,424 A | 10/1999 | Matsuki et al. | |
| 5,972,734 A | 10/1999 | Carichner et al. | |
| 6,002,161 A | 12/1999 | Yamazaki | |
| 6,004,831 A | 12/1999 | Yamazaki et al. | |
| 6,008,102 A | 12/1999 | Alford et al. | |
| 6,013,571 A | 1/2000 | Morrell | |
| 6,022,792 A | 2/2000 | Ishii et al. | |
| 6,023,407 A | 2/2000 | Farooq et al. | |
| 6,025,261 A | 2/2000 | Farrar et al. | |
| 6,030,877 A | 2/2000 | Lee et al. | |
| 6,031,445 A | 2/2000 | Marty et al. | |
| 6,040,226 A | 3/2000 | Wojnarowski et al. | |
| 6,043,109 A | 3/2000 | Yang | |
| 6,043,430 A | 3/2000 | Chun | |
| 6,046,101 A | 4/2000 | Dass | |
| 6,051,489 A | 4/2000 | Young et al. | |
| 6,077,726 A | 6/2000 | Mistry et al. | |
| 6,097,080 A | 8/2000 | Nakanishi et al. | |
| 6,100,548 A | 8/2000 | Nguyen | |
| 6,107,180 A | 8/2000 | Munroe | |
| 6,114,938 A | 9/2000 | Iida et al. | |
| 6,130,457 A | 10/2000 | Yu | |
| 6,133,079 A | 10/2000 | Zhu et al. | |
| 6,140,197 A | 10/2000 | Chu et al. | |
| 6,144,100 A | 11/2000 | Shen et al. | |
| 6,146,958 A | 11/2000 | Zhao et al. | |
| 6,147,857 A | 11/2000 | Worley et al. | |
| 6,168,854 B1 | 1/2001 | Gibbs | |
| 6,169,030 B1 | 1/2001 | Naik et al. | |
| 6,169,319 B1 | 1/2001 | Malinovich et al. | |
| 6,169,320 B1 | 1/2001 | Stacey | |
| 6,174,803 B1 | 1/2001 | Harvey | |
| 6,177,731 B1 | 1/2001 | Ishida et al. | |
| 6,180,445 B1 | 1/2001 | Tsai | |
| 6,181,569 B1 | 1/2001 | Chakravorty | |
| 6,184,121 B1 * | 2/2001 | Buchwalter et al. | 438/622 |
| 6,184,143 B1 | 2/2001 | Ohashi et al. | |
| 6,184,159 B1 | 2/2001 | Lou et al. | |
| 6,184,589 B1 | 2/2001 | Budnaitis et al. | |
| 6,187,680 B1 | 2/2001 | Costrini et al. | |
| 6,191,468 B1 | 2/2001 | Forbes et al. | |
| 6,221,727 B1 | 4/2001 | Chan et al. | |
| 6,228,447 B1 | 5/2001 | Suzuki et al. | |
| 6,229,711 B1 | 5/2001 | Yoneda | |
| 6,236,101 B1 | 5/2001 | Erdeljac et al. | |
| 6,236,103 B1 | 5/2001 | Bernstein | |
| 6,242,791 B1 | 6/2001 | Jou | |
| 6,245,594 B1 | 6/2001 | Wu et al. | |
| 6,249,764 B1 | 6/2001 | Kamae et al. | |
| 6,251,501 B1 | 6/2001 | Higdon | |
| 6,255,714 B1 | 7/2001 | Kossives et al. | |
| 6,258,652 B1 | 7/2001 | Stacey | |
| 6,259,593 B1 | 7/2001 | Moriwaki et al. | |
| 6,261,944 B1 | 7/2001 | Mehta | |
| 6,261,994 B1 | 7/2001 | Bourdelais et al. | |
| 6,270,659 B1 | 8/2001 | Bagci | |
| 6,272,736 B1 | 8/2001 | Lee | |
| 6,277,669 B1 | 8/2001 | Kung | |
| 6,278,264 B1 | 8/2001 | Burstein et al. | |
| 6,287,893 B1 | 9/2001 | Elenius | |
| 6,287,931 B1 | 9/2001 | Chen | |
| 6,288,447 B1 | 9/2001 | Amishiro et al. | |
| 6,300,250 B1 | 10/2001 | Tsai | |
| 6,303,423 B1 | 10/2001 | Lin | |
| 6,313,491 B1 | 11/2001 | Shuto | |
| 6,329,715 B1 | 12/2001 | Hayashi | |
| 6,356,453 B1 | 3/2002 | Juskey | |
| 6,359,328 B1 | 3/2002 | Dubin | |
| 6,362,087 B1 | 3/2002 | Wang | |
| 6,365,480 B1 | 4/2002 | Huppert et al. | |
| 6,365,498 B1 | 4/2002 | Chu et al. | |
| 6,375,062 B1 | 4/2002 | Higdon | |
| 6,376,895 B2 | 4/2002 | Farrar | |
| 6,380,061 B1 | 4/2002 | Kobayashi | |
| 6,383,916 B1 | 5/2002 | Lin | |
| 6,399,975 B1 | 6/2002 | Cheong | |
| 6,399,997 B1 | 6/2002 | Lin et al. | |
| 6,404,615 B1 | 6/2002 | Wijeyesekera et al. | |
| 6,410,414 B1 | 6/2002 | Lee | |
| 6,410,435 B1 | 6/2002 | Ryan | |
| 6,416,356 B1 | 7/2002 | Hutchins et al. | |
| 6,417,089 B1 | 7/2002 | Kim et al. | |
| 6,420,773 B1 | 7/2002 | Liou | |
| 6,424,034 B1 | 7/2002 | Ahn et al. | |
| 6,426,281 B1 | 7/2002 | Lin et al. | |
| 6,429,120 B1 | 8/2002 | Ahn et al. | |

| | | | | | | |
|---|---|---|---|---|---|---|
| 6,429,764 B1 | 8/2002 | Karam et al. | | 6,952,049 B1 | 10/2005 | Ogawa |
| 6,440,750 B1 | 8/2002 | Feygenson et al. | | 6,959,856 B2 | 11/2005 | Oh |
| 6,441,715 B1 | 8/2002 | Johnson | | 6,963,136 B2 | 11/2005 | Shinozaki |
| 6,445,271 B1 | 9/2002 | Johnson | | 6,965,165 B2 | 11/2005 | Lin |
| 6,455,885 B1 | 9/2002 | Lin | | 6,977,435 B2 | 12/2005 | Kim |
| 6,455,915 B1 | 9/2002 | Wong | | 7,012,339 B2 | 3/2006 | Terui |
| 6,456,183 B1 | 9/2002 | Basteres et al. | | 7,045,899 B2 | 5/2006 | Yamane et al. |
| 6,459,135 B1 | 10/2002 | Basteres et al. | | 7,078,331 B2 | 7/2006 | Kwon |
| 6,465,879 B1 | 10/2002 | Taguchi | | 7,078,822 B2 | 7/2006 | Dias et al. |
| 6,472,745 B1 | 10/2002 | Iizuka | | 7,087,927 B1 | 8/2006 | Weaver et al. |
| 6,475,904 B2 | 11/2002 | Okoroanyanwu et al. | | 7,220,657 B2 | 5/2007 | Ihara et al. |
| 6,478,773 B1 | 11/2002 | Gandhi et al. | | 7,239,014 B2 | 7/2007 | Ogawa |
| 6,479,341 B1 | 11/2002 | Lu | | 7,239,028 B2 | 7/2007 | Anzai |
| 6,479,900 B1 | 11/2002 | Shinogi et al. | | 7,294,870 B2 | 11/2007 | Lin |
| 6,486,530 B1 | 11/2002 | Sasagawa et al. | | 7,294,871 B2 | 11/2007 | Lin |
| 6,489,647 B1 | 12/2002 | Lin | | 7,309,920 B2 | 12/2007 | Lin |
| 6,489,656 B1 | 12/2002 | Lin | | 7,319,377 B2 | 1/2008 | Lee |
| 6,495,442 B1 | 12/2002 | Lin et al. | | 7,329,954 B2 | 2/2008 | Lin |
| 6,500,724 B1 | 12/2002 | Zurcher et al. | | 7,355,282 B2 | 4/2008 | Lin |
| 6,501,169 B1 | 12/2002 | Aoki et al. | | 7,358,610 B2 | 4/2008 | Lin |
| 6,501,185 B1 | 12/2002 | Chow et al. | | 7,368,376 B2 | 5/2008 | Lin |
| 6,504,227 B1 | 1/2003 | Matsuo et al. | | 7,372,085 B2 | 5/2008 | Lin |
| 6,515,369 B1 | 2/2003 | Lin | | 7,372,155 B2 | 5/2008 | Lin |
| 6,518,165 B1 | 2/2003 | Han et al. | | 7,382,058 B2 | 6/2008 | Lin |
| 6,544,880 B1 | 4/2003 | Akram | | 7,384,864 B2 | 6/2008 | Lin |
| 6,545,354 B1 | 4/2003 | Aoki et al. | | 7,385,291 B2 | 6/2008 | Lin |
| 6,559,409 B1 | 5/2003 | Cadet | | 7,385,292 B2 | 6/2008 | Lin |
| 6,559,528 B2 | 5/2003 | Watase et al. | | 7,388,292 B2 | 6/2008 | Lin |
| 6,566,731 B2 | 5/2003 | Ahn et al. | | 7,396,756 B2 | 7/2008 | Lin |
| 6,570,247 B1 | 5/2003 | Eiles et al. | | 7,397,135 B2 | 7/2008 | Lin |
| 6,570,251 B1 | 5/2003 | Akram | | 7,405,149 B1 | 7/2008 | Lin |
| 6,586,309 B1 | 7/2003 | Yeo et al. | | 7,416,971 B2 | 8/2008 | Lin |
| 6,605,528 B1 | 8/2003 | Lin | | 7,420,276 B2 | 9/2008 | Lin |
| 6,613,663 B2 | 9/2003 | Furuya | | 7,422,941 B2 | 9/2008 | Lin |
| 6,614,091 B1 | 9/2003 | Downey et al. | | 7,422,976 B2 | 9/2008 | Lin |
| 6,620,728 B2 | 9/2003 | Lin | | 7,423,346 B2 | 9/2008 | Lin |
| 6,636,139 B2 | 10/2003 | Tsai et al. | | 7,425,764 B2 | 9/2008 | Lin |
| 6,638,844 B1 | 10/2003 | Verma et al. | | 7,442,969 B2 | 10/2008 | Lin |
| 6,639,299 B2 | 10/2003 | Aoki | | 7,443,033 B2 | 10/2008 | Lin |
| 6,642,136 B1 | 11/2003 | Lee | | 7,456,100 B2 | 11/2008 | Lin |
| 6,644,536 B2 | 11/2003 | Ratificar et al. | | 7,459,761 B2 | 12/2008 | Lin |
| 6,646,347 B2 | 11/2003 | Sarihan et al. | | 7,465,654 B2 | 12/2008 | Chou et al. |
| 6,649,509 B1 * | 11/2003 | Lin et al. ............ 438/618 | | 7,465,975 B2 | 12/2008 | Lin |
| 6,653,563 B2 | 11/2003 | Bohr | | 7,470,988 B2 | 12/2008 | Lin |
| 6,673,690 B2 | 1/2004 | Chuang et al. | | 7,482,693 B2 | 1/2009 | Lin |
| 6,683,380 B2 | 1/2004 | Efland et al. | | 7,531,417 B2 | 5/2009 | Lin |
| 6,700,162 B2 | 3/2004 | Lin et al. | | 7,547,969 B2 | 6/2009 | Chou et al. |
| 6,706,554 B2 | 3/2004 | Ogura | | 2001/0016410 A1 | 8/2001 | Cheng et al. |
| 6,707,124 B2 | 3/2004 | Wachtler et al. | | 2001/0017417 A1 | 8/2001 | Kuroda |
| 6,707,159 B1 * | 3/2004 | Kumamoto et al. ......... 257/778 | | 2001/0019168 A1 | 9/2001 | Willer et al. |
| 6,716,693 B1 | 4/2004 | Chan et al. | | 2001/0026954 A1 | 10/2001 | Takao |
| 6,720,659 B1 | 4/2004 | Akahori | | 2001/0028098 A1 | 10/2001 | Liou |
| 6,734,563 B2 | 5/2004 | Lin et al. | | 2001/0035586 A1 | 11/2001 | Nakamura et al. |
| 6,746,898 B2 | 6/2004 | Lin et al. | | 2001/0040290 A1 | 11/2001 | Sakurai et al. |
| 6,756,295 B2 | 6/2004 | Lin | | 2001/0051426 A1 | 12/2001 | Pozder et al. |
| 6,756,664 B2 | 6/2004 | Yang | | 2002/0000665 A1 | 1/2002 | Barr et al. |
| 6,759,275 B1 | 7/2004 | Lee et al. | | 2002/0008301 A1 | 1/2002 | Liou et al. |
| 6,762,115 B2 | 7/2004 | Lin | | 2002/0016079 A1 | 2/2002 | Dykstra |
| 6,762,122 B2 | 7/2004 | Mis et al. | | 2002/0017730 A1 | 2/2002 | Tahara et al. |
| 6,764,939 B1 | 7/2004 | Yoshitaka | | 2002/0043723 A1 | 4/2002 | Shimizu et al. |
| 6,780,748 B2 | 8/2004 | Yamaguchi et al. | | 2002/0050626 A1 | 5/2002 | Onuma et al. |
| 6,790,751 B2 | 9/2004 | Tsuruta | | 2002/0064922 A1 | 5/2002 | Lin |
| 6,791,178 B2 | 9/2004 | Yamaguchi et al. | | 2002/0079576 A1 | 6/2002 | Seshan |
| 6,800,534 B2 | 10/2004 | Hsieh | | 2002/0089062 A1 | 7/2002 | Saran et al. |
| 6,841,872 B1 | 1/2005 | Ha et al. | | 2002/0100975 A1 | 8/2002 | Kanda |
| 6,847,066 B2 | 1/2005 | Tahara et al. | | 2002/0158334 A1 | 10/2002 | Vu et al. |
| 6,852,616 B2 | 2/2005 | Sahara et al. | | 2002/0180064 A1 | 12/2002 | Hwan |
| 6,853,076 B2 | 2/2005 | Datta et al. | | 2003/0006062 A1 | 1/2003 | Stone et al. |
| 6,853,078 B2 | 2/2005 | Yamaya | | 2003/0008133 A1 | 1/2003 | Paik |
| 6,869,870 B2 | 3/2005 | Lin | | 2003/0020163 A1 | 1/2003 | Hung |
| 6,875,681 B1 | 4/2005 | Bohr | | 2003/0037959 A1 | 2/2003 | Master et al. |
| 6,897,507 B2 | 5/2005 | Lin | | 2003/0038331 A1 | 2/2003 | Aoki et al. |
| 6,903,459 B2 | 6/2005 | Nakatani | | 2003/0052409 A1 | 3/2003 | Matsuo |
| 6,914,331 B2 | 7/2005 | Shimoishizaka et al. | | 2003/0071326 A1 | 4/2003 | Lin |
| 6,921,980 B2 | 7/2005 | Nakanishi et al. | | 2003/0075752 A1 * | 4/2003 | Motoyama .................. 257/306 |
| 6,936,531 B2 | 8/2005 | Lin | | 2003/0076209 A1 | 4/2003 | Tsai et al. |
| 6,940,169 B2 | 9/2005 | Jin et al. | | 2003/0080416 A1 | 5/2003 | Jorger |
| 6,943,428 B2 | 9/2005 | Furukawa | | 2003/0102551 A1 | 6/2003 | Kikuchi |
| 6,943,440 B2 | 9/2005 | Kim et al. | | 2003/0121958 A1 | 7/2003 | Ratificar et al. |

| | | |
|---|---|---|
| 2003/0124835 A1 | 7/2003 | Lin et al. |
| 2003/0127730 A1 | 7/2003 | Weng |
| 2003/0127734 A1 | 7/2003 | Lee |
| 2003/0155570 A1 | 8/2003 | Leidy |
| 2003/0162383 A1 | 8/2003 | Yamaya |
| 2003/0168733 A1 | 9/2003 | Hashimoto |
| 2003/0183332 A1 | 10/2003 | Simila |
| 2003/0197283 A1 | 10/2003 | Choi |
| 2003/0218246 A1 | 11/2003 | Abe et al. |
| 2003/0219966 A1 | 11/2003 | Jin |
| 2003/0222295 A1 | 12/2003 | Lin |
| 2003/0224613 A1 | 12/2003 | Ramanathan et al. |
| 2004/0007779 A1 | 1/2004 | Arbuthnot et al. |
| 2004/0009629 A1 * | 1/2004 | Ahn et al. ............... 438/108 |
| 2004/0016948 A1 | 1/2004 | Lin |
| 2004/0023450 A1 | 2/2004 | Katagiri et al. |
| 2004/0029404 A1 | 2/2004 | Lin |
| 2004/0040855 A1 | 3/2004 | Batinovich |
| 2004/0048202 A1 | 3/2004 | Lay |
| 2004/0070042 A1 | 4/2004 | Lee |
| 2004/0094841 A1 | 5/2004 | Matsuzaki et al. |
| 2004/0121606 A1 | 6/2004 | Raskin et al. |
| 2004/0130020 A1 | 7/2004 | Kuwabara |
| 2004/0145052 A1 | 7/2004 | Ueno |
| 2004/0166659 A1 | 8/2004 | Lin |
| 2004/0166661 A1 | 8/2004 | Lei |
| 2004/0183209 A1 | 9/2004 | Lin |
| 2004/0188839 A1 | 9/2004 | Ohtsuka |
| 2004/0245580 A1 | 12/2004 | Lin |
| 2004/0253801 A1 | 12/2004 | Lin |
| 2005/0024176 A1 * | 2/2005 | Wang et al. ............... 336/200 |
| 2005/0032351 A1 | 2/2005 | Lin |
| 2005/0170634 A1 | 8/2005 | Lin |
| 2005/0230783 A1 | 10/2005 | Lin |
| 2005/0250255 A1 | 11/2005 | Chen |
| 2005/0277281 A1 | 12/2005 | Dubin |
| 2005/0277283 A1 | 12/2005 | Lin |
| 2006/0019490 A1 | 1/2006 | Chou |
| 2006/0060961 A1 | 3/2006 | Lin et al. |
| 2006/0076678 A1 | 4/2006 | Kim |
| 2006/0091540 A1 | 5/2006 | Chou |
| 2007/0108551 A1 | 5/2007 | Lin |
| 2007/0181970 A1 | 8/2007 | Lin |
| 2007/0182521 A1 | 8/2007 | Lin |
| 2007/0202684 A1 | 8/2007 | Lin |
| 2007/0202685 A1 | 8/2007 | Lin |
| 2007/0262456 A1 | 11/2007 | Lin |
| 2007/0262457 A1 | 11/2007 | Lin |
| 2007/0262459 A1 | 11/2007 | Lin |
| 2007/0262460 A1 | 11/2007 | Lin |
| 2007/0267714 A1 | 11/2007 | Lin |
| 2007/0273032 A1 | 11/2007 | Lin |
| 2007/0273033 A1 | 11/2007 | Lin |
| 2007/0273034 A1 | 11/2007 | Lin |
| 2007/0273035 A1 | 11/2007 | Lin |
| 2007/0273036 A1 | 11/2007 | Lin |
| 2007/0273037 A1 | 11/2007 | Lin |
| 2007/0273040 A1 | 11/2007 | Lin |
| 2007/0273041 A1 | 11/2007 | Lin |
| 2007/0278684 A1 | 12/2007 | Lin |
| 2007/0278685 A1 | 12/2007 | Lin |
| 2007/0278686 A1 | 12/2007 | Lin |
| 2007/0278688 A1 | 12/2007 | Lin |
| 2007/0278689 A1 | 12/2007 | Lin |
| 2007/0278690 A1 | 12/2007 | Lin |
| 2007/0278691 A1 | 12/2007 | Lin |
| 2007/0281458 A1 | 12/2007 | Lin |
| 2007/0281463 A1 | 12/2007 | Lin |
| 2007/0281467 A1 | 12/2007 | Lin |
| 2007/0281468 A1 | 12/2007 | Lin |
| 2007/0284750 A1 | 12/2007 | Lin |
| 2007/0284751 A1 | 12/2007 | Lin |
| 2007/0284752 A1 | 12/2007 | Lin |
| 2007/0284753 A1 | 12/2007 | Lin |
| 2007/0288880 A1 | 12/2007 | Lin |
| 2007/0290348 A1 | 12/2007 | Lin |
| 2007/0290349 A1 | 12/2007 | Lin |
| 2007/0290350 A1 | 12/2007 | Lin |
| 2007/0290351 A1 | 12/2007 | Lin |
| 2007/0290354 A1 | 12/2007 | Lin |
| 2007/0290355 A1 | 12/2007 | Lin |
| 2007/0290356 A1 | 12/2007 | Lin |
| 2007/0290358 A1 | 12/2007 | Lin |
| 2007/0290368 A1 | 12/2007 | Lin |
| 2007/0293036 A1 | 12/2007 | Lin |
| 2008/0001302 A1 | 1/2008 | Lin et al. |
| 2008/0035972 A1 | 2/2008 | Lin |
| 2008/0035974 A1 | 2/2008 | Lin |
| 2008/0038869 A1 | 2/2008 | Lin |
| 2008/0042238 A1 | 2/2008 | Lin |
| 2008/0042239 A1 | 2/2008 | Lin |
| 2008/0042273 A1 | 2/2008 | Lin |
| 2008/0042289 A1 | 2/2008 | Lin |
| 2008/0044977 A1 | 2/2008 | Lin |
| 2008/0048329 A1 | 2/2008 | Lin |
| 2008/0050909 A1 | 2/2008 | Lin et al. |
| 2008/0050912 A1 | 2/2008 | Lin |
| 2008/0054398 A1 | 3/2008 | Lin |
| 2008/0083987 A1 | 4/2008 | Lin |
| 2008/0083988 A1 | 4/2008 | Lin |
| 2008/0093745 A1 | 4/2008 | Lin |
| 2008/0111243 A1 | 5/2008 | Lin |
| 2008/0121943 A1 | 5/2008 | Lin |
| 2008/0124918 A1 | 5/2008 | Lee |
| 2008/0128910 A1 | 6/2008 | Lin |
| 2008/0136034 A1 | 6/2008 | Lin |
| 2008/0142980 A1 | 6/2008 | Lin |
| 2008/0142981 A1 | 6/2008 | Lin |
| 2008/0146020 A1 | 6/2008 | Lin |
| 2008/0233733 A1 | 9/2008 | Lin |
| 2008/0246154 A1 | 10/2008 | Lin |
| 2008/0284032 A1 | 11/2008 | Lin |
| 2008/0284037 A1 | 11/2008 | Andry et al. |
| 2009/0001511 A1 | 1/2009 | Lin |
| 2009/0146307 A1 | 6/2009 | Lin |
| 2009/0184394 A1 | 7/2009 | Lin |

FOREIGN PATENT DOCUMENTS

| | | |
|---|---|---|
| EP | 0986106 | 3/2000 |
| EP | 0999580 | 5/2000 |
| EP | 1039544 | 9/2000 |
| EP | 1536469 | 6/2005 |
| EP | 1737037 A2 * | 12/2006 |
| FR | 2793943 | 7/2001 |
| JP | 01-135043 | 5/1989 |
| JP | 01-183836 | 7/1989 |
| JP | 01-184848 | 7/1989 |
| JP | 01-184849 | 7/1989 |
| JP | 02-213147 | 8/1990 |
| JP | 03019358 | 1/1991 |
| JP | 10-275811 | 10/1998 |
| JP | 11-274200 | 10/1999 |
| JP | 11-354579 | 12/1999 |
| JP | 2000022085 | 1/2000 |
| JP | 2000-036515 | 2/2000 |
| JP | 2000-183090 | 6/2000 |
| JP | 2000-228420 | 8/2000 |
| JP | 2000-228423 | 8/2000 |
| JP | 2003-031727 | 1/2003 |
| JP | 2003-229451 | 8/2003 |
| JP | 2004-193301 | 7/2004 |
| TW | 419765 | 1/2001 |
| TW | 452930 | 9/2001 |
| TW | 483045 | 4/2002 |
| TW | 490803 | 6/2002 |
| TW | 498529 | 8/2002 |
| TW | 506025 | 10/2002 |
| TW | 511243 | 11/2002 |
| TW | 515016 | 12/2002 |
| TW | 517334 | 1/2003 |
| TW | 518700 | 1/2003 |
| TW | 519707 | 2/2003 |

OTHER PUBLICATIONS

Seang-Moyium et al., "The Effects of a Ground Shield on Spiral Inductors Fabricated in a Silicon Bipolar Technology", *IEEE*, Berm 9.1, pp. 157-160, 2000.

Kutchoukov, et al., "Patterning of Polyimide and Metal in Deep Trenches", Sensors and Actuators A Physical, A 92, 2001, pp. 208-213.

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics 7 Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, pg. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "Megic way to system solutions through bumping and 26 redistribution," (Brochure) (Feb. 6, 2004) pp. 1-3.

Lin, M.S. "Post Passivation Technology™—Megic ® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Foreign Office Action for Chinese Patent Application No. 200610099490.0 dated Aug. 21, 2009 with English Translated Summary.

Foreign Office Action for Chinese Patent Application No. 200610099490.0 dated Feb. 5, 2010 with English Translated Summary.

Foreign Office Action for Chinese Patent Application No. 200610099491.5 dated Feb. 12, 2010 with English Translated Summary.

\* cited by examiner

METHOD FOR FORMING A DOUBLE EMBOSSING STRUCTURE

This application claims priority to U.S. provisional application No. 60/701,849, filed on Jul. 22, 2005, which is herein incorporated by reference in its entirety.

BACKGROUND OF THE PRESENT INVENTION

1. Field of Invention

The invention relates to a process with a seed layer for two steps of electroplating and the corresponding structure, and more particularly to a metal layer deposited at the second step of electroplating capable of being used as a metal pad used to be wirebonded thereto or to have a gold bump or solder bump formed thereover, of being used as a metal bump, or of being used as metal vias connecting neighboring two patterned circuit layers.

2. Description of Related Arts

The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Most of the semiconductor devices are aimed at processing digital data. There are also numerous semiconductor designs that are aimed at incorporating analog functions into devices that are capable of processing digital and analog data, or devices that can be used for processing only analog data. One of the major challenges in the creation of analog processing circuitry is that a number of the components used for analog circuitry are large in size and are therefore not readily integrated into sub-micron devices. Especially, these components may be passive devices, whose size is much huge in comparison with the size of normal semiconductor devices.

Some reference teaches a process with a seed layer for two steps of electroplating, as follows:

Nobuhisa et al. (U.S. Pat. No. 6,707,159) teach a process with a seed layer for two steps of electroplating two gold layers for chip-on-chip package or for chip-on-PCB package.

Chiu-Ming et al. (US2006/0019490) teach a process with a seed layer for two steps of electroplating two gold layers, of electroplating a copper layer and a gold layer, or of electroplating a copper/gold layer and a solder layer.

Mou-Shiung Lin et al. (US2005/0277283) teach a process with a seed layer for two steps of electroplating.

SUMMARY OF THE PRESENT INVENTION

The invention provides a method for fabricating a circuitry component comprising depositing a first metal layer over a substrate; forming a first pattern-defining layer over said first metal layer, a first opening in said first pattern-defining layer exposing said first metal layer; depositing a second metal layer over said first metal layer exposed by said first opening; removing said first pattern-defining layer; forming a second pattern-defining layer over said second metal layer, a second opening in said second pattern-defining layer exposing said second metal layer; depositing a third metal layer over said second metal layer exposed by said second opening; removing said second pattern-defining layer; after said removing said second pattern-defining layer, removing said first metal layer not under said second metal layer; and after said removing said first metal layer, forming a polymer layer over said second metal layer, wherein said third metal layer is used as a metal bump bonded to an external circuitry.

The invention provides another method for fabricating a circuitry component comprising depositing a first metal layer over a substrate; forming a first pattern-defining layer over said first metal layer, a first opening in said first pattern-defining layer exposing said first metal layer; depositing a second metal layer over said first metal layer exposed by said first opening; removing said first pattern-defining layer; forming a second pattern-defining layer over said second metal layer, a second opening in said second pattern-defining layer exposing said second metal layer; depositing a third metal layer over said second metal layer exposed by said second opening; and removing said second pattern-defining layer, wherein said third metal layer is used to be wirebonded thereto.

The invention provides another method for fabricating a circuitry component comprising depositing a first metal layer over a substrate; forming a first pattern-defining layer over said first metal layer, a first opening in said first pattern-defining layer exposing said first metal layer; depositing a second metal layer over said first metal layer exposed by said first opening; removing said first pattern-defining layer; forming a polymer layer over said second metal layer and part of said first metal layer; and removing said first metal layer not under said second metal layer and not under said polymer layer.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

DETAILED DESCRIPTION OF THE PREFERRED EMBODIMENT

The following are the embodiments to illustrate the processes and structures to combine the PI capping and the double embossed structure. At first, the illustrated processes and structures are applied when the PI cap is formed after the double embossed structure is finished for a semiconductor wafer.

Figure 1:
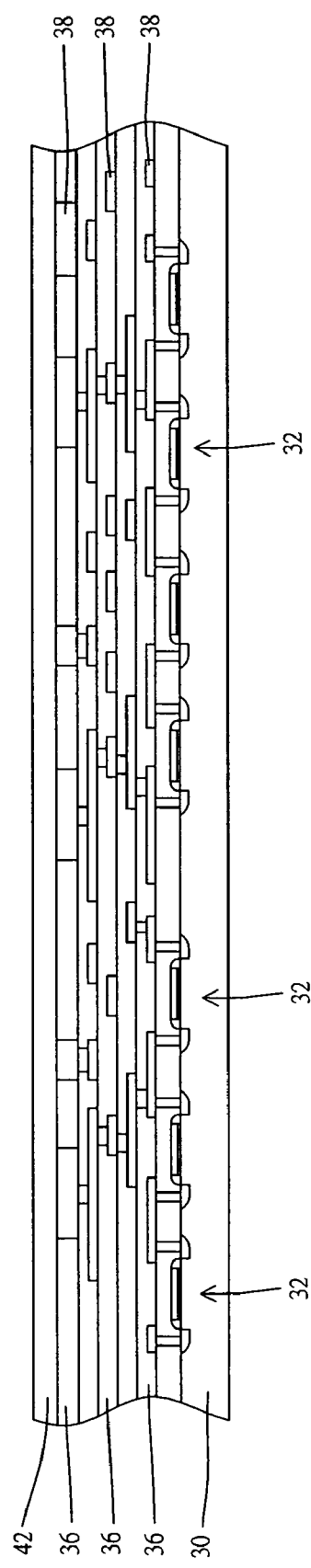
FIGS. 1-17 are cross-sectional views showing a process with a seed layer for two steps of electroplating, wherein the metal layer deposited at the second step of electroplating is capable of being used as a metal pad used to be wirebonded thereto or to have a gold bump or solder bump formed thereover, or of being used as a metal bump.

Referring to FIG. 1, a semiconductor substrate 30 is provided, and the semiconductor substrate 30 may be Si substrate, GaAs substrate, GeSi substrate or SOI (silicon-on-insulator) substrate. The semiconductor substrate 30 is a circular semiconductor wafer. The semiconductor substrate 30 has an active surface having multiple electronic elements 32, which are formed via doping trivalent or pentavalent ions, such as boron ions or phosphorus ions. The electronic elements 32 may be MOS transistors, MOS devices, p-channel MOS devices, n-channel MOS devices, BiCMOS devices, Bipolar Junction Transistors, diffusion areas, resistors, capacitors, or CMOS devices.

Referring to FIG. 1, a multiple thin-film insulating layers 36 and multiple thin-film circuit layers 38 are formed over the active surface of the semiconductor substrate 30. Each of the thin-film insulating layers 36 has a thickness less than 3 µm. Each of the thin-film circuit layers 38 has a thickness less than 3 µm. The thin-film circuit layers 38 are made of a copper material or an aluminum material. The thin-film insulating layers 36 are usually formed with a CVD (Chemical Vapor Deposition) method. The material of the thin-film insulating layers 36 may be silicon oxide, TEOS (Tetraethoxysilane), SiwCxOyHz, compound of silicon and nitrogen/compound of silicon, nitrogen and oxygen, SOG (Spin-On Glass), FSG (Fluoro-Silicate Glass), SiLK, black diamond, polyarylene ether, PBO (Polybenzoxazole), or porous silicon oxide. The dielectric constant of the thin-film insulating layers 36 may be lower than 3.

When a damascene process is used to form one of multiple thin-film circuit layers 38, such as the topmost one under the passivation layer 42, over the semiconductor substrate 30, a diffusion-barrier layer is firstly sputtered on the upper surface of one of the thin-film insulating layers 36 and on the bottoms and the sidewalls of the openings in said one of the thin-film insulating layers 36; next, a seed layer, such as copper, is sputtered on the diffusion-barrier layer; next, another copper layer is electroplated on the seed layer; and then, the electroplated copper layer, seed layer and diffusion-barrier layer outside the openings in said one of the thin-film insulating layers 36 are removed with a chemical mechanical polishing (CMP) method until the upper surface of said one of the thin-film insulating layers 36 is exposed. In another method to form one of multiple thin-film circuit layers 38, such as the second topmost one under the passivation layer 42, over the semiconductor substrate 30, an aluminum layer or an aluminum-copper alloy layer is sputtered on one of the thin-film insulating layers 36; and then, the aluminum layer or the aluminum-copper alloy layer is patterned with photolithographic and etching processes. The thin-film circuit layers 38 can be interconnected or connected to the electronic elements 32 via conductive vias in openings in the thin-film insulating layers 36. The thickness of one of the thin-film circuit layers 38 is generally between 0.1 and 0.5 µm. The thin-film circuit layers 38 are fabricated with a 5× stepper or 5× scanner or other superior equipment in the step of a photolithographic process.

Next, a passivation layer 42 is formed over the thin-film insulating layers 36 and the thin-film circuit layers 38 with a CVD method. The passivation layer 42 can protect the electronic elements 32 in the semiconductor substrate 30 from foreign ion contamination. The passivation layer 42 can retard the penetration of mobile ions (such as sodium ions), moisture, transition metals (such as gold, silver, and copper) and impurities. Thereby, the passivation layer 42 can protect the thin-film circuit layers 38, the thin-film insulating layers 36 and the underlying electronic elements 32 including: transistors, polysilicon resistors, polysilicon-polysilicon capacitors. The passivation layer 42 is usually composed of silicon oxide, compounds of silicon and oxygen, silicate and phosphate glass, silicon nitride, or silicon oxy-nitride, etc. Below, ten methods for depositing the passivation layer 42 are to be introduced.

Method 1

A silicon oxide layer with a thickness of between 0.2 and 1.2 µm is formed with a CVD method; and next, a silicon nitride layer with a thickness of between 0.2 and 1.2 µm is formed on the silicon oxide with a CVD method.

Method 2

A silicon oxide layer with a thickness of between 0.2 and 1.2 µm is formed with a CVD method; next, a silicon oxy-nitride layer with a thickness of between 0.05 and 0.15 µm is formed on the silicon oxide with a plasma-enhanced CVD method; and next, a silicon nitride layer with a thickness of between 0.2 and 1.2 µm is formed on the silicon oxy-nitride layer with a CVD method.

Method 3

A silicon oxy-nitride layer with a thickness of between 0.05 and 0.15 µm is formed with a CVD method; next, a silicon oxide layer with a thickness of between 0.2 and 1.2 µm is formed on the silicon oxy-nitride layer with a CVD method; and next, a silicon nitride layer with a thickness of between 0.2 and 1.2 µm is formed on the silicon oxide layer with a CVD method.

Method 4

A first silicon oxide layer with a thickness of between 0.2 and 0.5 µm is formed with a CVD method; next, a second silicon oxide layer with a thickness of between 0.5 and 1 µm is formed on the first silicon oxide layer with a spin-coating method; next, a third silicon oxide layer with a thickness of between 0.2 and 0.5 µm is formed on the second silicon oxide layer with a CVD method; and next, a silicon nitride layer with a thickness of between 0.2 and 1.2 µm is formed on the third silicon oxide layer with a CVD method.

Method 5

A silicon oxide layer with a thickness of between 0.5 and 2 µm is formed with a HDP-CVD (High Density Plasma-Chemical Vapor Deposition) method; and next, a silicon nitride layer with a thickness of between 0.2 and 1.2 µm is formed on the silicon oxide layer with a CVD method.

Method 6

A USG (Undoped Silicate Glass) layer with a thickness of between 0.2 and 3 µm is firstly formed; next, an insulating layer with a thickness of between 0.5 and 3 µm, such as TEOS, BPSG (Borophosphosilicate Glass) or PSG (Borophosphosilicate Glass), is formed on the USG layer; and next, a silicon nitride layer with a thickness of between 0.2 and 1.2 µm is formed on the insulating layer with a CVD method.

Method 7

A first silicon oxy-nitride layer with a thickness of between 0.05 and 0.15 µm is optionally formed with a CVD method; next, a silicon oxide layer with a thickness of between 0.2 and 1.2 µm is formed on the first silicon oxy-nitride layer with a CVD method; next, a second silicon oxy-nitride layer with a thickness of between 0.05 and 0.15 µm is optionally formed on the silicon oxide layer with a CVD method; next, a silicon nitride layer with a thickness of between 0.2 and 1.2 µm is formed on the second silicon oxy-nitride layer or on the silicon oxide layer with a CVD method; next, a third silicon oxy-nitride layer with a thickness of between 0.05 and 0.15 µm is optionally formed on the silicon nitride layer with a CVD method; and next, a silicon oxide layer with a thickness of between 0.2 and 1.2 μm is formed on the third silicon oxy-nitride layer or on the silicon nitride layer with a CVD method.

Method 8

A first silicon oxide layer with a thickness of between 0.2 and 1.2 μm is formed with a PECVD (Plasma Enhanced Chemical Vapor Deposition) method; next, a second silicon oxide layer with a thickness of between 0.5 and 1 μm is formed on the first silicon oxide layer with a spin-coating method; next, a third silicon oxide layer with a thickness of between 0.2 and 1.2 μm is formed on the second silicon oxide layer with a CVD method; next, a silicon nitride layer with a thickness of between 0.2 and 1.2 μm is formed on the third silicon oxide layer with a CVD method; and next, a fourth silicon oxide layer with a thickness of between 0.2 and 1.2 μm is formed on the silicon nitride layer with a CVD method.

Method 9

A first silicon oxide layer with a thickness of between 0.5 and 2 μm is formed with a HDP-CVD method; next, a silicon nitride layer with a thickness of between 0.2 and 1.2 μm is formed on the first silicon oxide layer with a CVD method; and next, a second silicon oxide layer with a thickness of between 0.5 and 2 μm is formed on the silicon nitride layer with a HDP-CVD method.

Method 10

A first silicon nitride layer with a thickness of between 0.2 and 1.2 μm is formed with a CVD method; next, a silicon oxide layer with a thickness of between 0.2 and 1.2 μm is formed on the first silicon nitride layer with a CVD method; and next, a second silicon nitride layer with a thickness of between 0.2 and 1.2 μm is formed on the silicon oxide layer with a CVD method.

The total thickness of the passivation layer 42 is generally more than 0.35 μm, and the thickness of the silicon nitride layer is generally more than 0.3 μm under an optimal condition. Typically, the passivation layer 42 comprises a topmost silicon-nitride layer of the completed semiconductor wafer or chip. The passivation layer 42 comprises a topmost silicon-oxide layer of the completed semiconductor wafer or chip. The passivation layer 42 comprises a topmost silicon-oxynitride layer of the completed semiconductor wafer or chip. The passivation layer 42 comprises a topmost CVD-formed layer of the completed semiconductor wafer or chip.

Figure 2:
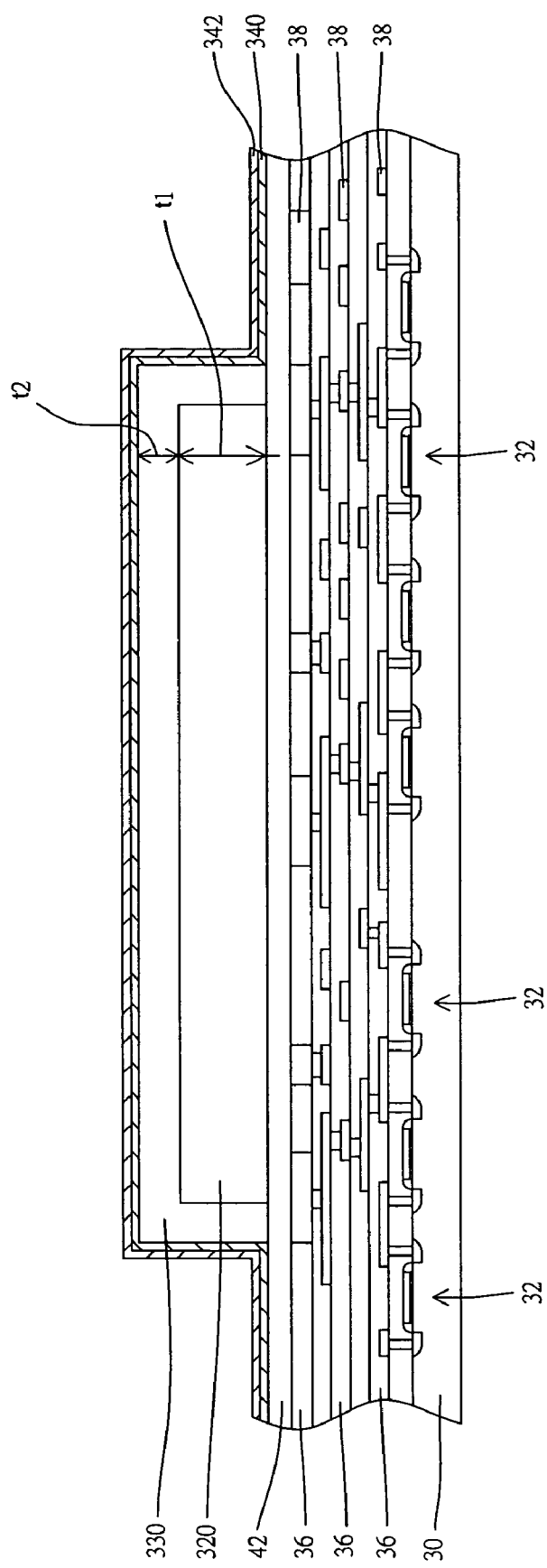

Referring to FIG. 2, it is an optional process to form two patterned polymer layers 320 and 330 on the passivation layer 42. The patterned first polymer layer 320 can be formed by spin coating a first polymer layer of polyimide, benzo-cyclobutene (BCB), parylene-based material, epoxy-based material, or elastomer, with a thickness of between 2 and 50 microns, and preferably between 8 and 30 microns, on the passivation layer 42.

Next, if the spin-coated first polymer layer is photosensitive, a photolithography process including exposing and developing steps can be used to pattern the spin-coated first polymer layer. Next, the first polymer layer is cured at the temperature of 300 and 450 degrees centigrade if the spin-coated first polymer layer is polyimide. The patterned first polymer layer 320 after being cured may have a thickness t1 of between 2 and 50 microns, and preferably between 6 and 20 microns.

If the spin-coated first polymer layer is non-photosensitive, photolithography and etching processes are typically needed to pattern the spin-coated first polymer layer.

Alternatively, the patterned first polymer layer 320 can be formed by screen printing a patterned polymer layer of polyimide, benzocyclobutene (BCB), parylene-based material or epoxy-based material, with a thickness of between 5 and 50 microns on the passivation layer 42, and then curing the screen-printed polymer layer at the temperature of 300 and 450 degrees centigrade if the screen-printed polymer layer is polyimide. Alternatively, the patterned first polymer layer 320 can be formed by laminating a patterned dry film of polyimide, benzocyclobutene (BCB), parylene-based material or epoxy, with a thickness of between 10 and 500 microns on the passivation layer 42.

If the patterned first polymer layer 320 is not thick enough, a patterned second polymer layer 330 can be formed on the patterned first polymer layer 320, as shown in FIG. 2. The patterned second polymer layer 330 can be formed by spin coating a second polymer layer of polyimide, benzo-cyclobutene (BCB), parylene-based material, epoxy-based material, or elastomer, with a thickness of between 2 and 50 microns, and preferably between 8 and 30 microns, on the patterned first polymer layer 320 and on the passivation layer 42.

Next, if the spin-coated second polymer layer is photosensitive, a photolithography process including exposing and developing steps can be used to pattern the spin-coated second polymer layer. Next, the first polymer layer is cured at the temperature of 300 and 450 degrees centigrade if the spin-coated second polymer layer is polyimide. The patterned second polymer layer 330 after being cured may have a thickness t2 of between 6 and 20 microns, and preferably between 6 and 20 microns.

If the spin-coated second polymer layer is non-photosensitive, photolithography and etching processes are typically needed to pattern the spin-coated second polymer layer.

Alternatively, the patterned second polymer layer 330 can be formed by screen printing a patterned polymer layer of polyimide, benzocyclobutene (BCB), parylene-based material or epoxy-based material, with a thickness of between 5 and 50 microns on the patterned first polymer layer 320, and then curing the screen-printed polymer layer at the temperature of 300 and 450 degrees centigrade if the screen-printed polymer layer is polyimide. Alternatively, the patterned second polymer layer 330 can be formed by laminating a patterned dry film of polyimide, benzocyclobutene (BCB), parylene-based material or epoxy-based material, with a thickness of between 10 and 500 microns on the patterned first polymer layer 320.

Referring to FIG. 2, after forming the patterned first and second polymer layers 320 and 330, an adhesion/barrier layer 340 may be formed by sputtering or evaporating a metal layer of titanium, tungsten, cobalt, nickel, titanium nitride, a titanium-tungsten alloy, chromium, a chromium-copper alloy, tantalum, or tantalum nitride, with a thickness of between 1000 and 6000 angstroms, on the patterned second polymer layer 330 and on the passivation layer 42. Next, a seed layer 342 may be formed by sputtering, evaporating or electroless plating a metal layer of gold, copper, nickel, silver, palladium, platinum, rhodium, ruthenium, or rhenium, with a thickness of between 500 and 3000 angstroms on the adhesion/barrier layer 340.

Figure 3:
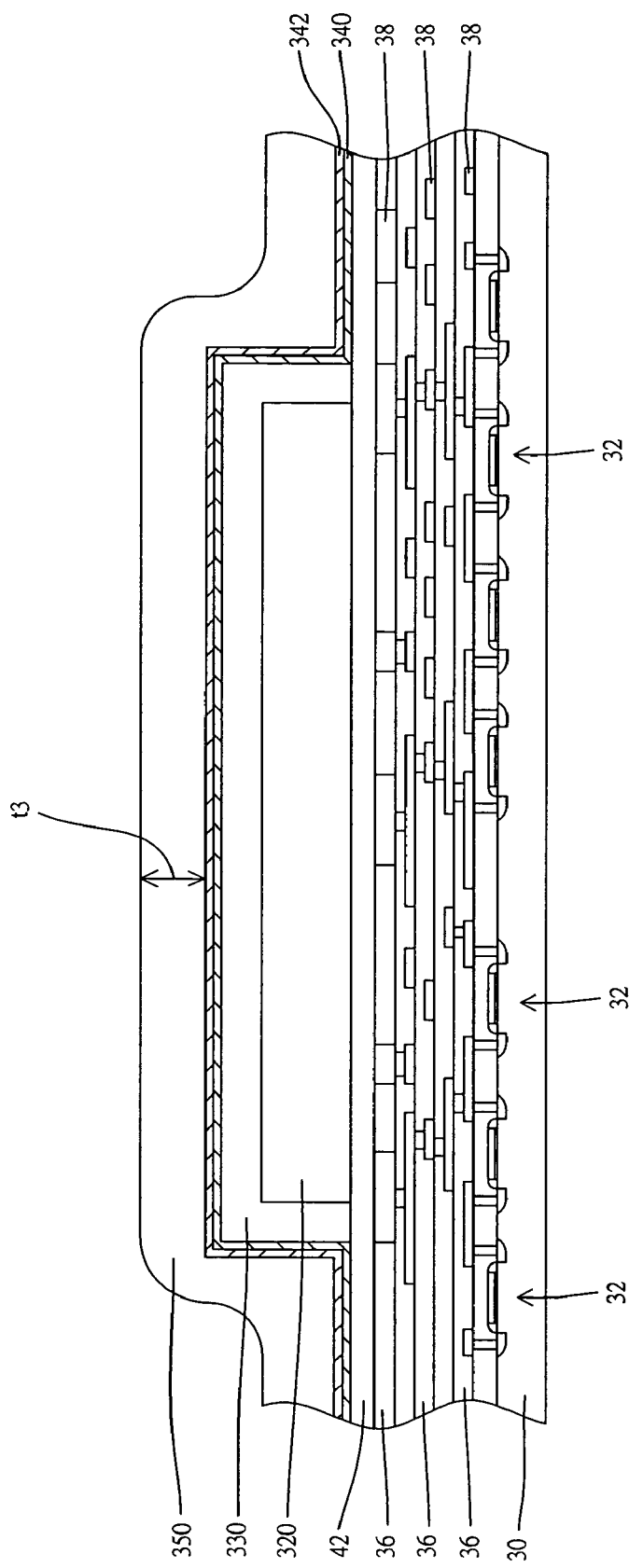

Next, referring to FIG. 3, a photoresist layer 350, such as photosensitive polyimide, photosensitive benzo-cyclobutene (BCB), photosensitive parylene-based material, photosensitive epoxy-based material, with a thickness t3 of between 4 and 30 microns, is formed on the seed layer 342 using a spin coating process.

Figure 4:
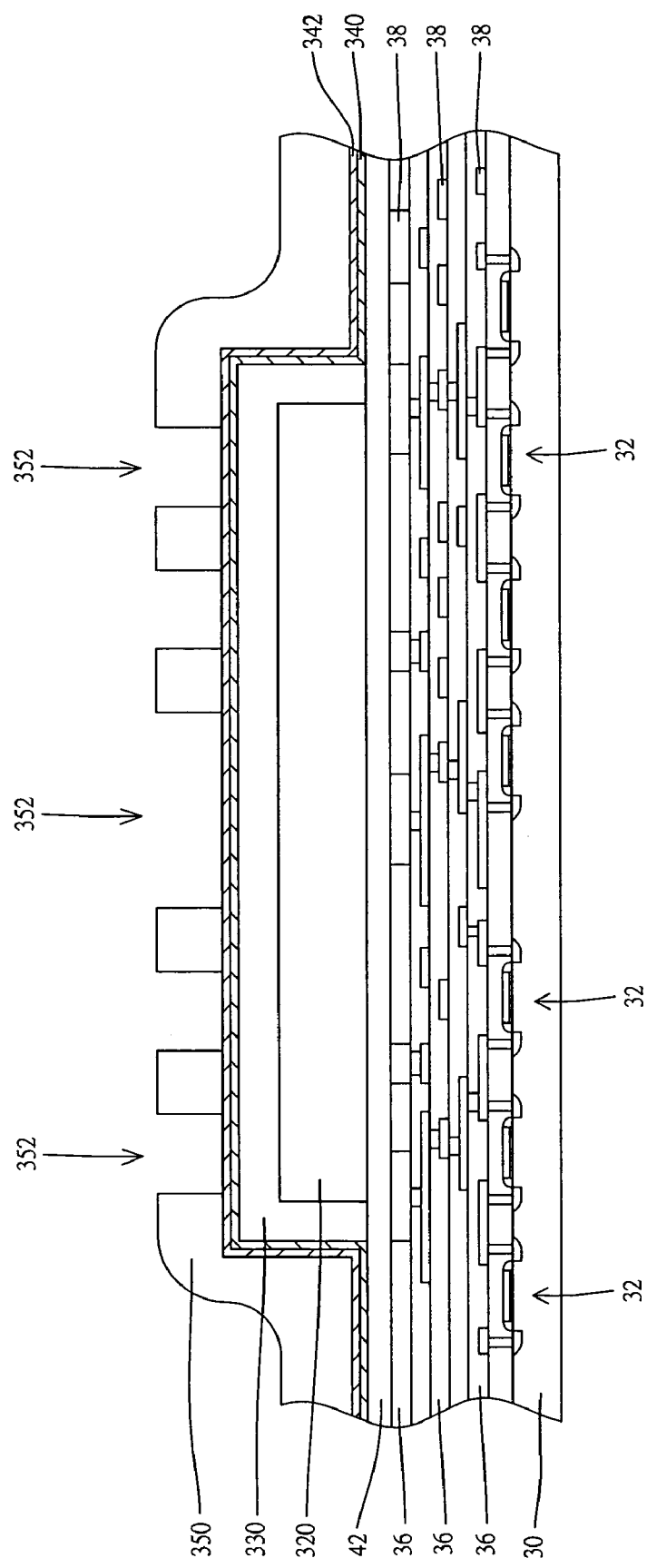

Next, referring to FIG. 4, a photolithography process including exposing and developing steps is used to pattern the photoresist layer 350 and to form an opening 352, with a coil pattern from a top view, in the photoresist layer 350 exposing the seed layer 342.

Figure 5:
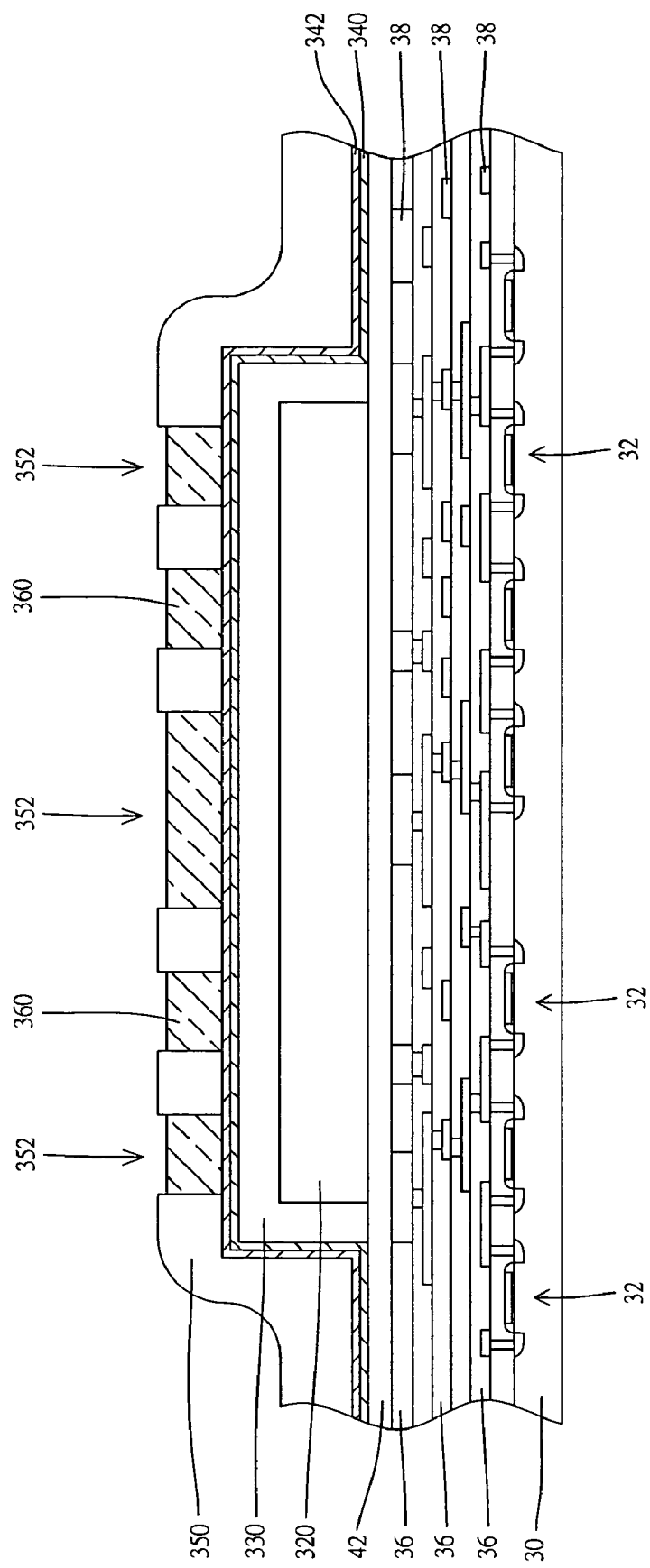

Next, referring to FIG. 5, a metal layer 360, with a coil pattern from a top view, is electroplated on seed layer 342 exposed by the opening 352 in the photoresist layer 350. The metal layer 360 can be deposited by electroplating a single layer of gold with a thickness of between 1 and 20 microns, and preferably between 3 and 10 microns, on the seed layer 342 preferably of gold exposed by the opening 352 in the photoresist layer 350. Alternatively, the metal layer 360 can be deposited by electroplating a single layer of copper with a thickness of between 1 and 20 microns, and preferably 3 and 10 microns, on the seed layer 342 preferably of copper exposed by the opening 352 in the photoresist layer 350. Alternatively, the metal layer 360 can be deposited by electroplating a single layer of silver with a thickness of between 1 and 20 microns, and preferably 3 and 10 microns, on the seed layer 342 preferably of silver exposed by the opening 352 in the photoresist layer 350. Alternatively, the metal layer 360 can be deposited by electroplating a single layer of nickel with a thickness of between 1 and 20 microns, and preferably 3 and 10 microns, on the seed layer 342 preferably of nickel exposed by the opening 352 in the photoresist layer 350. Alternatively, the metal layer 360 can be deposited by electroplating a single layer of palladium with a thickness of between 1 and 20 microns, and preferably 3 and 10 microns, on the seed layer 342 preferably of palladium exposed by the opening 352 in the photoresist layer 350. Alternatively, the metal layer 360 can be deposited by electroplating a single layer of platinum with a thickness of between 1 and 20 microns, and preferably 3 and 10 microns, on the seed layer 342 preferably of platinum exposed by the opening 352 in the photoresist layer 350. Alternatively, the metal layer 360 can be deposited by electroplating a single layer of rhodium with a thickness of between 1 and 20 microns, and preferably 3 and 10 microns, on the seed layer 342 preferably of rhodium exposed by the opening 352 in the photoresist layer 350. Alternatively, the metal layer 360 can be deposited by electroplating a single layer of ruthenium with a thickness of between 1 and 20 microns, and preferably 3 and 10 microns, on the seed layer 342 preferably of ruthenium exposed by the opening 352 in the photoresist layer 350. Alternatively, the metal layer 360 can be deposited by electroplating a single layer of rhenium with a thickness of between 1 and 20 microns, and preferably 3 and 10 microns, on the seed layer 342 preferably of rhenium exposed by the opening 352 in the photoresist layer 350. Alternatively, the metal layer 360 can be deposited by electroplating a copper layer with a thickness of between 1 and 20 microns, and preferably 3 and 10 microns, on the seed layer 342 preferably of copper exposed by the opening 352 in the photoresist layer 350, and then electroplating a nickel layer with a thickness of between 1 and 5 microns on the copper layer in the opening 352 in the photoresist layer 350. Alternatively, the metal layer 360 can be deposited by electroplating a copper layer with a thickness of between 1 and 20 microns, and preferably 3 and 10 microns, on the seed layer 342 preferably of copper exposed by the opening 352 in the photoresist layer 350, then electroplating a nickel layer with a thickness of between 1 and 5 microns on the copper layer in the opening 352 in the photoresist layer 350, and then electroplating a gold layer with a thickness of between 1 and 5 microns on the nickel layer in the opening 352 in the photoresist layer 350.

Figure 6:
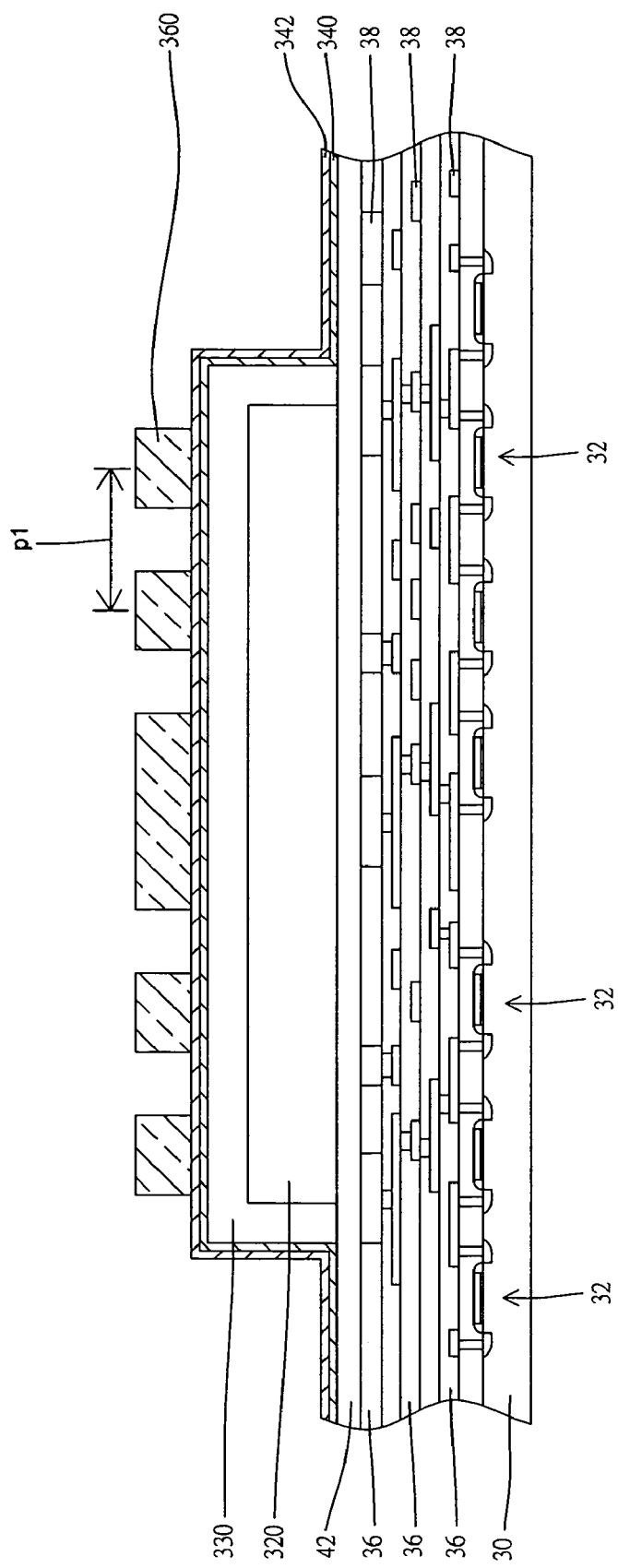

Next, referring to FIG. 6, the photoresist layer 350 is stripped. The pitch p1 between the centers of the neighboring turns of the patterned coil may range from 2 to 30 microns, and preferably from 2 and 10 microns.

Figure 7:
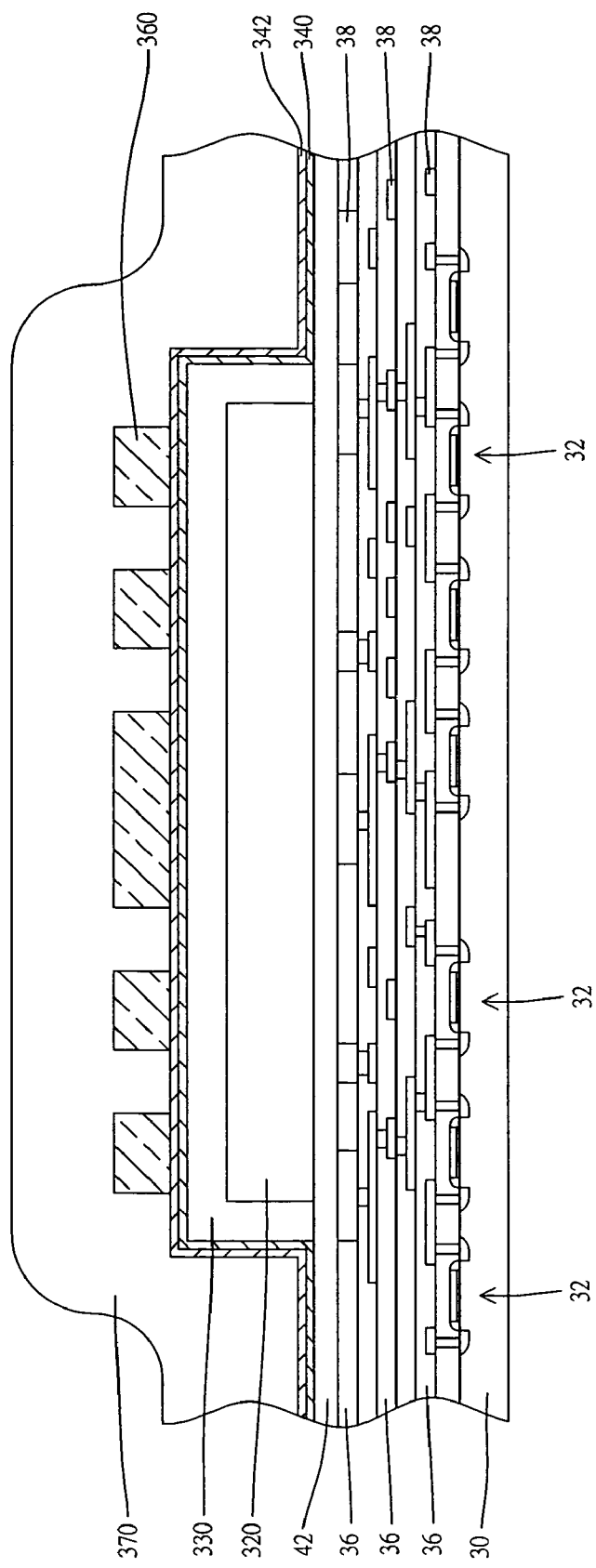

Next, referring to FIG. 7, a photoresist layer 370, such as photosensitive polyimide, photosensitive benzo-cyclo-butene (BCB), photosensitive parylene-based material, photosensitive epoxy-based material, with a thickness t4 of between 4 and 30 microns, is formed on the electroplated metal layer 360 and on the seed layer 342 using a spin coating process.

Figure 8:
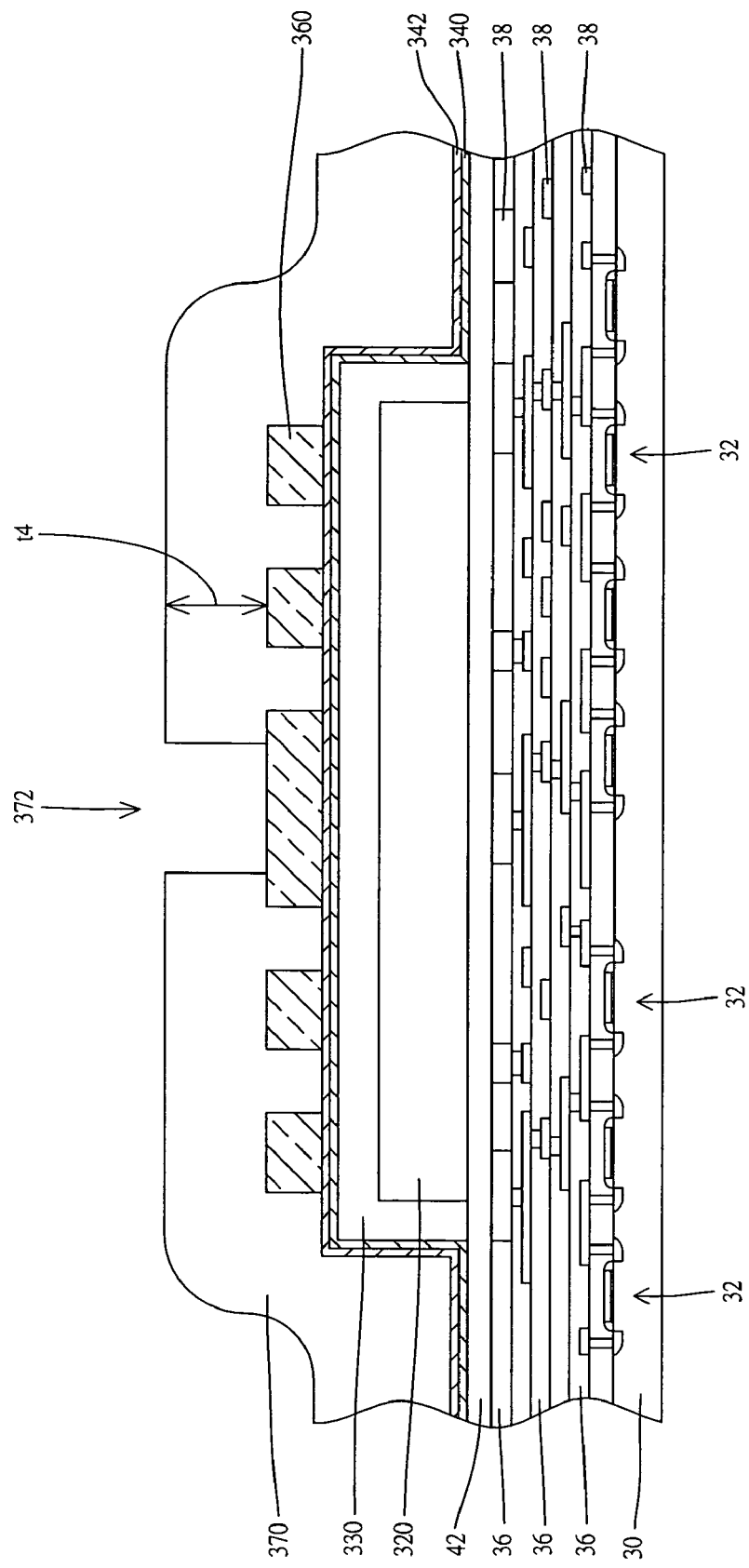

Next, referring to FIG. 8, a photolithography process including exposing and developing steps is used to pattern the photoresist layer 370 and to form an opening 372 in the photoresist layer 370 exposing the electroplated metal layer 360.

Figure 9:
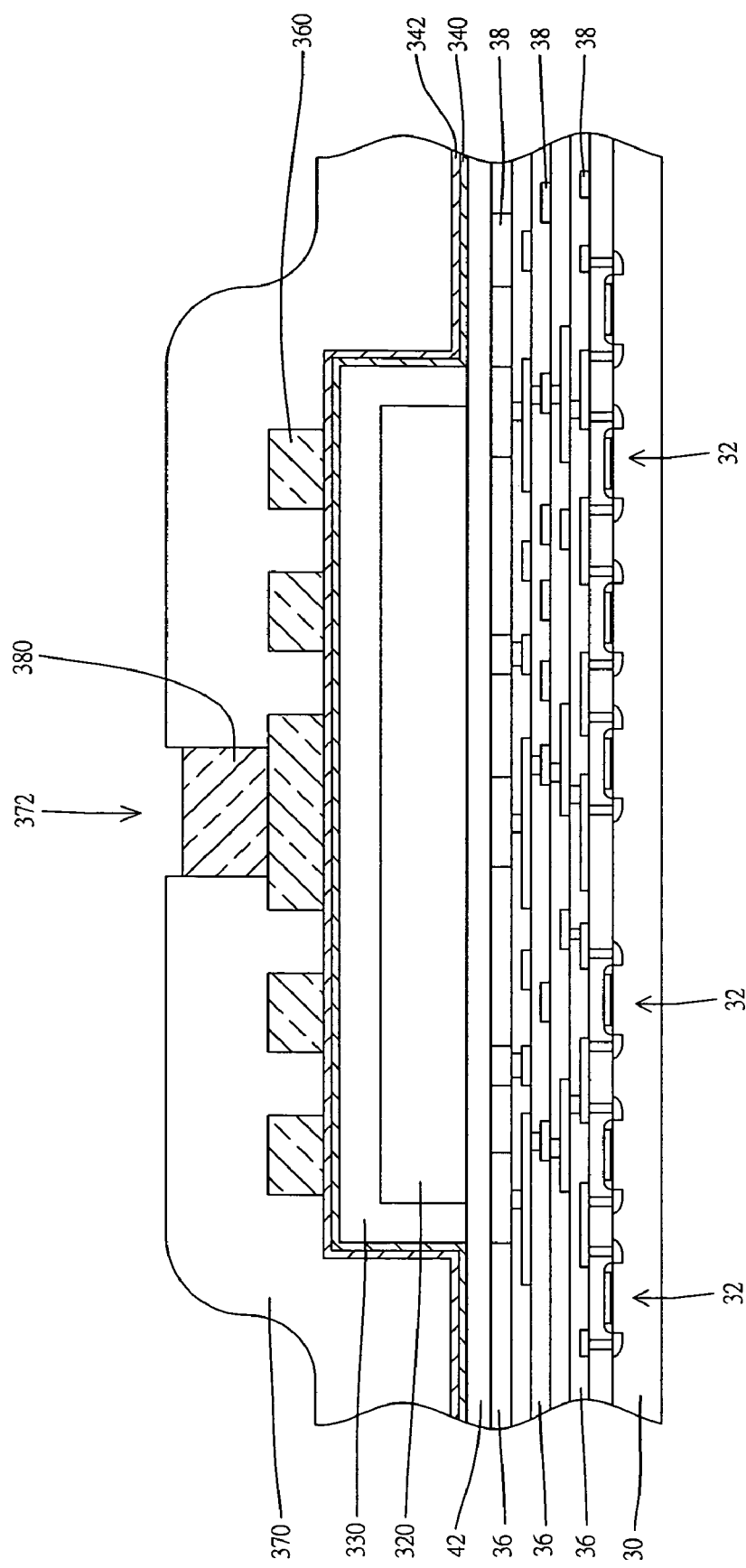

Next, referring to FIG. 9, a metal layer 380 is electroplated on the metal layer 360 exposed by the opening 372 in the photoresist layer 370. The metal layer 380 can be deposited by electroplating a single layer of gold with a thickness of between 2 and 30 microns on the metal layer 360, whose topmost layer is preferably gold, exposed by the opening 372 in the photoresist layer 370. Alternatively, the metal layer 380 can be deposited by electroplating a single layer of gold with a thickness of between 1 and 30 microns on the metal layer 360, whose topmost layer is preferably nickel, exposed by the opening 372 in the photoresist layer 370. Alternatively, the metal layer 380 can be deposited by electroplating a single layer of silver with a thickness of between 2 and 30 microns on the metal layer 360, whose topmost layer is preferably silver, exposed by the opening 372 in the photoresist layer 370. Alternatively, the metal layer 380 can be deposited by electroplating a single layer of palladium with a thickness of between 2 and 30 microns on the metal layer 360, whose topmost layer is preferably palladium, exposed by the opening 372 in the photoresist layer 370. Alternatively, the metal layer 380 can be deposited by electroplating a single layer of platinum with a thickness of between 2 and 30 microns on the metal layer 360, whose topmost layer is preferably platinum, exposed by the opening 372 in the photoresist layer 370. Alternatively, the metal layer 380 can be deposited by electroplating a single layer of rhodium with a thickness of between 2 and 30 microns on the metal layer 360, whose topmost layer is preferably rhodium, exposed by the opening 372 in the photoresist layer 370. Alternatively, the metal layer 380 can be deposited by electroplating a single layer of ruthenium with a thickness of between 2 and 30 microns on the metal layer 360, whose topmost layer is preferably ruthenium, exposed by the opening 372 in the photoresist layer 370. Alternatively, the metal layer 380 can be deposited by electroplating a single layer of rhenium with a thickness of between 2 and 30 microns on the metal layer 360, whose topmost layer is preferably rhenium, exposed by the opening 372 in the photoresist layer 370. Alternatively, the metal layer 380 can be deposited by electroplating a single layer of copper with a thickness of between 2 and 30 microns on the metal layer 360, whose topmost layer is preferably copper, exposed by the opening 372 in the photoresist layer 370. Alternatively, the metal layer 380 can be deposited by electroplating a nickel layer with a thickness of between 1 and 10 microns on the metal layer 360, whose topmost layer is preferably nickel, exposed by the opening 372 in the photoresist layer 370, and then electroplating a solder layer, such a tin-lead alloy or a tin-silver alloy, with a thickness of between 10 and 150 microns on the nickel layer in the opening 372 in the photoresist layer 370. Alternatively, the metal layer 380 can be deposited by electroplating a nickel layer with a thickness of between 1 and 10 microns on the metal layer 360, whose topmost layer is preferably nickel, exposed by the opening 372 in the photoresist layer 370, and then electroplating a gold layer with a thickness of between 1 and 20 microns on the nickel layer in the opening 372 in the photoresist layer 370.

Figure 10:
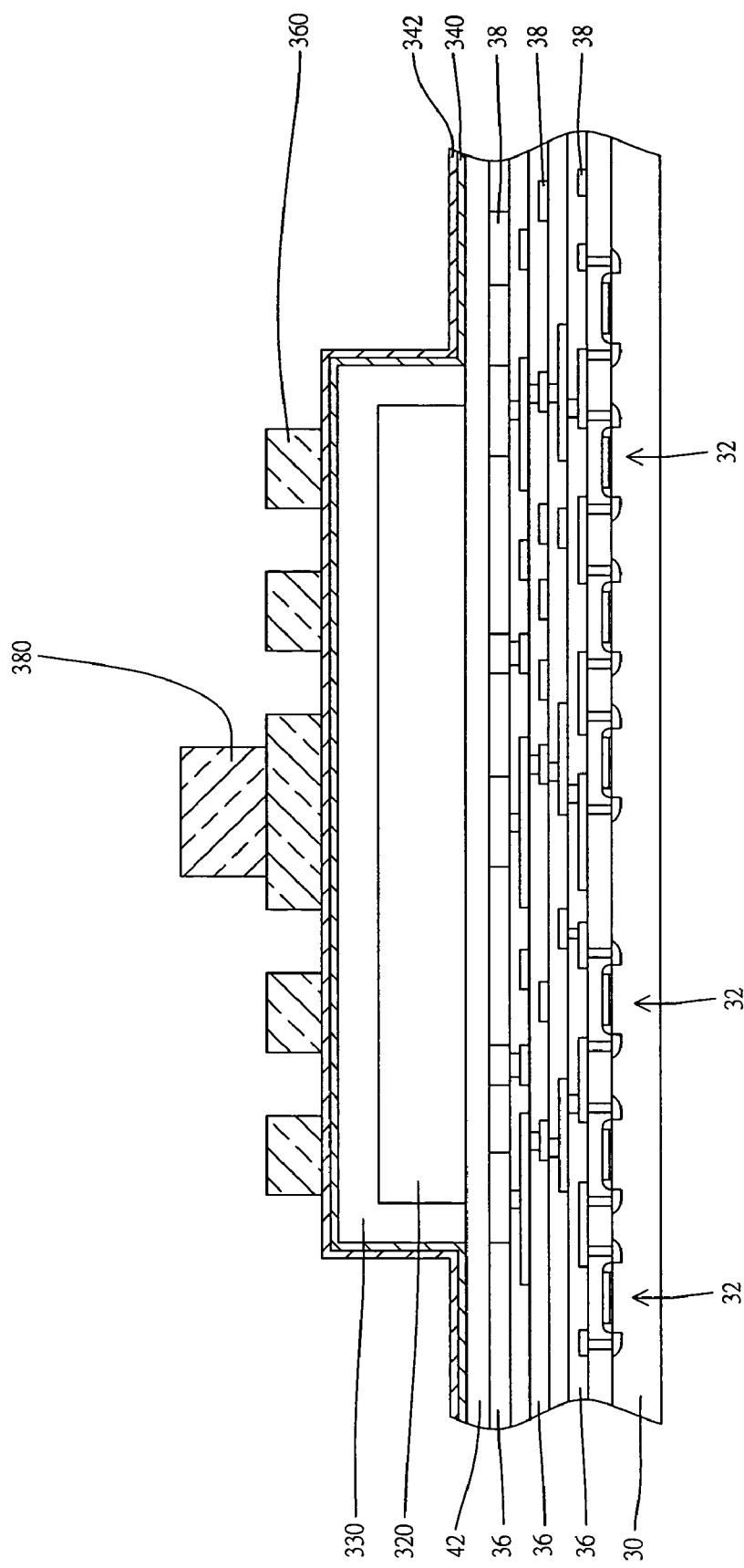
Figure 11:
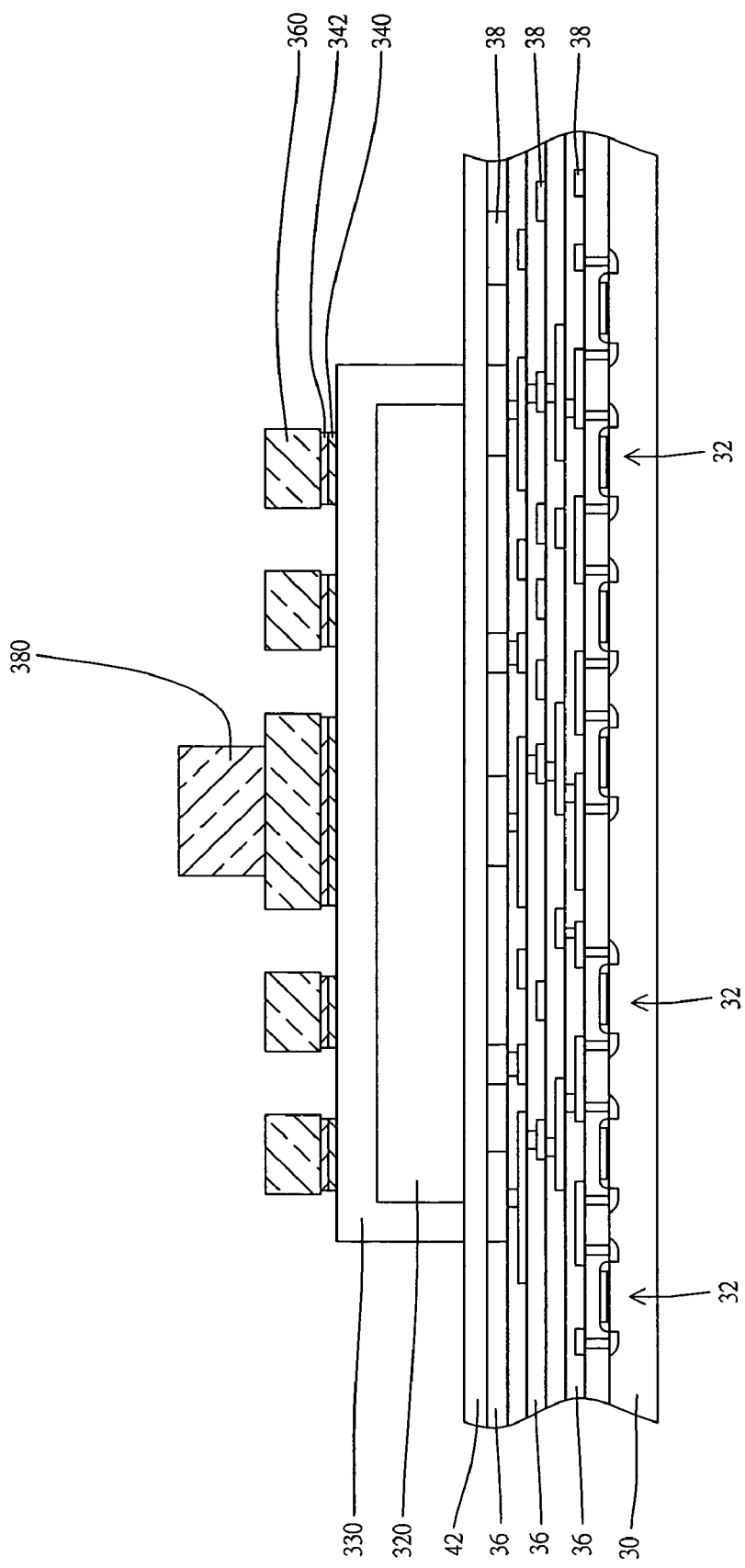

Next, referring to FIG. 10, the photoresist layer 370 is stripped. Next, referring to FIG. 11, the seed layer 342 not under the metal layer 360 is removed using a dry etching process or a wet etching process. If the seed layer 342 is gold and removed by a wet etching process, the etchant for etching the seed layer 342 is potassium iodide. Thereafter, the adhesion/barrier layer 340 not under the metal layer 360 is removed using a dry etching process or a wet etching process. If the adhesion/barrier layer 340 is a titanium tungsten alloy and removed by a wet etching process, the etchant for etching the adhesion/barrier layer 340 is hydrogen peroxide or hydrofluoric acid. If the adhesion/barrier layer 340 is titanium and removed by a wet etching process, the etchant for etching the adhesion/barrier layer 340 is hydrofluoric acid.

Figure 12:
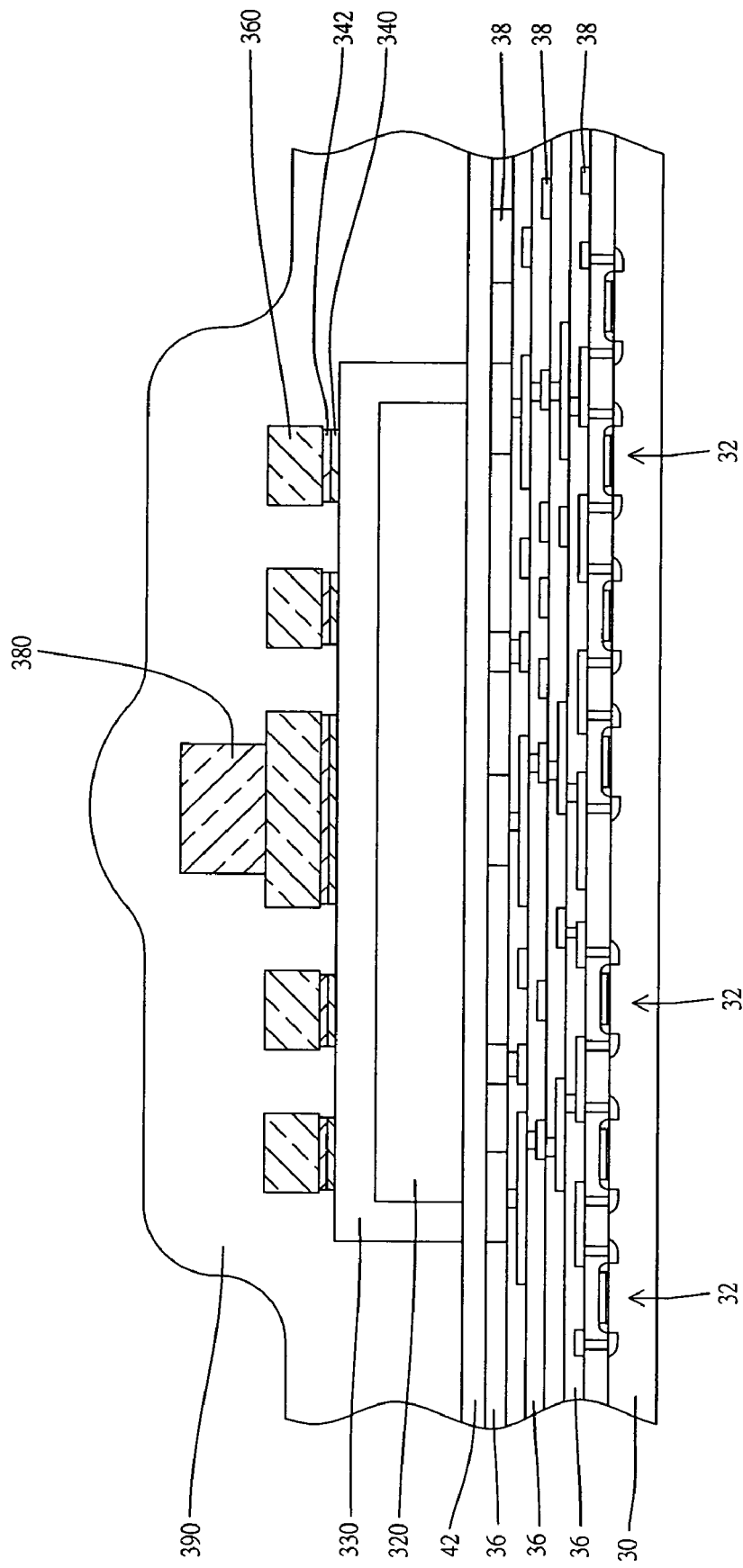
Figure 13:
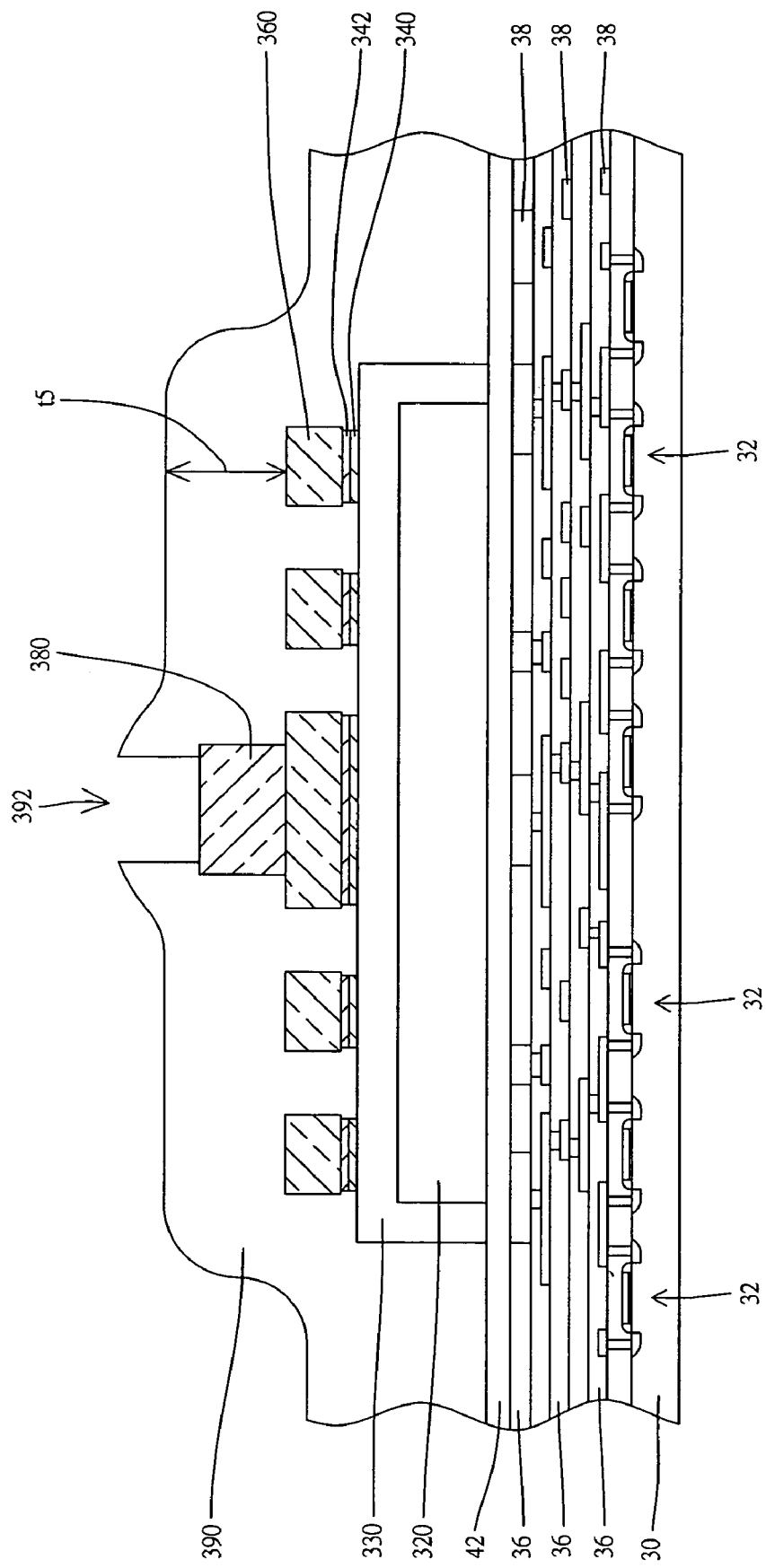

Referring to FIGS. 12-13, it is an optional process to form a patterned polymer layer 390 on the metal layers 380 and 360, on the patterned polymer layer 330, and on the passivation layer 42. The patterned polymer layer 390 can be formed by spin coating a polymer layer of polyimide, benzo-cyclobutene (BCB), parylene-based material, epoxy-based material, or elastomer, with a thickness of between 2 and 50 microns, and preferably between 8 and 30 microns, on the metal layers 380 and 360, on the patterned polymer layer 330, and on the passivation layer 42.

Next, if the spin-coated polymer layer is photosensitive, a photolithography process including exposing and developing steps can be used to form an opening 392 in the spin-coated polymer layer exposing the metal layer 380. Next, the spin-coated polymer layer is cured at the temperature of 300 and 450 degrees centigrade if the spin-coated polymer layer is polyimide. The patterned polymer layer 390 after being cured may have a thickness t5 of between 2 and 50 microns, and preferably between 6 and 20 microns.

If the spin-coated polymer layer is non-photosensitive, photolithography and etching processes are typically needed to pattern the spin-coated polymer layer.

Alternatively, the patterned polymer layer 390 can be formed by screen printing a patterned polymer layer of polyimide, benzocyclobutene (BCB), parylene-based material or epoxy-based material, with a thickness of between 5 and 50 microns on the metal layer 360, on the patterned polymer layer 330, and on the passivation layer 42, and then curing the screen-printed polymer layer at the temperature of 300 and 450 degrees centigrade if the screen-printed polymer layer is polyimide. Alternatively, the patterned polymer layer 390 can be formed by laminating a patterned dry film of polyimide, benzocyclobutene (BCB), parylene-based material or epoxy, with a thickness of between 10 and 500 microns on the metal layer 360, on the patterned polymer layer 330, and on the passivation layer 42.

In this embodiment, the patterned polymer layer 390 covers the peripheral region of the metal layer 380 used as a metal pad.

Figure 14:
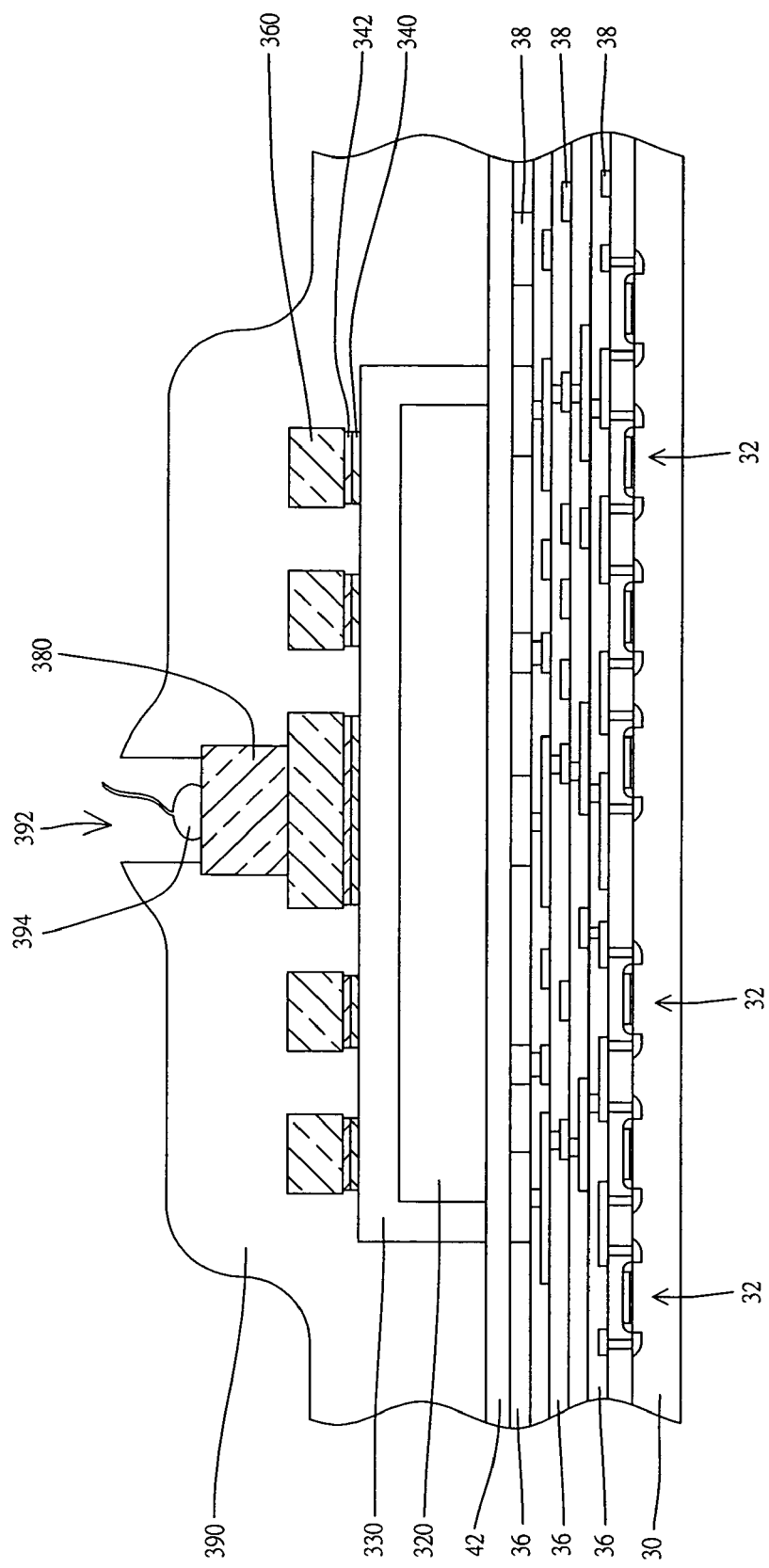

Next, referring to FIG. 14, the metal layer 380 is used as a metal pad for being wirebonded thereto or having a gold bump or solder bump formed thereover. A gold wire 394 can be connected to the metal layer 380 exposed by the opening 392 in the polymer layer 390 using a wirebonding process. Alternatively, a gold bump or tin-containing bump, not shown, can be formed over the above-mentioned metal layer 380 exposed by the opening 392 in the polymer layer 390.

Figure 15:
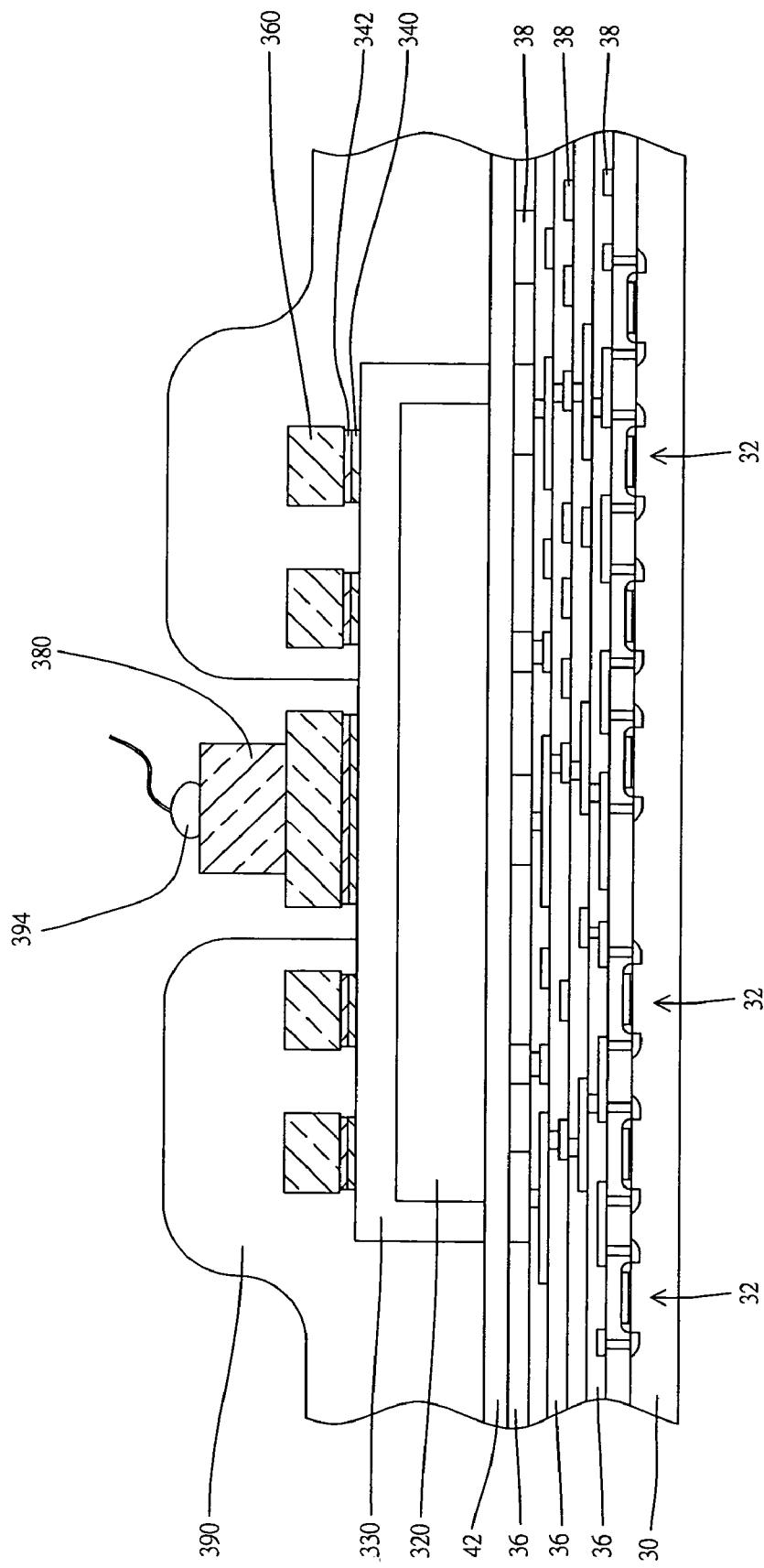

Alternatively, referring to FIG. 15, the metal layer 380 used as a metal pad for being wirebonded thereto or having a gold bump or solder bump formed thereover has a top surface and a side surface not covered by the patterned polymer layer 390. A gold wire 394 can be connected to the metal layer 380 exposed by the opening 392 in the polymer layer 390 using a wirebonding process. Alternatively, a gold bump or tin-containing bump, not shown, can be formed over the above-mentioned metal layer 380 exposed by the opening 392 in the polymer layer 390. The elements shown in FIG. 15 having same reference numbers as those shown in FIGS. 1-14 indicate similar ones described above in FIGS. 1-14.

Figure 16:
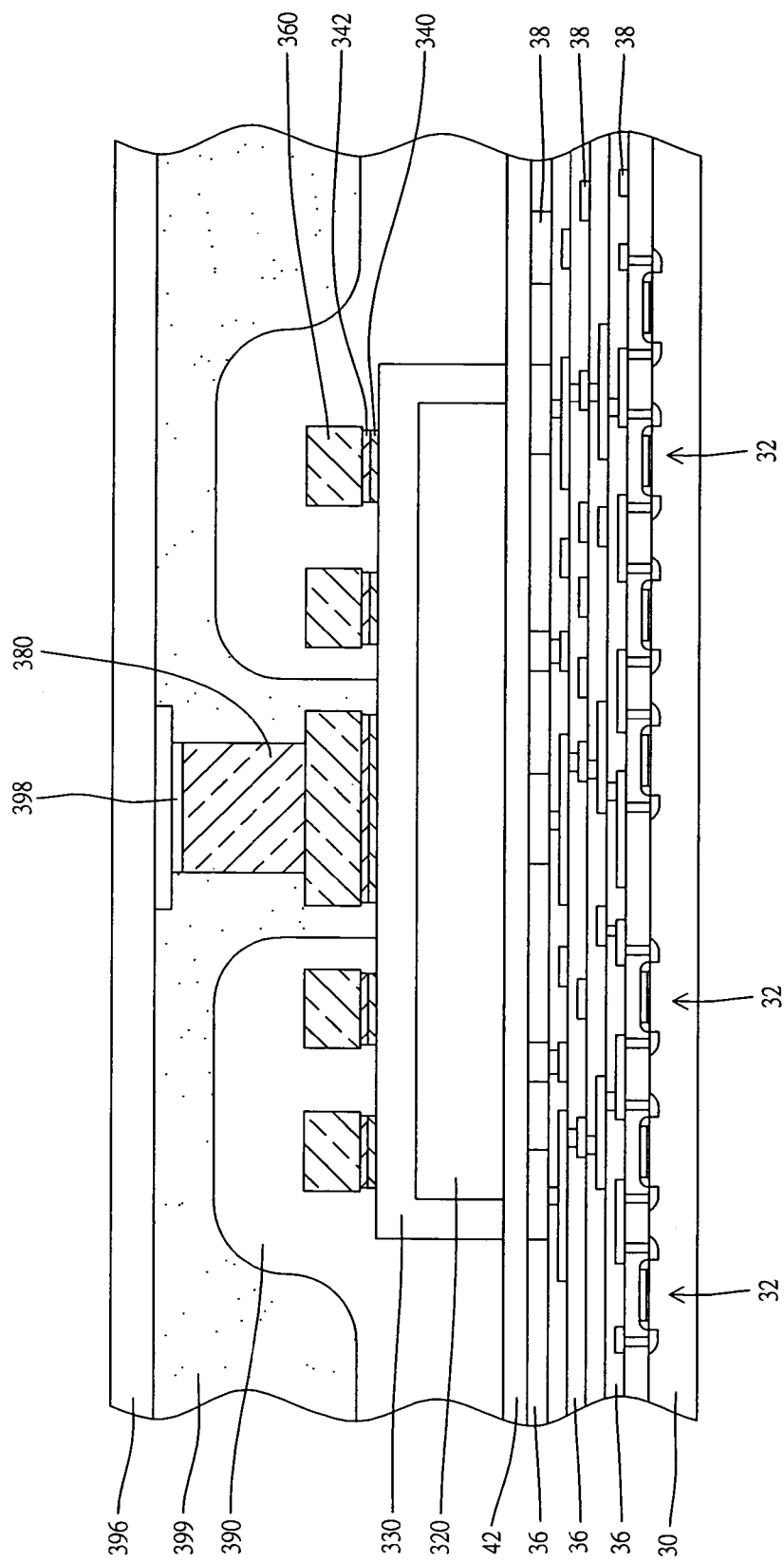

Alternatively, referring to FIG. 16, the above-mentioned metal layer 380 may be used as a metal bump capable of being connected to an external circuitry 396, such as a ceramic substrate, a printed circuit board, semiconductor chip for chip-on-chip package, glass substrate for a chip-on-glass (COG) package, flex circuit substrate for a chip-on-film (COF) package, a tape carrier for tape-automated-bonded (TAB) package. In the application for COG, COF or TAB packages, the topmost layer of the metal layer 380 is preferably gold, which can be bonded to a metal layer 398, preferably of gold, formed on the above-mentioned external circuitry 396 or to a metal layer 398, preferably of tin-containing material, formed on the above-mentioned external circuitry. Alternatively, an anisotropic conductive film (ACF) can be use to electrically connect the metal layer 380 to the above-mentioned external circuitry 396, such as glass substrate. In the application for being connected to a ceramic substrate, printed circuit board, or semiconductor chip 396, the topmost layer of the metal layer 380 is preferably tin-containing material, which can be bonded to a metal layer 398, preferably of gold, formed on the ceramic substrate, printed circuit board, or semiconductor chip 396, or to a metal layer 398, preferably of tin-containing material, formed on the ceramic substrate, printed circuit board, or semiconductor chip 396. After the metal layer 380 is connected to the above-mentioned external circuitry 396, a polymer material 399, such as polyimide or benzo-cyclo-butene (BCB), can be filled into the gap between the patterned polymer layer 390 and the above-mentioned external circuitry 396. The metal layer 380 used as a metal bump is protruded from the patterned polymer layer 390 such that the metal layer 380 can be easily bonded to the above-mentioned external circuitry 396. The elements shown in FIG. 16 having same reference numbers as those shown in FIGS. 1-14 indicate similar ones described above in FIGS. 1-14.

Figure 17:
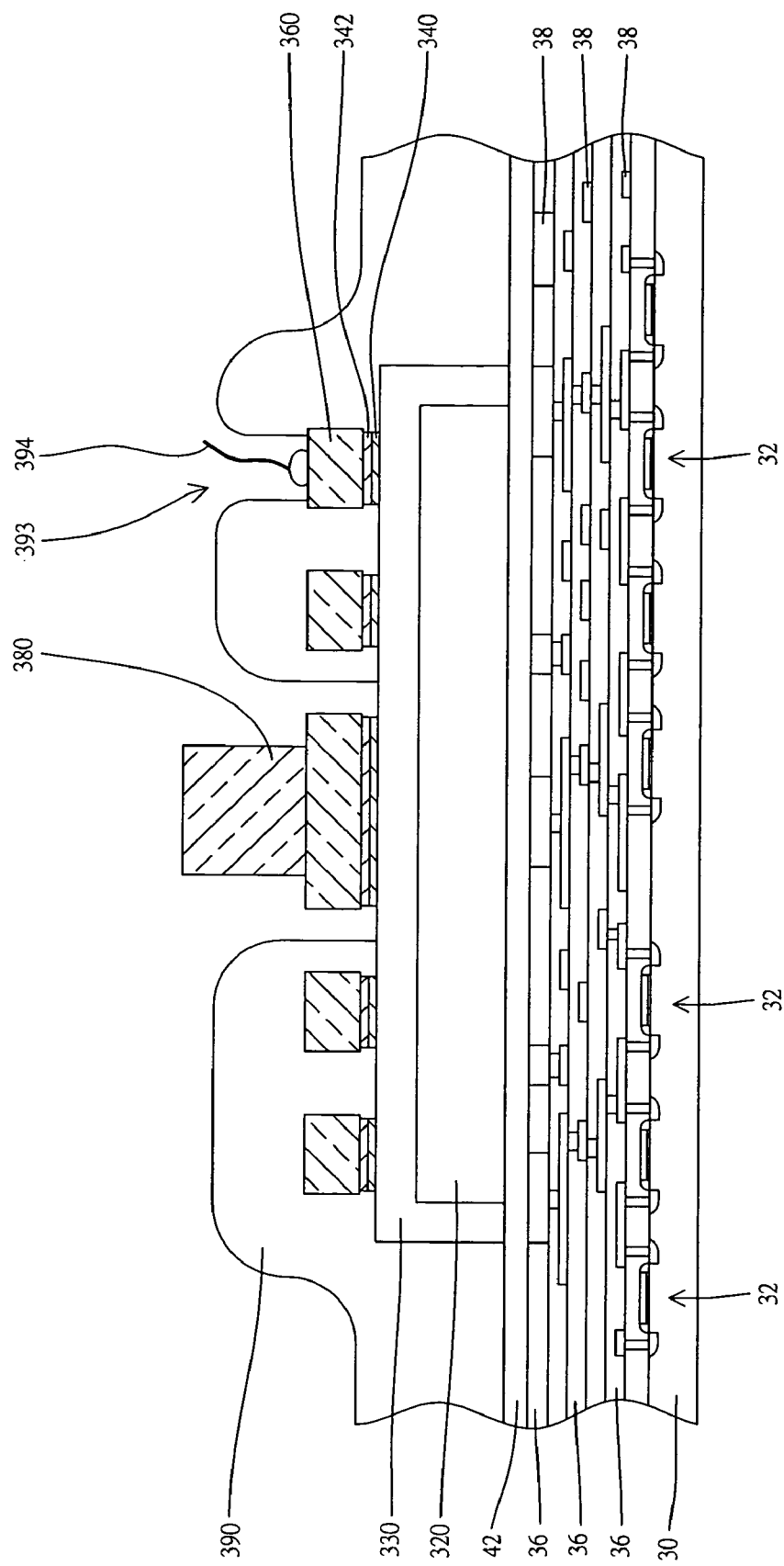
Figure 18:
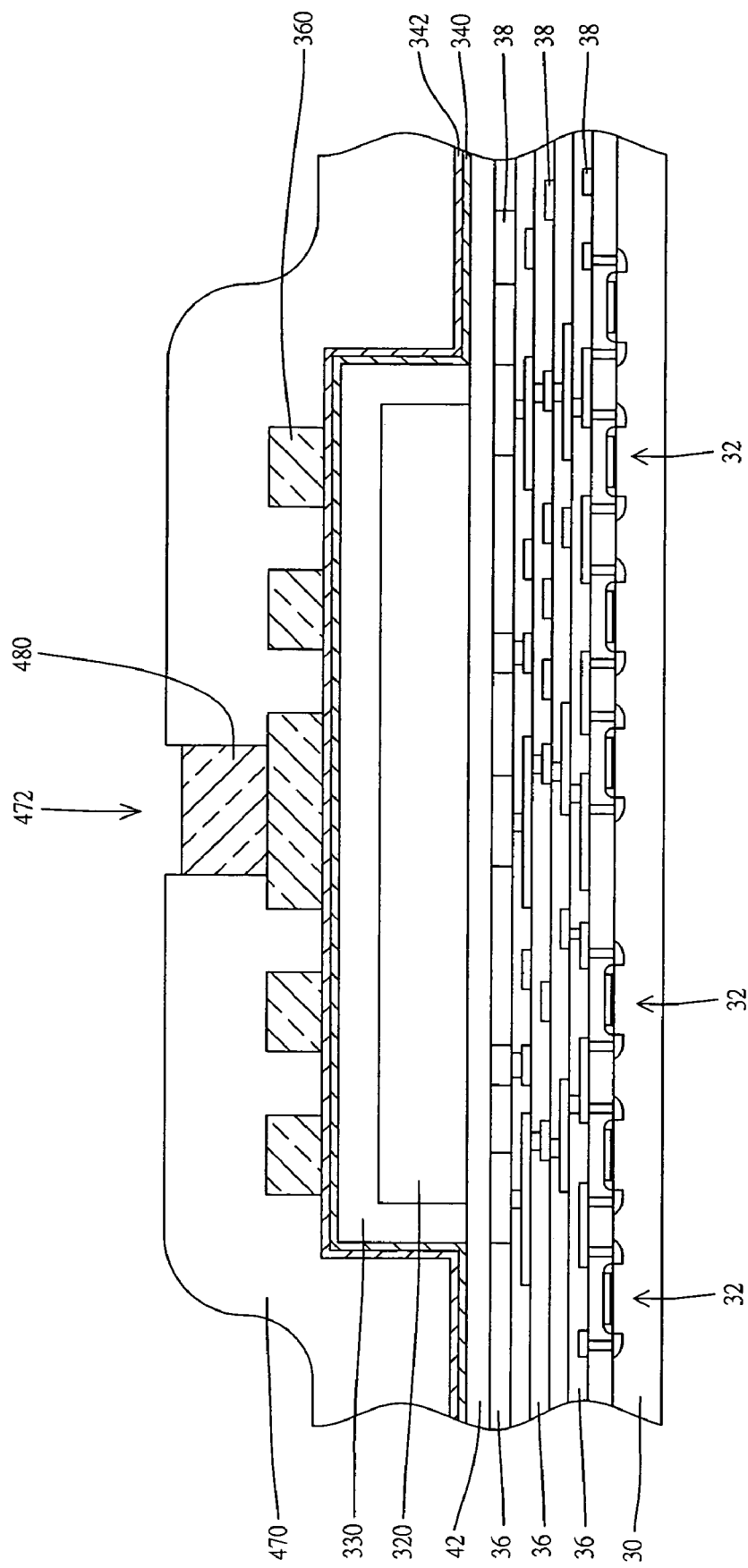
FIGS. 18-30 are cross-sectional views showing a process with a seed layer for two steps of electroplating, wherein the metal layer deposited at the second step of electroplating is capable of being a metal via connecting neighboring two coils.

Alternatively, referring to FIG. 17, a metal bump formed from the above-mentioned metal layer 380 capable of being connected to the above-mentioned external circuitry 396 and a bond pad formed from the above-mentioned metal layer 360 capable of being wirebonded thereto or having a gold bump or solder bump formed thereover can be provided. An opening 393 in the polymer layer 390 exposes the bond pad formed from the above-mentioned metal layer 360. A gold wire 394 can be connected to the metal layer 360 exposed by the opening 393 in the polymer layer 390 using a wirebonding process. Alternatively, a gold bump or tin-containing bump, not shown, can be formed over the metal layer 360 exposed by the opening 393 in the polymer layer 390. The elements shown in FIG. 17 having same reference numbers as those shown in FIGS. 1-14 and 16 indicate similar ones described above in FIGS. 1-14 and 16.

Alternatively, two layers of coils can be formed over the passivation layer 42, as shown in FIGS. 18-30. The process illustrated by FIGS. 18-30 follows the above-mentioned process of FIG. 6. The elements shown in FIGS. 18-30 having same reference numbers as those shown in FIGS. 1-14 indicate similar ones described above in FIGS. 1-14. After the above-mentioned metal layer 360 is formed, a photoresist layer 470, such as photosensitive polyimide, photosensitive benzo-cyclo-butene (BCB), photosensitive parylene-based material, photosensitive epoxy-based material, with a thickness t4 of between 1 and 30 microns, is formed on the electroplated metal layer 360 and on the seed layer 342 using a spin coating process. Next, a photolithography process including exposing and developing steps is used to pattern the photoresist layer 470 and to form an opening 472 in the photoresist layer 470 exposing the electroplated metal layer 360.

Next, a metal layer 480 is electroplated on the metal layer 360 exposed by the opening 472 in the photoresist layer 470. The metal layer 480 can be deposited by electroplating a single layer of gold with a thickness of between 1 and 20 microns on the metal layer 360, whose topmost layer is preferably gold, exposed by the opening 472 in the photoresist layer 470. Alternatively, the metal layer 480 can be deposited by electroplating a single layer of gold with a thickness of between 1 and 20 microns on the metal layer 360, whose topmost layer is preferably nickel, exposed by the opening 472 in the photoresist layer 470. Alternatively, the metal layer 480 can be deposited by electroplating a single layer of silver with a thickness of between 1 and 20 microns on the metal layer 360, whose topmost layer is preferably silver, exposed by the opening 472 in the photoresist layer 470. Alternatively, the metal layer 480 can be deposited by electroplating a single layer of palladium with a thickness of between 1 and 20 microns on the metal layer 360, whose topmost layer is preferably palladium, exposed by the opening 472 in the photoresist layer 470. Alternatively, the metal layer 480 can be deposited by electroplating a single layer of platinum with a thickness of between 1 and 20 microns on the metal layer 360, whose topmost layer is preferably platinum, exposed by the opening 472 in the photoresist layer 470. Alternatively, the metal layer 480 can be deposited by electroplating a single layer of rhodium with a thickness of between 1 and 20 microns on the metal layer 360, whose topmost layer is preferably rhodium, exposed by the opening 472 in the photoresist layer 470. Alternatively, the metal layer 480 can be deposited by electroplating a single layer of ruthenium with a thickness of between 1 and 20 microns on the metal layer 360, whose topmost layer is preferably ruthenium, exposed by the opening 472 in the photoresist layer 470. Alternatively, the metal layer 480 can be deposited by electroplating a single layer of rhenium with a thickness of between 1 and 20 microns on the metal layer 360, whose topmost layer is preferably rhenium, exposed by the opening 472 in the photoresist layer 470. Alternatively, the metal layer 480 can be deposited by electroplating a single layer of copper with a thickness of between 1 and 20 microns on the metal layer 360, whose topmost layer is preferably copper, exposed by the opening 472 in the photoresist layer 470. Alternatively, the metal layer 480 can be deposited by electroplating a nickel layer with a thickness of between 1 and 10 microns on the metal layer 360, whose topmost layer is preferably nickel, exposed by the opening 472 in the photoresist layer 470, and then electroplating a solder layer, such a tin-lead alloy or a tin-silver alloy, with a thickness of between 1 and 10 microns on the nickel layer. Alternatively, the metal layer 480 can be deposited by electroplating a nickel layer with a thickness of between 1 and 10 microns on the metal layer 360, whose topmost layer is preferably nickel, exposed by the opening 472 in the photoresist layer 470, and then electroplating a gold layer with a thickness of between 1 and 10 microns on the nickel layer.

In the embodiment, the metal layer 480 is formed with a metal via connecting neighboring coils separated by a to-be-formed polymer layer.

Figure 19:
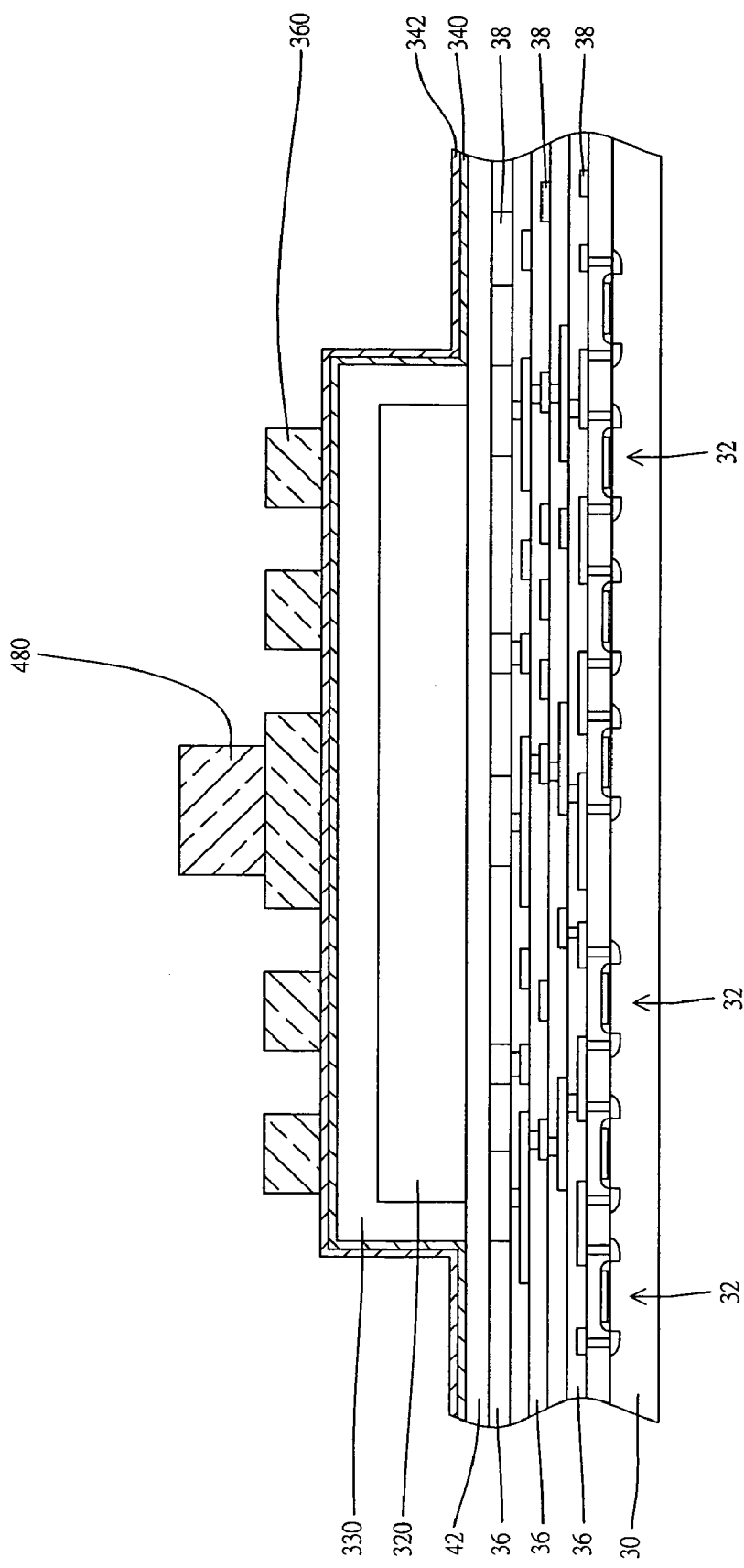
Figure 20:
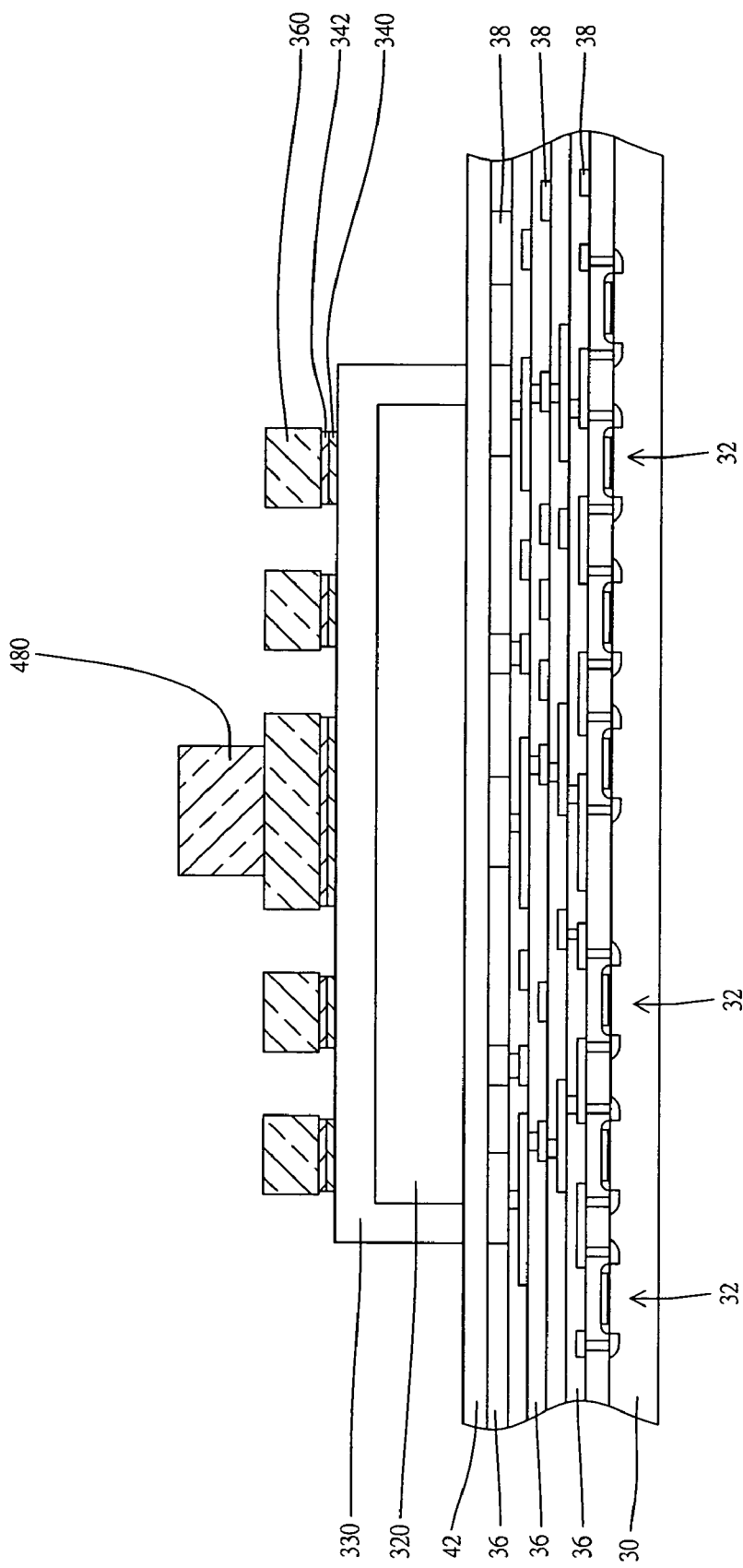

Next, referring to FIG. 19, the photoresist layer 470 is stripped. Next, referring to FIG. 20, the seed layer 342 not under the metal layer 360 is removed using a dry etching process or a wet etching process. If the seed layer is gold and removed by a wet etching process, the etchant for etching the seed layer 342 is potassium iodide. Thereinafter, the adhesion/barrier layer 340 not under the metal layer 360 is removed using a dry etching process or a wet etching process. If the adhesion/barrier layer 340 is a titanium tungsten alloy and removed by a wet etching process, the etchant for etching the adhesion/barrier layer 340 is hydrogen peroxide or hydrofluoric acid. If the adhesion/barrier layer 340 is titanium and removed by a wet etching process, the etchant for etching the adhesion/barrier layer 340 is hydrofluoric acid.

Figure 21:
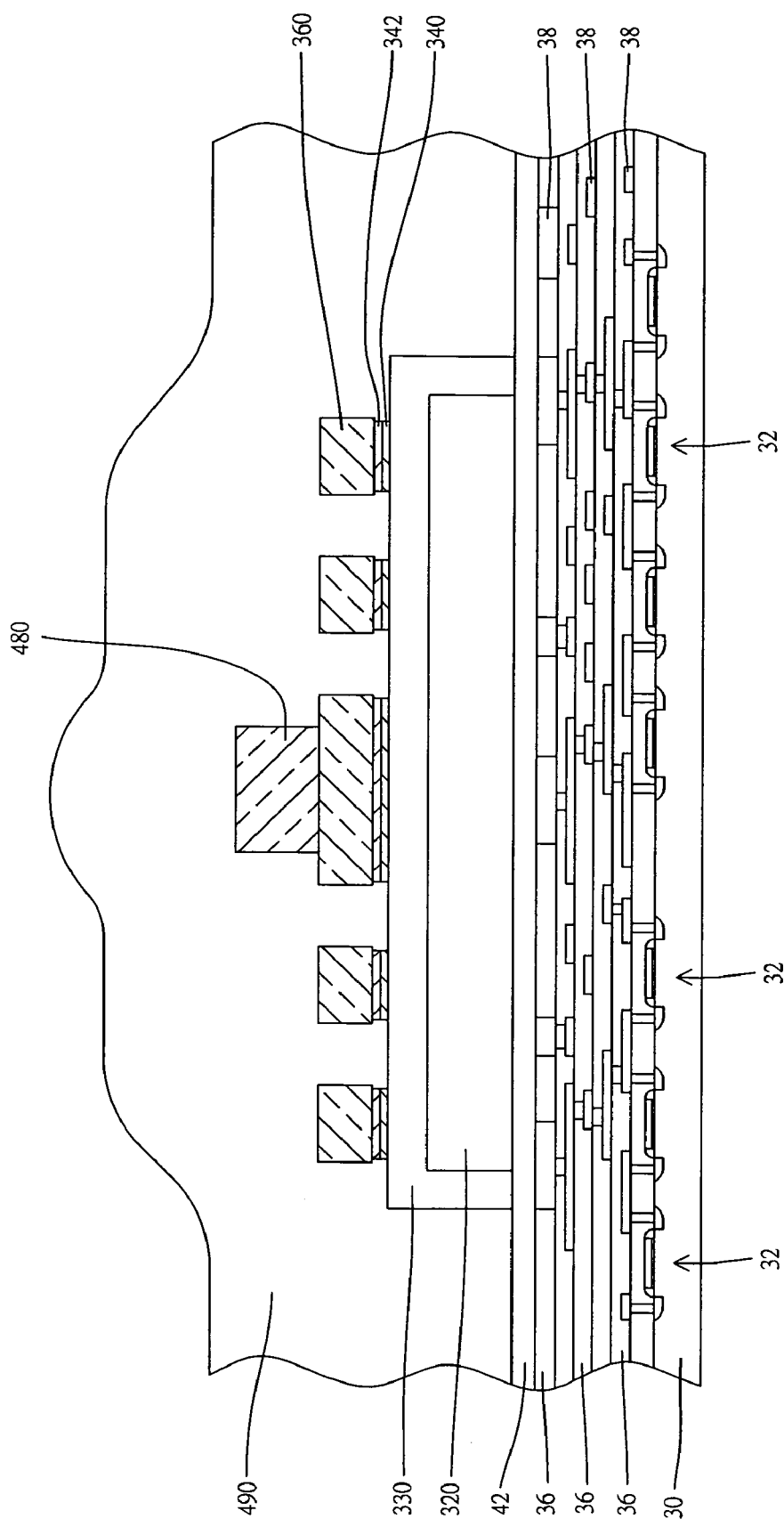

Referring to FIG. 21, a polymer layer 490 is formed on the metal layers 480 and 360, on the patterned polymer layer 330, and on the passivation layer 42. The polymer layer 490 can be formed by spin coating a polymer layer of polyimide, benzo-cyclo-butene (BCB), parylene-based material, epoxy-based material, or elastomer, with a thickness of between 2 and 50 microns, and preferably between 8 and 30 microns, on the metal layers 380 and 360, on the patterned polymer layer 330, and on the passivation layer 42, and then curing the spin-coated polymer layer at the temperature of 300 and 450 degrees centigrade if the spin-coated polymer layer is polyimide. Alternatively, the polymer layer 490 can be formed by repeating said spin coating process and said curing process many times to form the polymer layer 490 with an extremely great thickness.

Alternatively, the polymer layer 490 can be formed by screen printing a polymer layer of polyimide, benzocyclobutene (BCB), parylene-based material or epoxy-based material, with a thickness of between 5 and 50 microns on the metal layers 480 and 360, on the patterned polymer layer 330, and on the passivation layer 42, and then curing the screen-printed polymer layer at the temperature of 300 and 450 degrees centigrade if the screen-printed polymer layer is polyimide. Alternatively, the polymer layer 490 can be formed by laminating a dry film of polyimide, benzocyclobutene (BCB), parylene-based material or epoxy, with a thickness of between 10 and 500 microns on the metal layers 480 and 360, on the patterned polymer layer 330, and on the passivation layer 42.

Figure 22:
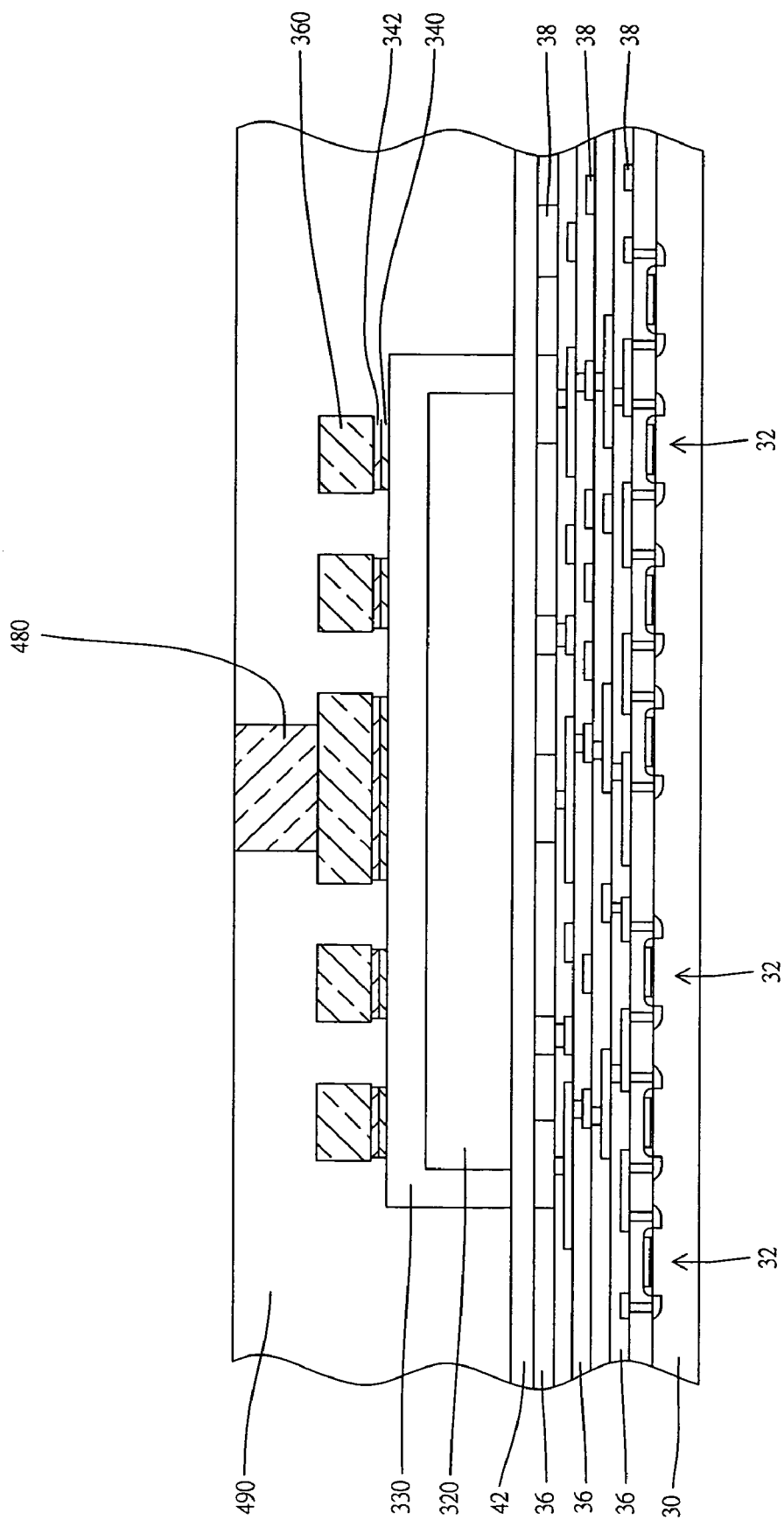

Next, referring to FIG. 22, the top side of the polymer layer 490 is ground using a mechanical grinding process or using a chemical mechanical polishing (CMP) process until the top surface of the metal layer 480 is exposed to the outside.

Figure 23:
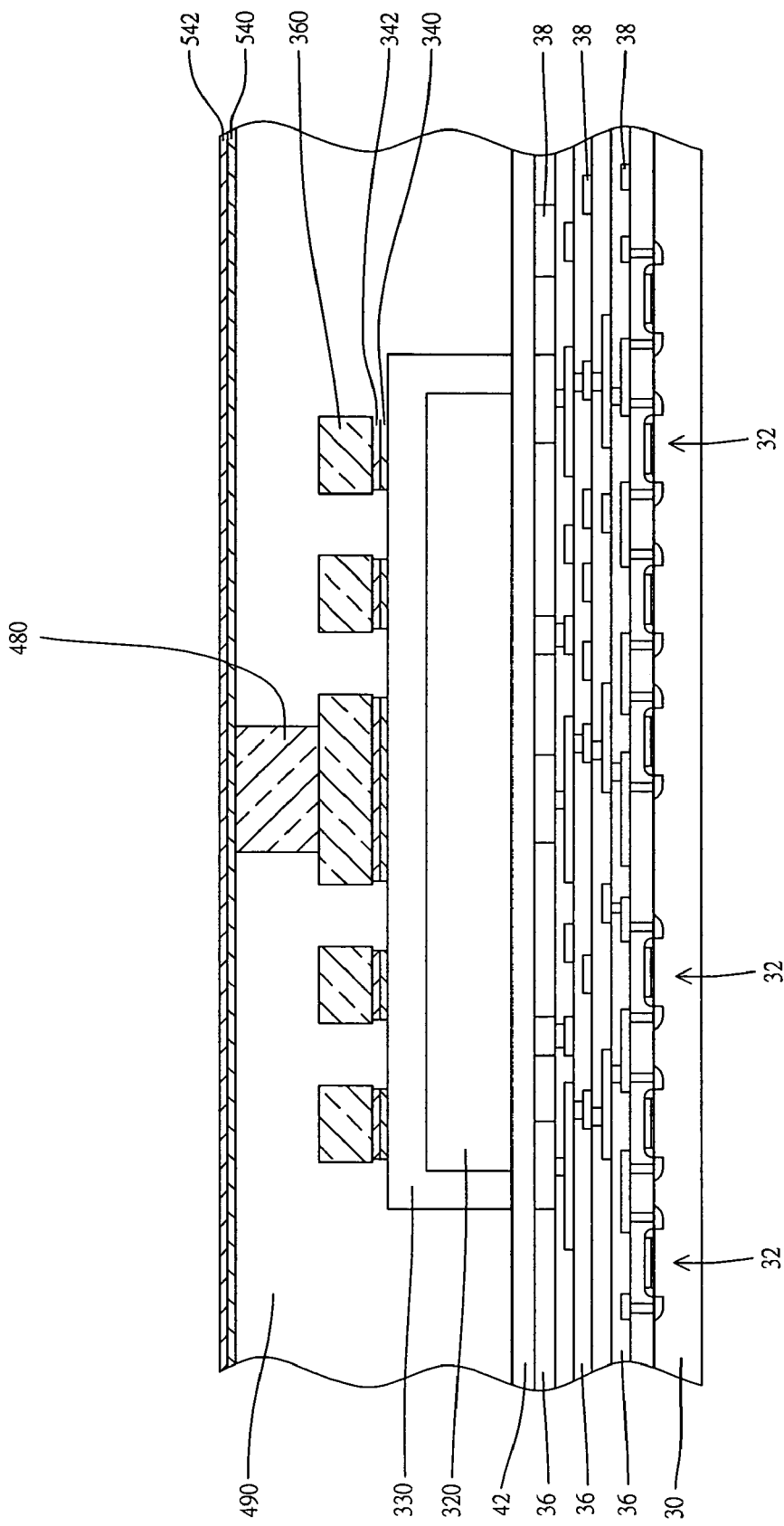

Next, referring to FIG. 23, an adhesion/barrier layer 540 may be formed by sputtering or evaporating a metal layer of titanium, tungsten, cobalt, nickel, titanium nitride, a titanium-tungsten alloy, chromium, a chromium-copper alloy, tantalum, or tantalum nitride, with a thickness of between 1000 and 6000 angstroms, on the polymer layer 490 and on the metal layer 480. Next, a seed layer 542 may be formed by sputtering, evaporating or electroless plating a metal layer of gold, copper, nickel, silver, palladium, platinum, rhodium, ruthenium, or rhenium, with a thickness of between 500 and 3000 angstroms on the adhesion/barrier layer 540.

Figure 24:
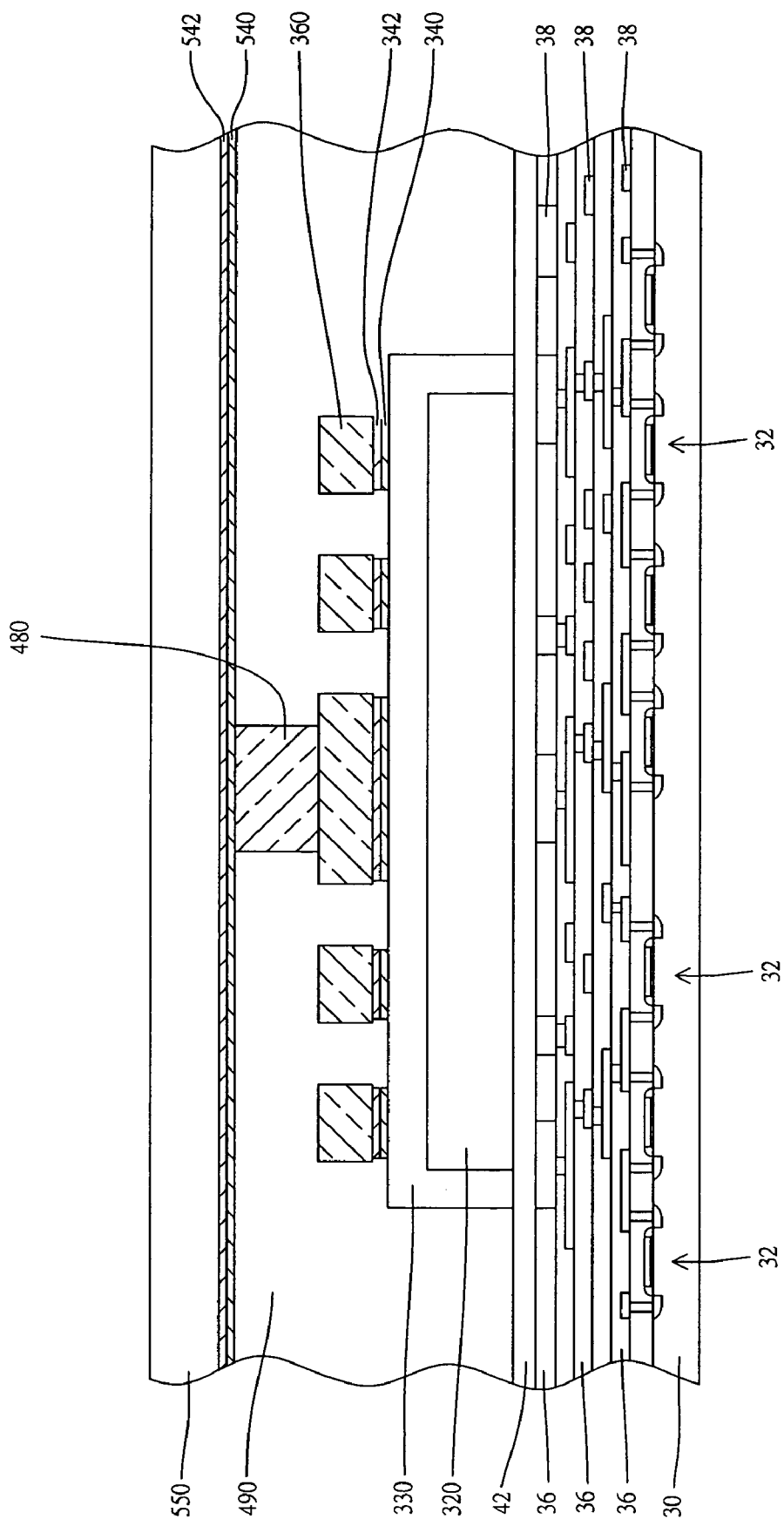

Next, referring to FIG. 24, a photoresist layer 550, such as photosensitive polyimide, photosensitive benzo-cyclo-butene (BCB), photosensitive parylene-based material, photosensitive epoxy-based material, with a thickness t3 of between 4 and 30 microns, is formed on the seed layer 542 using a spin coating process.

Figure 25:
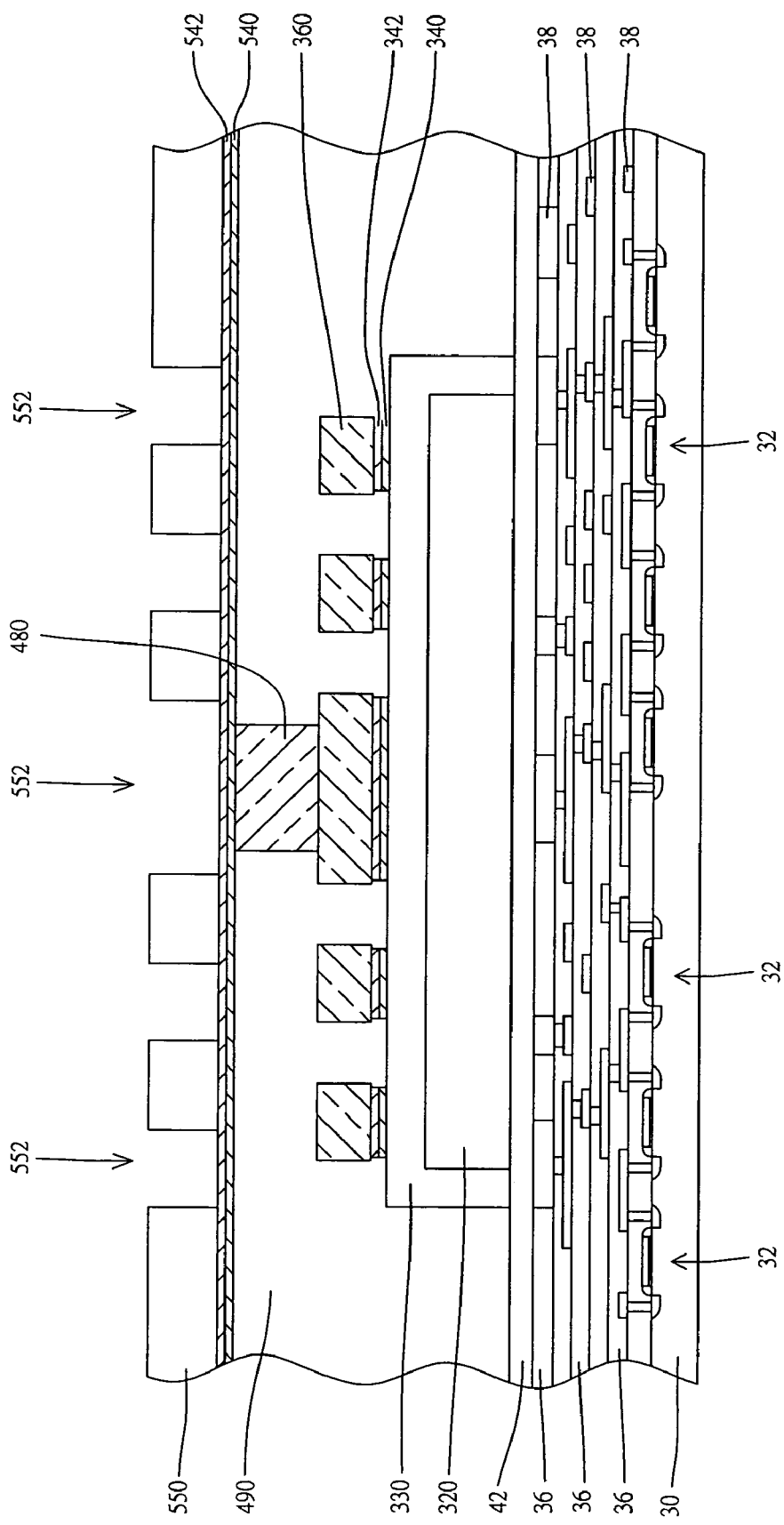

Next, referring to FIG. 25, a photolithography process including exposing and developing steps is used to pattern the photoresist layer 550 and to form an opening 552, with a coil pattern from a top view, in the photoresist layer 550 exposing the seed layer 542.

Figure 26:
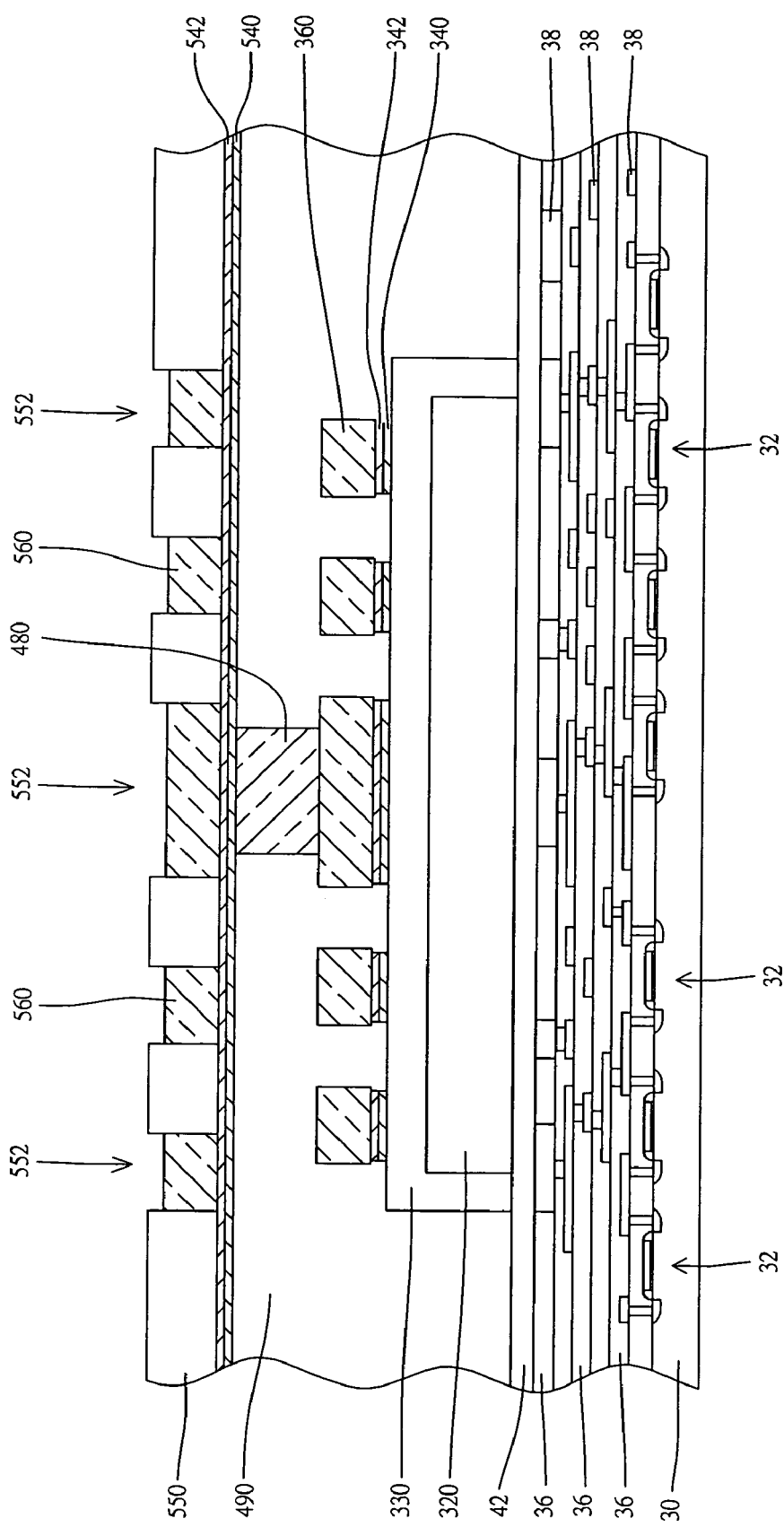

Next, referring to FIG. 26, a metal layer 560, with a coil pattern from a top view, is electroplated on seed layer 542 exposed by the opening 552 in the photoresist layer 550. The metal layer 560 can be deposited by electroplating a single layer of gold with a thickness of between 1 and 20 microns, and preferably between 3 and 10 microns, on the seed layer 542 preferably of gold exposed by the opening 552 in the photoresist layer 550. Alternatively, the metal layer 560 can be deposited by electroplating a single layer of copper with a thickness of between 1 and 20 microns, and preferably 3 and 10 microns, on the seed layer 542 preferably of copper exposed by the opening 552 in the photoresist layer 550. Alternatively, the metal layer 560 can be deposited by electroplating a single layer of silver with a thickness of between 1 and 20 microns, and preferably 3 and 10 microns, on the seed layer 542 preferably of silver exposed by the opening 552 in the photoresist layer 550. Alternatively, the metal layer 560 can be deposited by electroplating a single layer of nickel with a thickness of between 1 and 20 microns, and preferably 3 and 10 microns, on the seed layer 542 preferably of nickel exposed by the opening 552 in the photoresist layer 550. Alternatively, the metal layer 560 can be deposited by electroplating a single layer of palladium with a thickness of between 1 and 20 microns, and preferably 3 and 10 microns, on the seed layer 542 preferably of palladium exposed by the opening 552 in the photoresist layer 550. Alternatively, the metal layer 560 can be deposited by electroplating a single layer of platinum with a thickness of between 1 and 20 microns, and preferably 3 and 10 microns, on the seed layer 542 preferably of platinum exposed by the opening 552 in the photoresist layer 550. Alternatively, the metal layer 560 can be deposited by electroplating a single layer of rhodium with a thickness of between 1 and 20 microns, and preferably 3 and 10 microns, on the seed layer 542 preferably of rhodium exposed by the opening 552 in the photoresist layer 550. Alternatively, the metal layer 560 can be deposited by electroplating a single layer of ruthenium with a thickness of between 1 and 20 microns, and preferably 3 and 10 microns, on the seed layer 542 preferably of ruthenium exposed by the opening 552 in the photoresist layer 550. Alternatively, the metal layer 560 can be deposited by electroplating a single layer of rhenium with a thickness of between 1 and 20 microns, and preferably 3 and 10 microns, on the seed layer 542 preferably of rhenium exposed by the opening 552 in the photoresist layer 550. Alternatively, the metal layer 560 can be deposited by electroplating a copper layer with a thickness of between 1 and 20 microns, and preferably 3 and 10 microns, on the seed layer 542 preferably of copper exposed by the opening 552 in the photoresist layer 550, and then electroplating a nickel layer with a thickness of between 1 and 5 microns on the copper layer in the opening 552 in the photoresist layer 550. Alternatively, the metal layer 560 can be deposited by electroplating a copper layer with a thickness of between 1 and 20 microns, and preferably 3 and 10 microns, on the seed layer 542 preferably of copper exposed by the opening 552 in the photoresist layer 550, then electroplating a nickel layer with a thickness of between 1 and 5 microns on the copper layer in the opening 552 in the photoresist layer 550, and then electroplating a gold layer with a thickness of between 1 and 5 microns on the nickel layer in the opening 552 in the photoresist layer 550.

Figure 27:
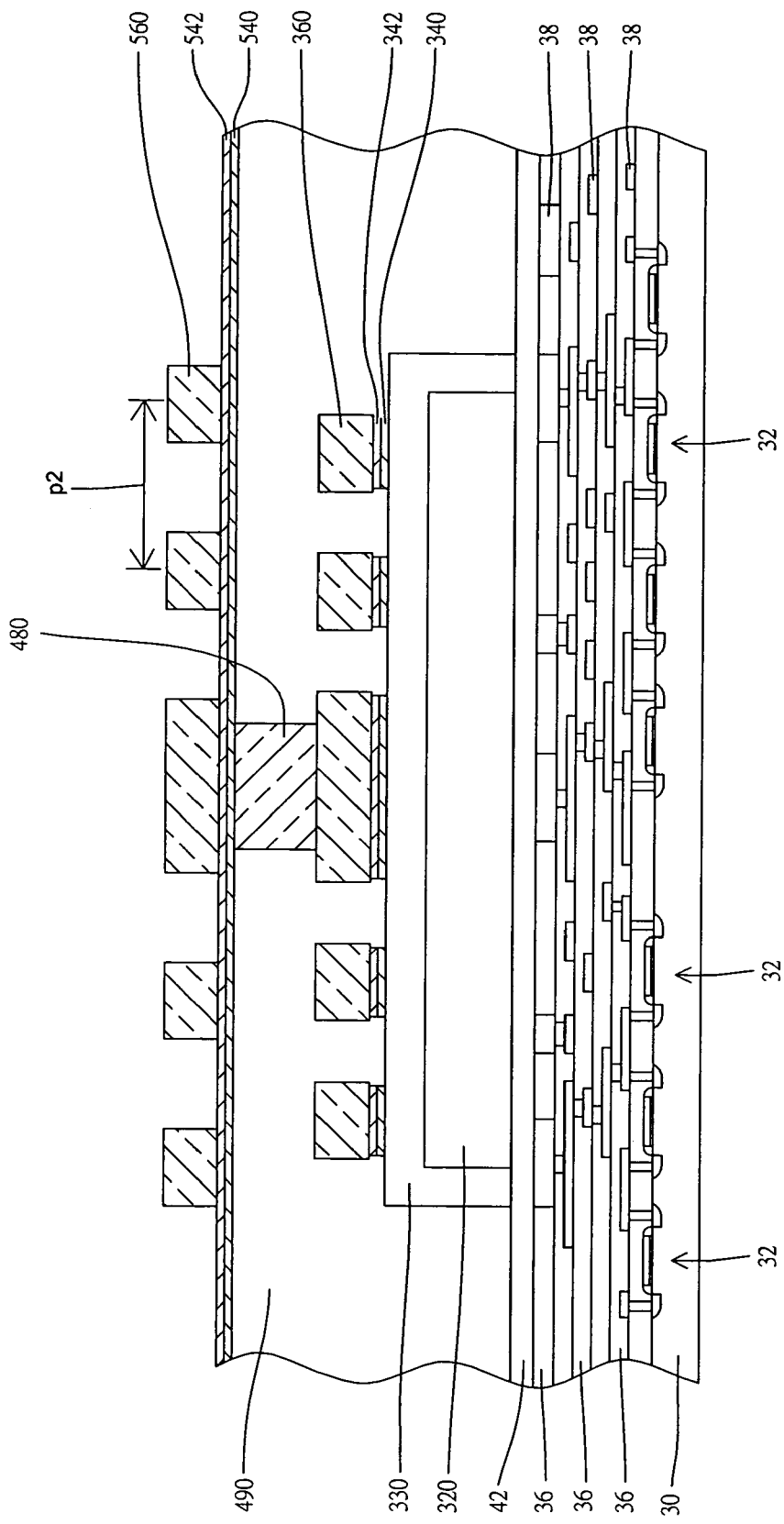

Next, referring to FIG. 27, the photoresist layer 550 is stripped. The pitch p2 between the centers of the neighboring turns of the patterned coil may range from 2 to 30 microns, and preferably from 2 and 10 microns.

Figure 28:
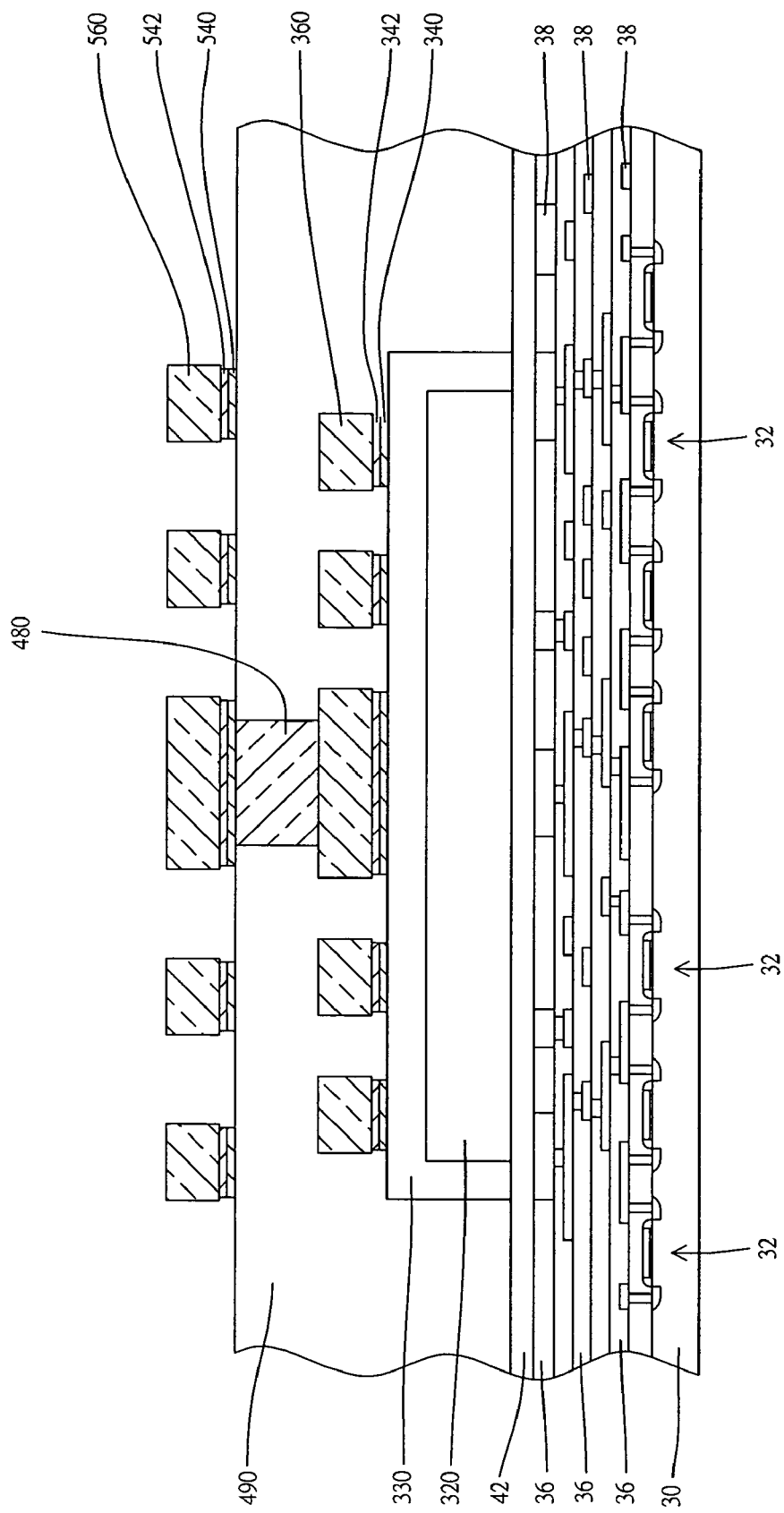

Next, referring to FIG. 28, the seed layer 542 not under the metal layer 560 is removed using a dry etching process or a wet etching process. If the seed layer 542 is gold and removed by a wet etching process, the etchant for etching the seed layer 542 is potassium iodide. Thereafter, the adhesion/barrier layer 540 not under the metal layer 560 is removed using a dry etching process or a wet etching process. If the adhesion/barrier layer 540 is a titanium tungsten alloy and removed by a wet etching process, the etchant for etching the adhesion/barrier layer 540 is hydrogen peroxide or hydrofluoric acid. If the adhesion/barrier layer 540 is titanium and removed by a wet etching process, the etchant for etching the adhesion/barrier layer 540 is hydrofluoric acid.

Figure 29:
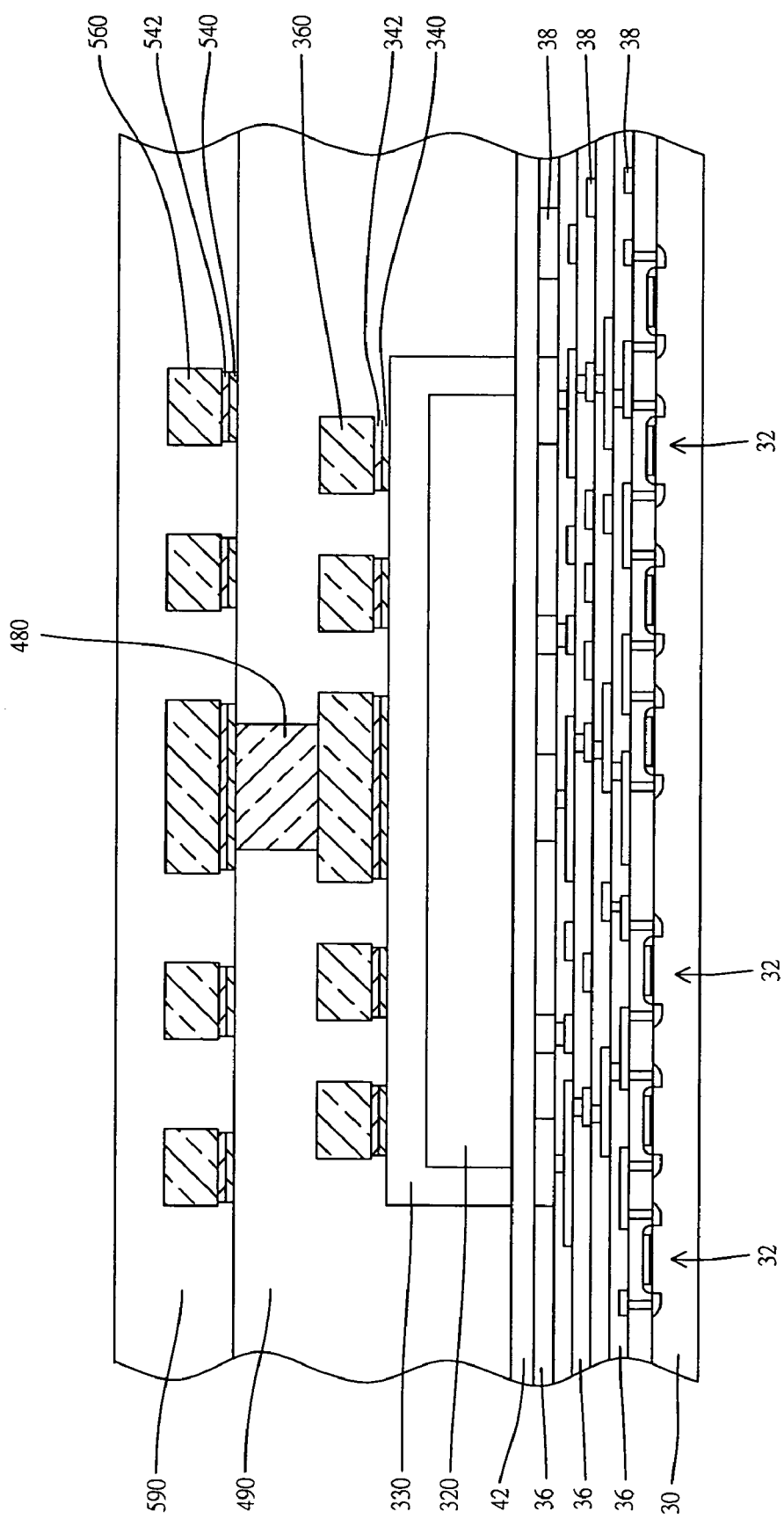
Figure 30:
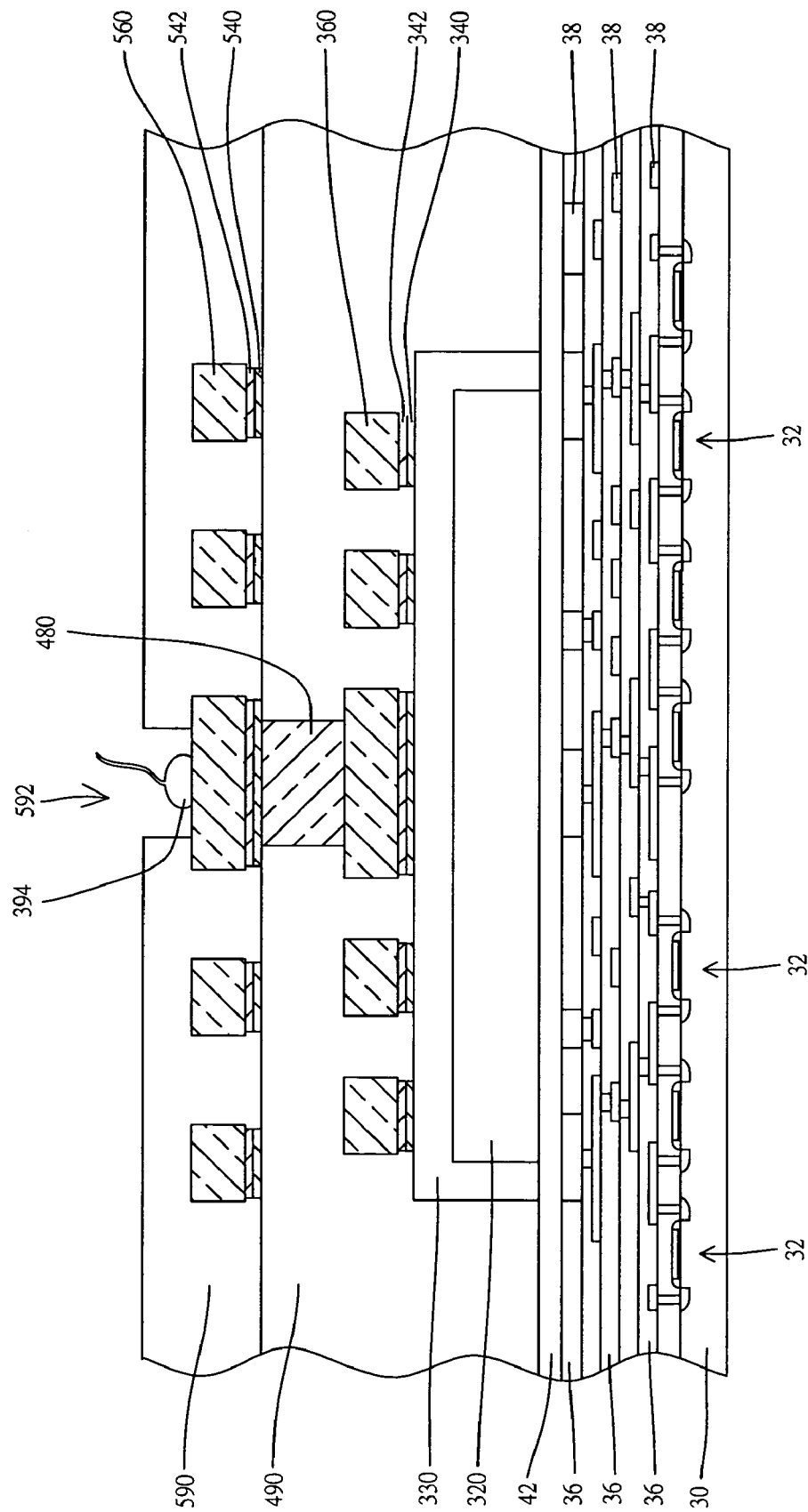

Referring to FIGS. 29-30, it is an optional process to form a patterned polymer layer 590 on the metal layer 560 and on the polymer layer 490. The patterned polymer layer 590 can be formed by spin coating a polymer layer of polyimide, benzo-cyclo-butene (BCB), parylene-based material, epoxy-based material, or elastomer, with a thickness of between 2 and 50 microns, and preferably between 8 and 30 microns, on the metal layer 560 and on the polymer layer 490.

Next, if the spin-coated polymer layer is photosensitive, a photolithography process including exposing and developing steps can be used to form an opening 592 in the spin-coated polymer layer exposing the metal layer 560. Next, the spin-coated polymer layer is cured at the temperature of 300 and 450 degrees centigrade if the spin-coated polymer layer is polyimide. The patterned polymer layer 590 after being cured may have a thickness t6 of between 2 and 50 microns, and preferably between 6 and 20 microns.

If the spin-coated polymer layer is non-photosensitive, photolithography and etching processes are typically needed to pattern the spin-coated polymer layer.

Alternatively, the patterned polymer layer 590 can be formed by screen printing a patterned polymer layer of polyimide, benzocyclobutene (BCB), parylene-based material or epoxy-based material, with a thickness of between 5 and 50 microns on the metal layer 560 and on the polymer layer 490, and then curing the screen-printed polymer layer at the temperature of 300 and 450 degrees centigrade if the screen-printed polymer layer is polyimide. Alternatively, the patterned polymer layer 590 can be formed by laminating a patterned dry film of polyimide, benzocyclobutene (BCB), parylene-based material or epoxy, with a thickness of between 10 and 500 microns on the metal layer 560 and on the polymer layer 490.

Next, referring to FIG. 30, the metal layer 560 has a portion exposed by the opening 592 in the polymer layer 590, which may be used as a metal pad for being wirebonded thereto or having a gold bump or solder bump formed thereover. A gold wire 394 can be connected to the metal layer 560 exposed by the opening 592 in the polymer layer 590 using a wirebonding process. Alternatively, a gold bump or tin-containing bump, not shown, can be formed over the above-mentioned metal layer 560 exposed by the opening 592 in the polymer layer 590.

Figure 31:
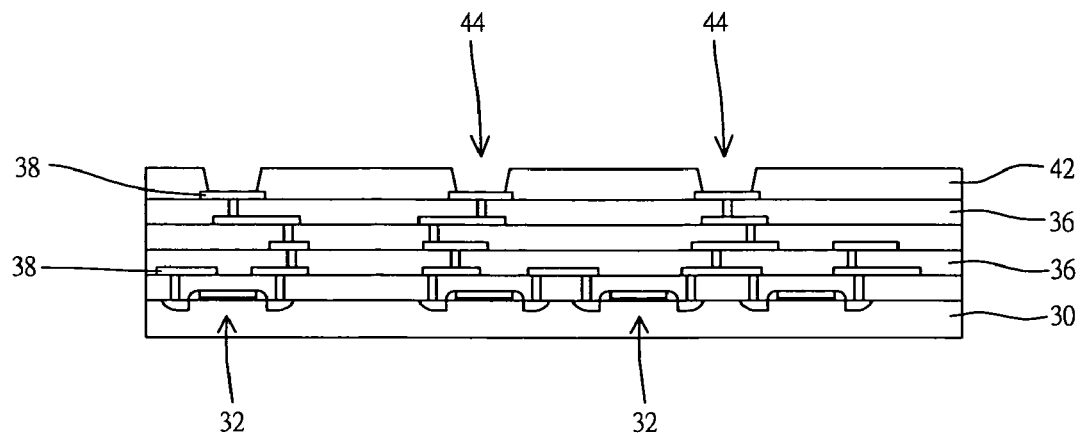
FIGS. 31-56 are cross-sectional views showing a process with a seed layer for two steps of electroplating, wherein the metal layer deposited at the second step of electroplating is capable of being a metal via connecting neighboring two circuit layers.

Alternatively, the above-mentioned process is not limited to forming coils with two patented circuit layers, but can be applied to forming a metal trace with multiple patterned circuit layers, as shown in FIGS. 31-56. Referring to FIGS. 31-56, the structure under the passivation layer 42 can be referred as to that described in FIG. 1. The elements shown in FIGS. 31-56 having same reference numbers as those shown in FIGS. 1-14 indicate similar ones described above in FIGS. 1-14. In FIG. 31, multiple openings 44 may be formed in the passivation layer 42 and may expose multiple metal pads of the topmost one of the thin-film circuit layers 38.

Figure 32:
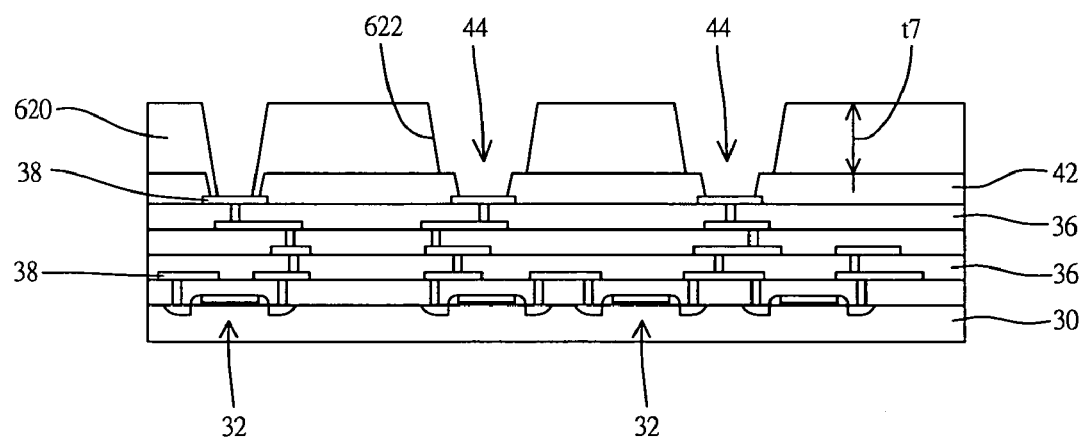

Referring to FIG. 32, it is an optional process to form a patterned polymer layer 620 on the passivation layer 42 and on the metal pads exposed by the openings 44 in the passivation layer 42. The patterned polymer layer 620 can be formed by spin coating a polymer layer of polyimide, benzo-cyclobutene (BCB), parylene-based material, epoxy-based material, or elastomer, with a thickness of between 2 and 50 microns, and preferably between 8 and 30 microns, on the passivation layer 42 and on the metal pads of the topmost one of the thin-film circuit layers 38 exposed by the openings 44 in the passivation layer 42.

Next, if the spin-coated polymer layer is photosensitive, a photolithography process including exposing and developing steps can be used to pattern the spin-coated polymer layer and to form multiple openings 622 in the spin-coated polymer layer exposing the metal pads of the topmost one of the thin-film circuit layers 38 exposed by the openings 44 in the passivation layer 42. Next, the spin-coated polymer layer is cured at the temperature of 300 and 450 degrees centigrade if the spin-coated polymer layer is polyimide. The patterned polymer layer 620 after being cured may have a thickness t7 of between 2 and 50 microns, and preferably between 6 and 20 microns.

If the spin-coated polymer layer is non-photosensitive, photolithography and etching processes are typically needed to pattern the spin-coated first polymer layer.

Alternatively, the patterned polymer layer 620 can be formed by screen printing a patterned polymer layer of polyimide, benzocyclobutene (BCB), parylene-based material or epoxy-based material, with a thickness of between 5 and 50 microns on the passivation layer 42, and then curing the screen-printed polymer layer at the temperature of 300 and 450 degrees centigrade if the screen-printed polymer layer is polyimide. Alternatively, the patterned polymer layer 620 can be formed by laminating a patterned dry film of polyimide, benzocyclobutene (BCB), parylene-based material or epoxy, with a thickness of between 10 and 500 microns on the passivation layer 42.

The patterned polymer layer 620 may cover a peripheral region of the exposed surface of the metal pads, such as the left one, of the topmost one of the thin-film circuit layers 38 exposed by the openings 44 in the passivation layer 42. The openings 622 in the patterned polymer layer 620 may expose the entire exposed surface of the metal pads, such as the middle and right ones, of the topmost one of the thin-film circuit layers 38 exposed by the openings 44 in the passivation layer 42.

Alternatively, the patterned polymer layer 620 can be formed by repeating said spin coating process and said curing process many times to form the polymer layer 620 with an extremely great thickness.

Figure 33:
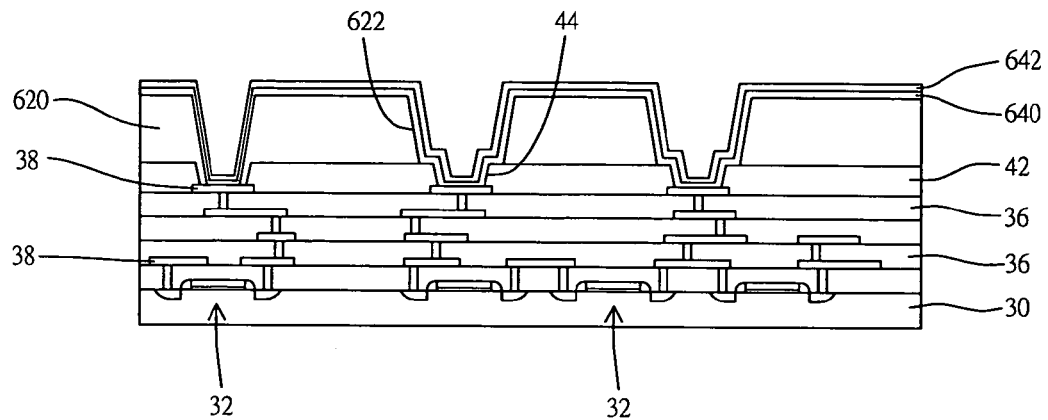

Referring to FIG. 33, after forming the patterned polymer layer 620, an adhesion/barrier layer 640 may be formed by sputtering or evaporating a metal layer of titanium, tungsten, cobalt, nickel, titanium nitride, a titanium-tungsten alloy, chromium, a chromium-copper alloy, tantalum, or tantalum nitride, with a thickness of between 1000 and 6000 angstroms, on the patterned polymer layer 620 and on the metal pads of the topmost one of the thin-film circuit layers 38 exposed by the openings 44 in the passivation layer 42. Next, a seed layer 642 may be formed by sputtering, evaporating or electroless plating a metal layer of gold, copper, nickel, silver, palladium, platinum, rhodium, ruthenium, or rhenium, with a thickness of between 500 and 3000 angstroms on the adhesion/barrier layer 640.

Figure 34:
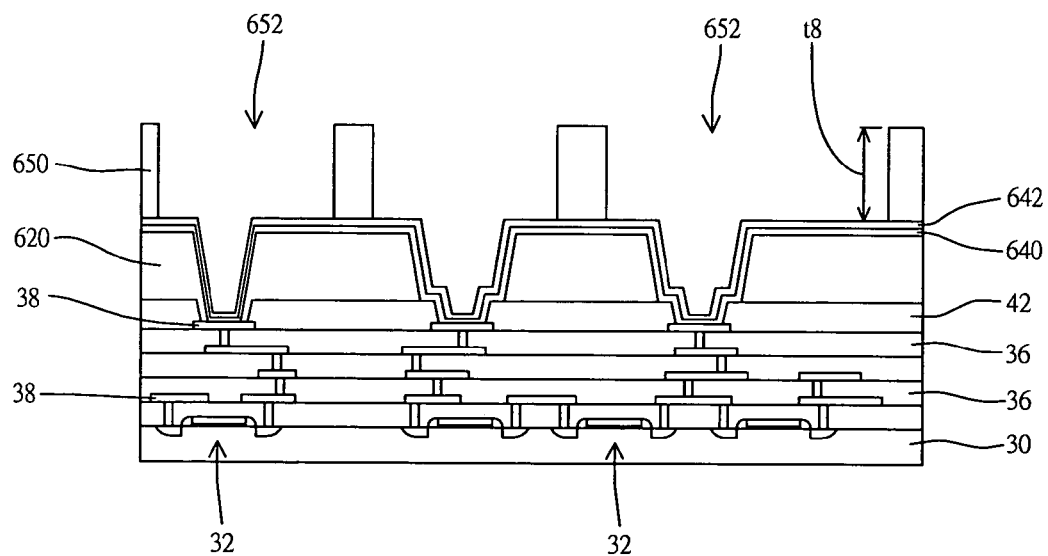

Next, referring to FIG. 34, a photoresist layer 650, such as photosensitive polyimide, photosensitive benzo-cyclobutene (BCB), photosensitive parylene-based material, photosensitive epoxy-based material, with a thickness t8 of between 4 and 30 microns, is formed on the seed layer 642 using a spin coating process. Next, a photolithography process including exposing and developing steps is used to pattern the photoresist layer 650 and to form multiple openings 652, with trace patterns from a top view, in the photoresist layer 650 exposing the seed layer 642.

Figure 35:
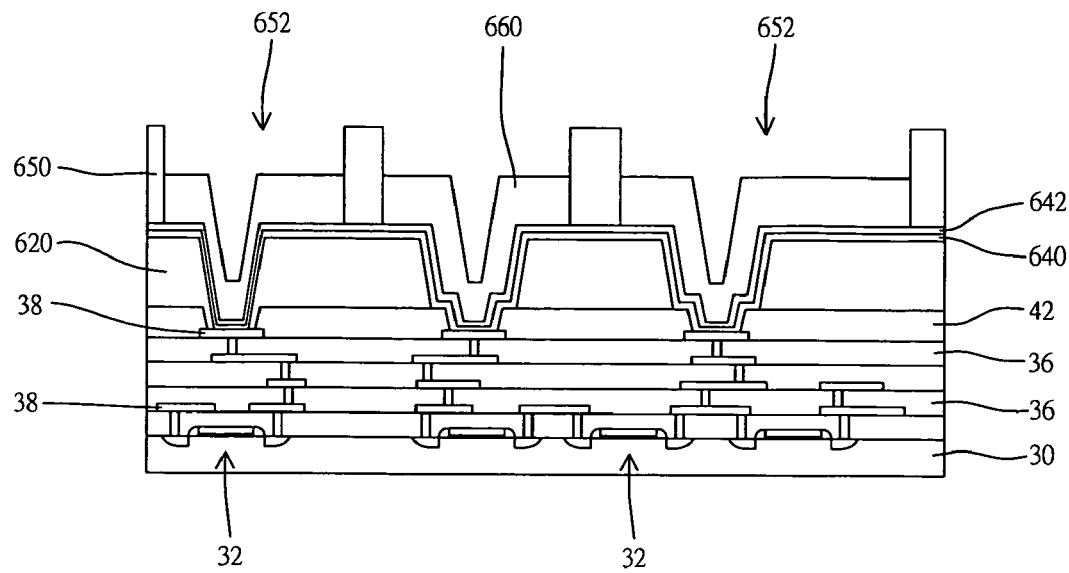

Next, referring to FIG. 35, a metal layer 660, with a coil pattern from a top view, is electroplated on seed layer 642 exposed by the openings 652 in the photoresist layer 650. The metal layer 660 can be deposited by electroplating a single layer of gold with a thickness of between 1 and 20 microns, and preferably between 3 and 10 microns, on the seed layer 642 preferably of gold exposed by the openings 652 in the photoresist layer 650. Alternatively, the metal layer 660 can be deposited by electroplating a single layer of copper with a thickness of between 1 and 20 microns, and preferably 3 and 10 microns, on the seed layer 642 preferably of copper exposed by the openings 652 in the photoresist layer 650. Alternatively, the metal layer 660 can be deposited by electroplating a single layer of silver with a thickness of between 1 and 20 microns, and preferably 3 and 10 microns, on the seed layer 642 preferably of silver exposed by the openings 652 in the photoresist layer 650. Alternatively, the metal layer 660 can be deposited by electroplating a single layer of nickel with a thickness of between 1 and 20 microns, and preferably 3 and 10 microns, on the seed layer 642 preferably of nickel exposed by the openings 652 in the photoresist layer 650. Alternatively, the metal layer 660 can be deposited by electroplating a single layer of palladium with a thickness of between 1 and 20 microns, and preferably 3 and 10 microns, on the seed layer 642 preferably of palladium exposed by the openings 652 in the photoresist layer 650. Alternatively, the metal layer 660 can be deposited by electroplating a single layer of platinum with a thickness of between 1 and 20 microns, and preferably 3 and 10 microns, on the seed layer 642 preferably of platinum exposed by the openings 652 in the photoresist layer 650. Alternatively, the metal layer 660 can be deposited by electroplating a single layer of rhodium with a thickness of between 1 and 20 microns, and preferably 3 and 10 microns, on the seed layer 642 preferably of rhodium exposed by the openings 652 in the photoresist layer 650. Alternatively, the metal layer 660 can be deposited by electroplating a single layer of ruthenium with a thickness of between 1 and 20 microns, and preferably 3 and 10 microns, on the seed layer 642 preferably of ruthenium exposed by the openings 652 in the photoresist layer 650. Alternatively, the metal layer 660 can be deposited by electroplating a single layer of rhenium with a thickness of between 1 and 20 microns, and preferably 3 and 10 microns, on the seed layer 642 preferably of rhenium exposed by the openings 652 in the photoresist layer 650. Alternatively, the metal layer 660 can be deposited by electroplating a copper layer with a thickness of between 1 and 20 microns, and preferably 3 and 10 microns, on the seed layer preferably of copper exposed by the openings 652 in the photoresist layer 650, and then electroplating a nickel layer with a thickness of between 1 and 5 microns on the copper layer exposed by the openings 652 in the photoresist layer 650. Alternatively, the metal layer 660 can be deposited by electroplating a copper layer with a thickness of between 1 and 20 microns, and preferably 3 and 10 microns, on the seed layer preferably of copper exposed by the openings 652 in the photoresist layer 650, then electroplating a nickel layer with a thickness of between 1 and 5 microns on the copper layer exposed by the openings in the photoresist layer 650, and then electroplating a gold layer with a thickness of between 1 and 5 microns on the nickel layer exposed by the openings in the photoresist layer 650.

Figure 36:
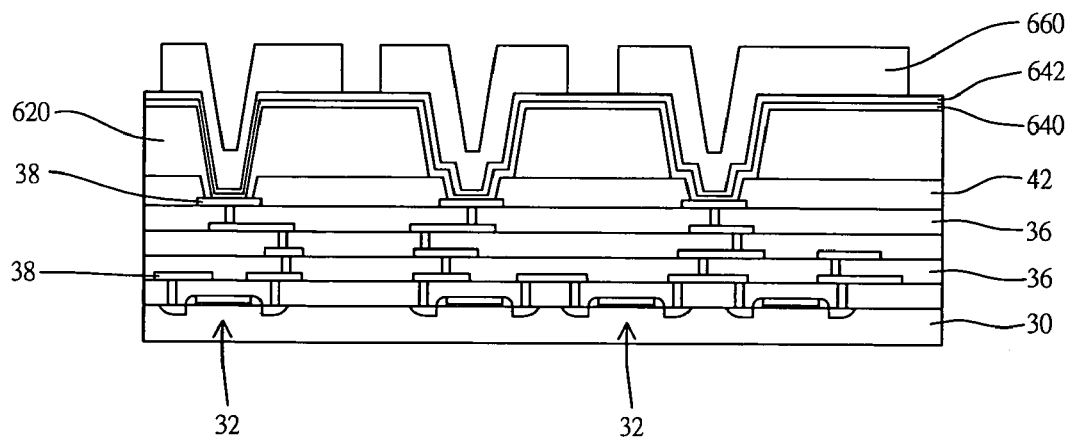

Next, referring to FIG. 36, the photoresist layer 650 is stripped.

Figure 37:
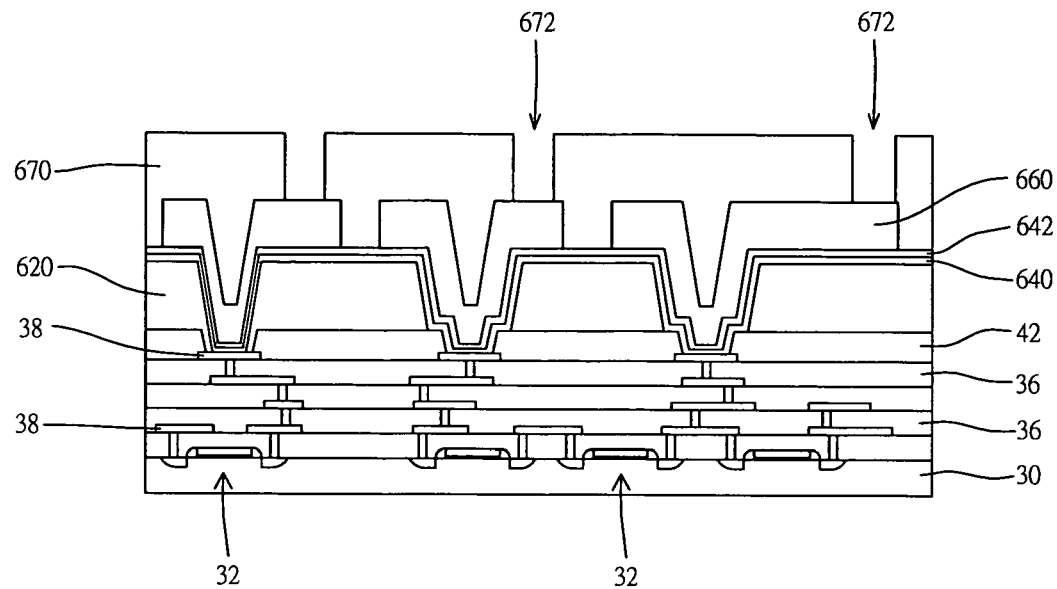

Next, referring to FIG. 37, a photoresist layer 670, such as photosensitive polyimide, photosensitive benzo-cyclo-butene (BCB), photosensitive parylene-based material, photosensitive epoxy-based material, with a thickness t9 of between 4 and 30 microns, is formed on the electroplated metal layer 660 and on the seed layer 642 using a spin coating process. Next, a photolithography process including exposing and developing steps is used to pattern the photoresist layer 670 and to form multiple openings 672 in the photoresist layer 670 exposing the electroplated metal layer 660.

Figure 38:
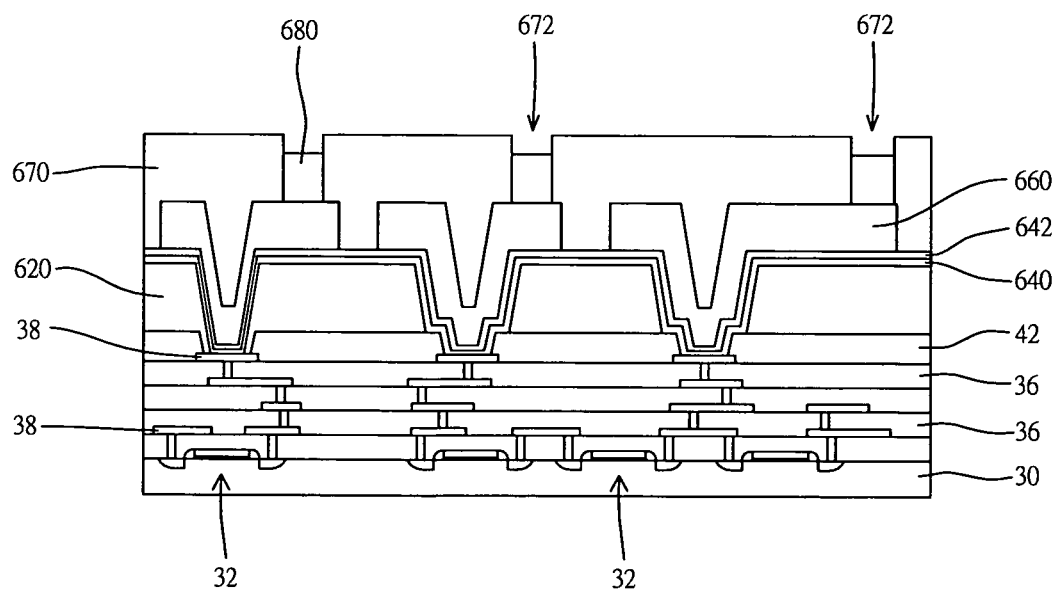

Next, referring to FIG. 38, a metal layer 680 is electroplated on the metal layer 660 exposed by the openings 672 in the photoresist layer 670. The metal layer 680 can be deposited by electroplating a single layer of gold with a thickness of between 1 and 20 microns on the metal layer 660, whose topmost layer is preferably gold, exposed by the openings 672 in the photoresist layer 670. Alternatively, the metal layer 680 can be deposited by electroplating a single layer of gold with a thickness of between 1 and 20 microns on the metal layer 660, whose topmost layer is preferably nickel, exposed by the openings 672 in the photoresist layer 670. Alternatively, the metal layer 680 can be deposited by electroplating a single layer of silver with a thickness of between 1 and 20 microns on the metal layer 660, whose topmost layer is preferably silver, exposed by the openings 672 in the photoresist layer 670. Alternatively, the metal layer 680 can be deposited by electroplating a single layer of palladium with a thickness of between 1 and 20 microns on the metal layer 660, whose topmost layer is preferably palladium, exposed by the openings 672 in the photoresist layer 670. Alternatively, the metal layer 680 can be deposited by electroplating a single layer of platinum with a thickness of between 1 and 20 microns on the metal layer 660, whose topmost layer is preferably platinum, exposed by the openings 672 in the photoresist layer 670. Alternatively, the metal layer 680 can be deposited by electroplating a single layer of rhodium with a thickness of between 1 and 20 microns on the metal layer 660, whose topmost layer is preferably rhodium, exposed by the openings 672 in the photoresist layer 670. Alternatively, the metal layer 680 can be deposited by electroplating a single layer of ruthenium with a thickness of between 1 and 20 microns on the metal layer 660, whose topmost layer is preferably ruthenium, exposed by the openings 672 in the photoresist layer 670. Alternatively, the metal layer 680 can be deposited by electroplating a single layer of rhenium with a thickness of between 1 and 20 microns on the metal layer 660, whose topmost layer is preferably rhenium, exposed by the openings 672 in the photoresist layer 670. Alternatively, the metal layer 680 can be deposited by electroplating a single layer of copper with a thickness of between 1 and 20 microns on the metal layer 660, whose topmost layer is preferably copper, exposed by the openings 672 in the photoresist layer 670. Alternatively, the metal layer 680 can be deposited by electroplating a nickel layer with a thickness of between 1 and 10 microns on the metal layer 660, whose topmost layer is preferably nickel, exposed by the openings 672 in the photoresist layer 670, and then electroplating a solder layer, such a tin-lead alloy or a tin-silver alloy, with a thickness of between 1 and 10 microns on the nickel layer. Alternatively, the metal layer 680 can be deposited by electroplating a nickel layer with a thickness of between 1 and 10 microns on the metal layer 660, whose topmost layer is preferably nickel, exposed by the openings 672 in the photoresist layer 670, and then electroplating a gold layer with a thickness of between 1 and 10 microns on the nickel layer.

In the embodiment, the metal layer 680 is formed with multiple metal vias connecting neighboring circuit metal layers separated by a to-be-formed polymer layer.

Figure 39:
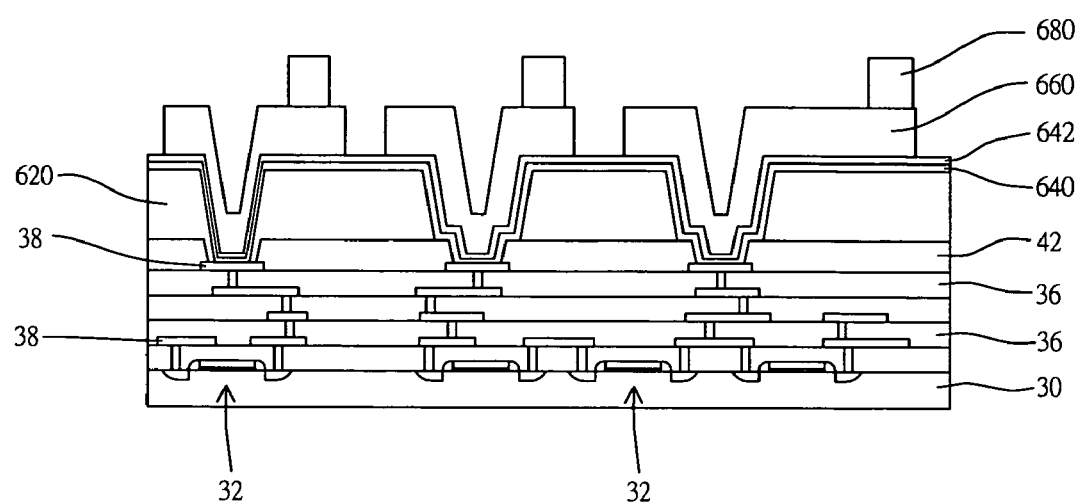
Figure 40:
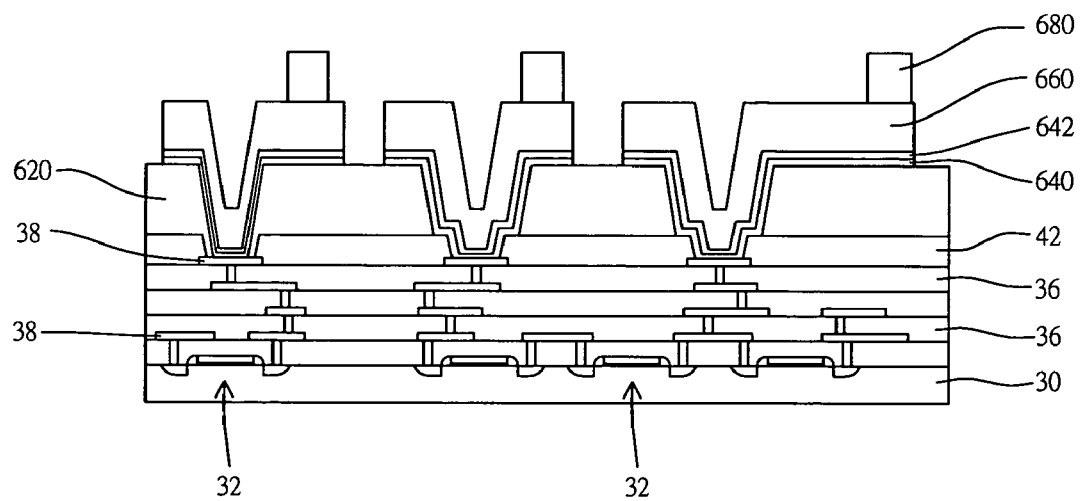

Next, referring to FIG. 39, the photoresist layer 670 is stripped. Next, referring to FIG. 40, the seed layer 642 not under the metal layer 660 is removed using a dry etching process or a wet etching process. If the seed layer 642 is gold and removed by a wet etching process, the etchant for etching the seed layer 642 is potassium iodide. Thereafter, the adhesion/barrier layer 340 not under the metal layer 660 is removed using a dry etching process or a wet etching process. If the adhesion/barrier layer 640 is a titanium tungsten alloy and removed by a wet etching process, the etchant for etching the adhesion/barrier layer 640 is hydrogen peroxide or hydrofluoric acid. If the adhesion/barrier layer 640 is titanium and removed by a wet etching process, the etchant for etching the adhesion/barrier layer 640 is hydrofluoric acid.

Figure 41:
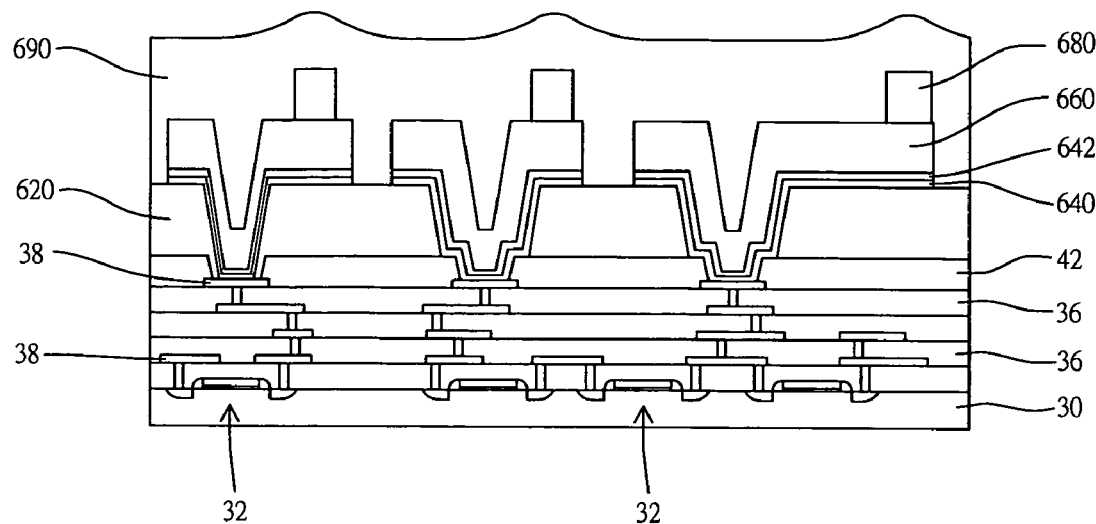

Referring to FIG. 41, a polymer layer 690 is formed on the metal layers 680 and 660 and on the patterned polymer layer 620. The polymer layer 690 can be formed by spin coating a polymer layer of polyimide, benzo-cyclo-butene (BCB), parylene-based material, epoxy-based material, or elastomer, with a thickness of between 2 and 50 microns, and preferably between 8 and 30 microns, on the metal layers 680 and 660 and on the patterned polymer layer 620, and then curing the spin-coated polymer layer at the temperature of 300 and 450 degrees centigrade if the spin-coated polymer layer is polyimide. Alternatively, the polymer layer 690 can be formed by repeating said spin coating process and said curing process many times to form the polymer layer 690 with an extremely great thickness.

Alternatively, the polymer layer 690 can be formed by screen printing a polymer layer of polyimide, benzocyclobutene (BCB), parylene-based material or epoxy-based material, with a thickness of between 5 and 50 microns on the metal layers 680 and 660 and on the patterned polymer layer 620, and then curing the screen-printed polymer layer at the temperature of 300 and 450 degrees centigrade if the screen-printed polymer layer is polyimide. Alternatively, the polymer layer 690 can be formed by laminating a dry film of polyimide, benzocyclobutene (BCB), parylene-based material or epoxy, with a thickness of between 10 and 500 microns on the metal layers 680 and 660 and on the patterned polymer layer 620.

Figure 42:
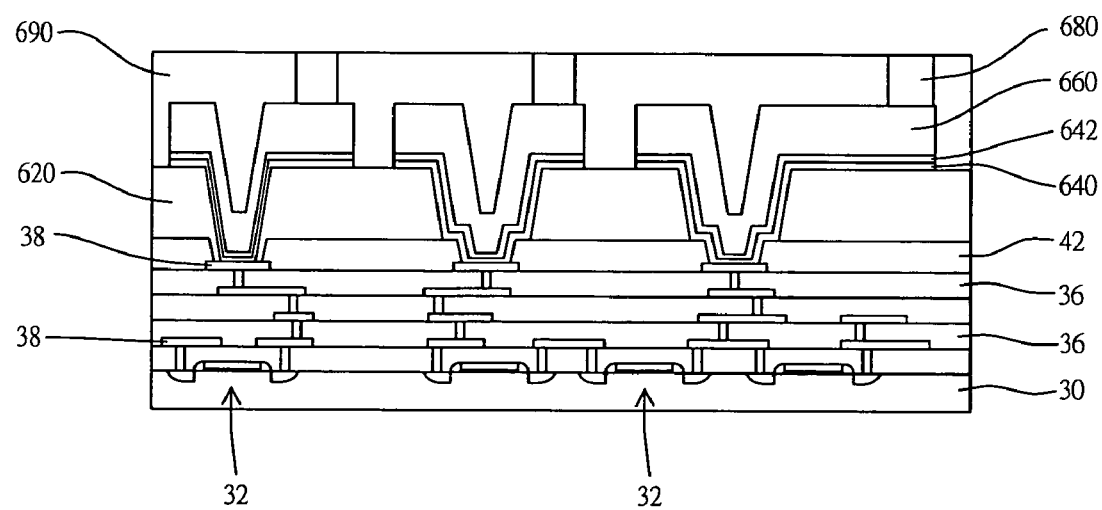

Next, referring to FIG. 42, the top side of the polymer layer 690 is ground using a mechanical grinding process or using a chemical mechanical polishing (CMP) process until the top surface of the metal layer 680 is exposed to the outside.

Figure 43:
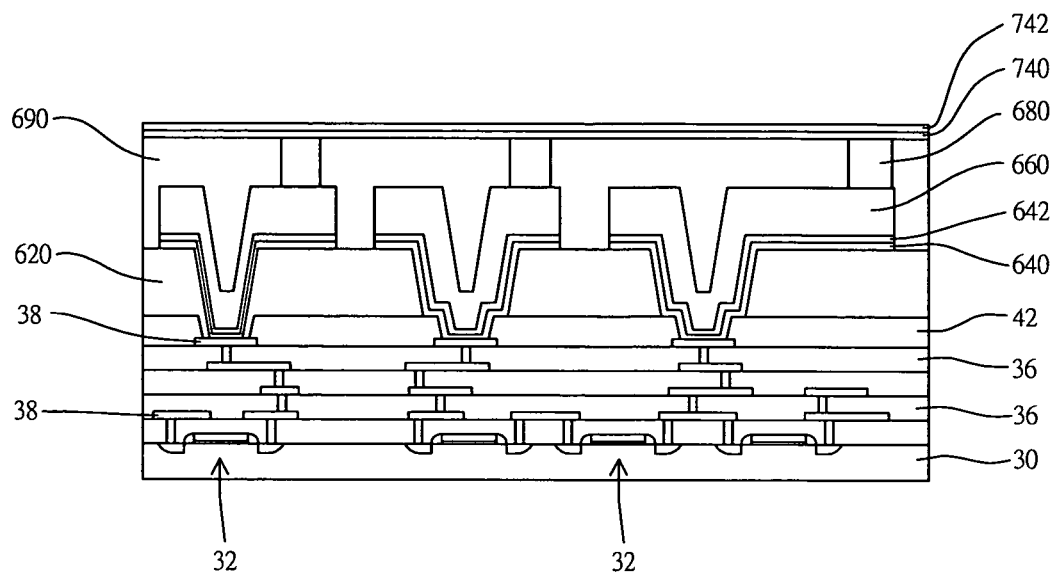

Next, referring to FIG. 43, an adhesion/barrier layer 740 may be formed by sputtering or evaporating a metal layer of titanium, tungsten, cobalt, nickel, titanium nitride, a titanium-tungsten alloy, chromium, a chromium-copper alloy, tantalum, or tantalum nitride, with a thickness of between 1000 and 6000 angstroms, on the polymer layer 690 and on the metal layer 680. Next, a seed layer 742 may be formed by sputtering, evaporating or electroless plating a metal layer of gold, copper, nickel, silver, palladium, platinum, rhodium, ruthenium, or rhenium, with a thickness of between 500 and 3000 angstroms on the adhesion/barrier layer 740.

Figure 44:
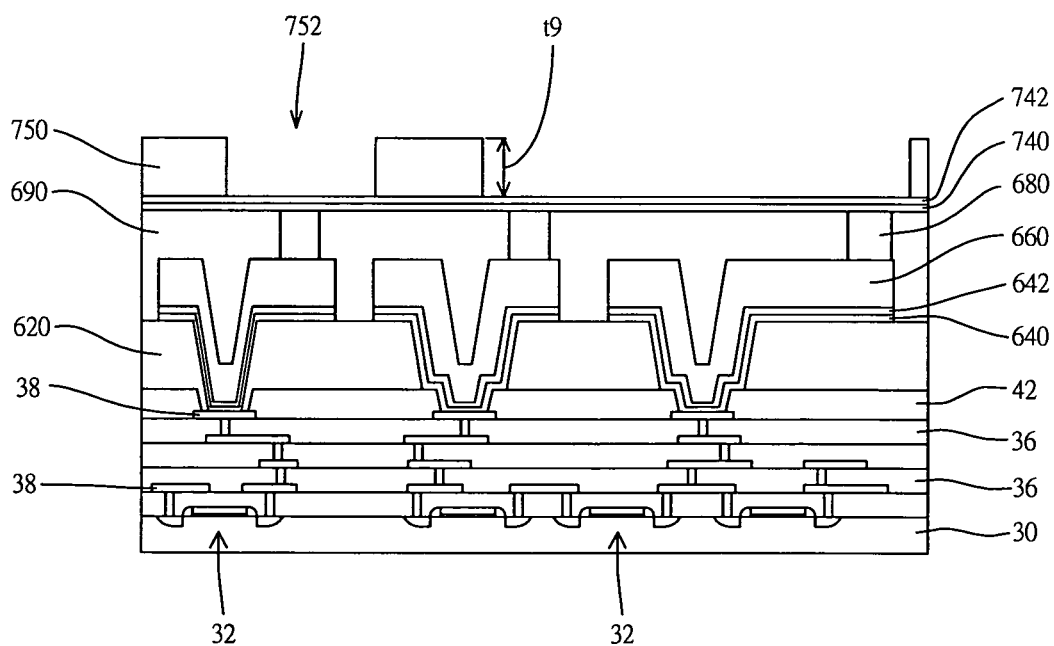

Next, referring to FIG. 44, a photoresist layer 750, such as photosensitive polyimide, photosensitive benzo-cyclo-butene (BCB), photosensitive parylene-based material, photosensitive epoxy-based material, with a thickness t9 of between 4 and 30 microns, is formed on the seed layer 742 using a spin coating process. Next, a photolithography process including exposing and developing steps is used to pattern the photoresist layer 750 and to form an opening 752, with trace patterns from a top view, in the photoresist layer 750 exposing the seed layer 742.

Figure 45:
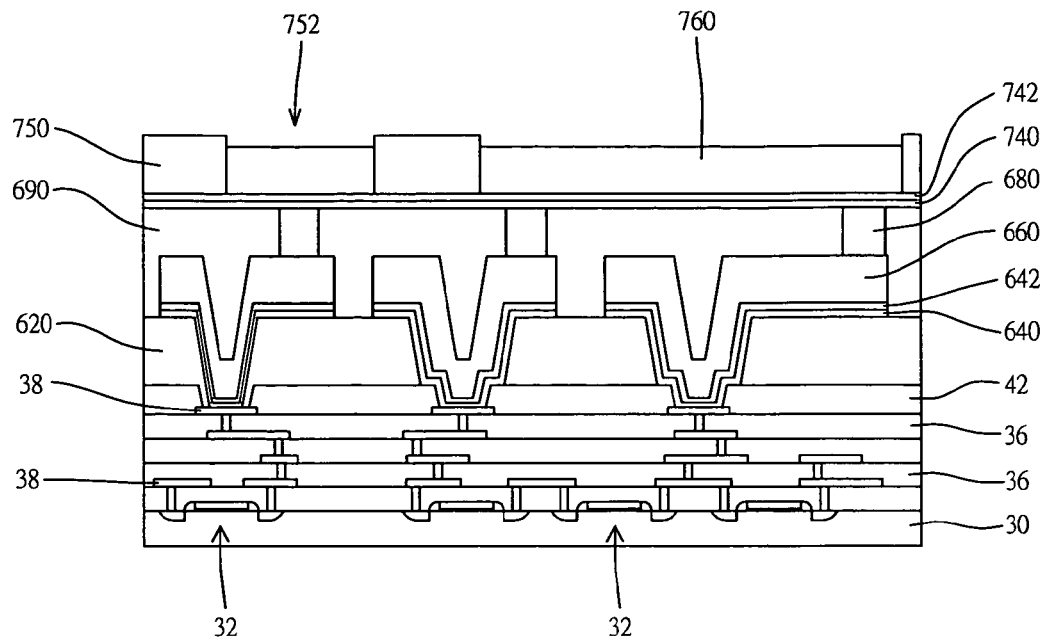

Next, referring to FIG. 45, a metal layer 760, with trace patterns from a top view, is electroplated on seed layer 742 exposed by the openings 752 in the photoresist layer 750. The metal layer 760 can be deposited by electroplating a single layer of gold with a thickness of between 1 and 20 microns, and preferably between 3 and 10 microns, on the seed layer 742 preferably of gold exposed by the openings 752 in the photoresist layer 750. Alternatively, the metal layer 760 can be deposited by electroplating a single layer of copper with a thickness of between 1 and 20 microns, and preferably 3 and 10 microns, on the seed layer 742 preferably of copper exposed by the openings 752 in the photoresist layer 750. Alternatively, the metal layer 760 can be deposited by electroplating a single layer of silver with a thickness of between 1 and 20 microns, and preferably 3 and 10 microns, on the seed layer 742 preferably of silver exposed by the openings 752 in the photoresist layer 750. Alternatively, the metal layer 760 can be deposited by electroplating a single layer of nickel with a thickness of between 1 and 20 microns, and preferably 3 and 10 microns, on the seed layer 742 preferably of nickel exposed by the openings 752 in the photoresist layer 750. Alternatively, the metal layer 760 can be deposited by electroplating a single layer of palladium with a thickness of between 1 and 20 microns, and preferably 3 and 10 microns, on the seed layer 742 preferably of palladium exposed by the openings 752 in the photoresist layer 750. Alternatively, the metal layer 760 can be deposited by electroplating a single layer of platinum with a thickness of between 1 and 20 microns, and preferably 3 and 10 microns, on the seed layer 742 preferably of platinum exposed by the openings 752 in the photoresist layer 750. Alternatively, the metal layer 760 can be deposited by electroplating a single layer of rhodium with a thickness of between 1 and 20 microns, and preferably 3 and 10 microns, on the seed layer 742 preferably of rhodium exposed by the openings 752 in the photoresist layer 750. Alternatively, the metal layer 760 can be deposited by electroplating a single layer of ruthenium with a thickness of between 1 and 20 microns, and preferably 3 and 10 microns, on the seed layer 742 preferably of ruthenium exposed by the openings 752 in the photoresist layer 750. Alternatively, the metal layer 760 can be deposited by electroplating a single layer of rhenium with a thickness of between 1 and 20 microns, and preferably 3 and 10 microns, on the seed layer 742 preferably of rhenium exposed by the openings 752 in the photoresist layer 750. Alternatively, the metal layer 760 can be deposited by electroplating a copper layer with a thickness of between 1 and 20 microns, and preferably 3 and 10 microns, on the seed layer 742 preferably of copper exposed by the openings 752 in the photoresist layer 750, and then electroplating a nickel layer with a thickness of between 1 and 5 microns on the copper layer in the openings 752 in the photoresist layer 750. Alternatively, the metal layer 760 can be deposited by electroplating a copper layer with a thickness of between 1 and 20 microns, and preferably 3 and 10 microns, on the seed layer 742 preferably of copper exposed by the openings 752 in the photoresist layer 750, then electroplating a nickel layer with a thickness of between 1 and 5 microns on the copper layer in the openings 752 in the photoresist layer 750, and then electroplating a gold layer with a thickness of between 1 and 5 microns on the nickel layer in the openings 752 in the photoresist layer 750.

Figure 46:
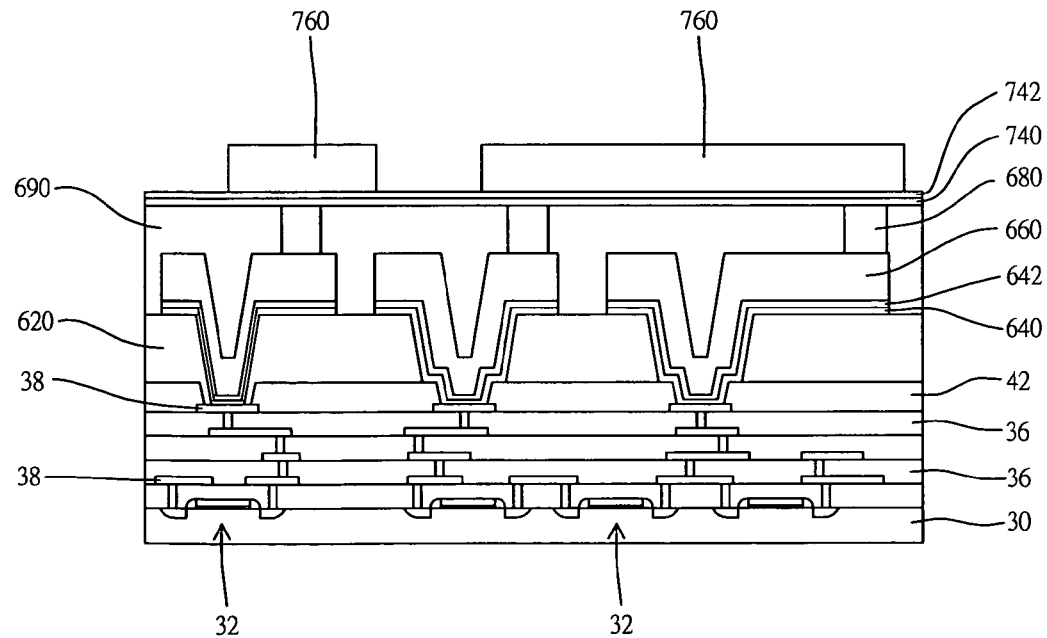

Next, referring to FIG. 46, the photoresist layer 750 is stripped.

Figure 47:
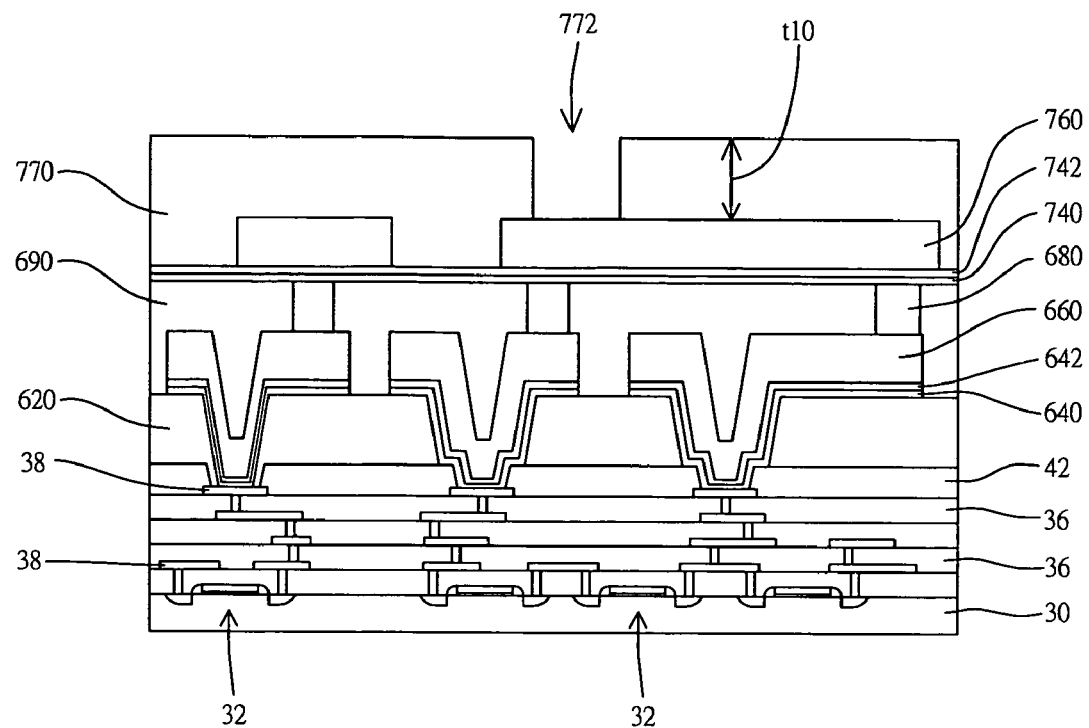

Next, referring to FIG. 47, a photoresist layer 770, such as photosensitive polyimide, photosensitive benzo-cyclo-butene (BCB), photosensitive parylene-based material, photosensitive epoxy-based material, with a thickness t10 of between 4 and 30 microns, is formed on the electroplated metal layer 760 and on the seed layer 742 using a spin coating process. Next, a photolithography process including exposing and developing steps is used to pattern the photoresist layer 770 and to form an opening 772 in the photoresist layer 770 exposing the electroplated metal layer 760.

Figure 48:
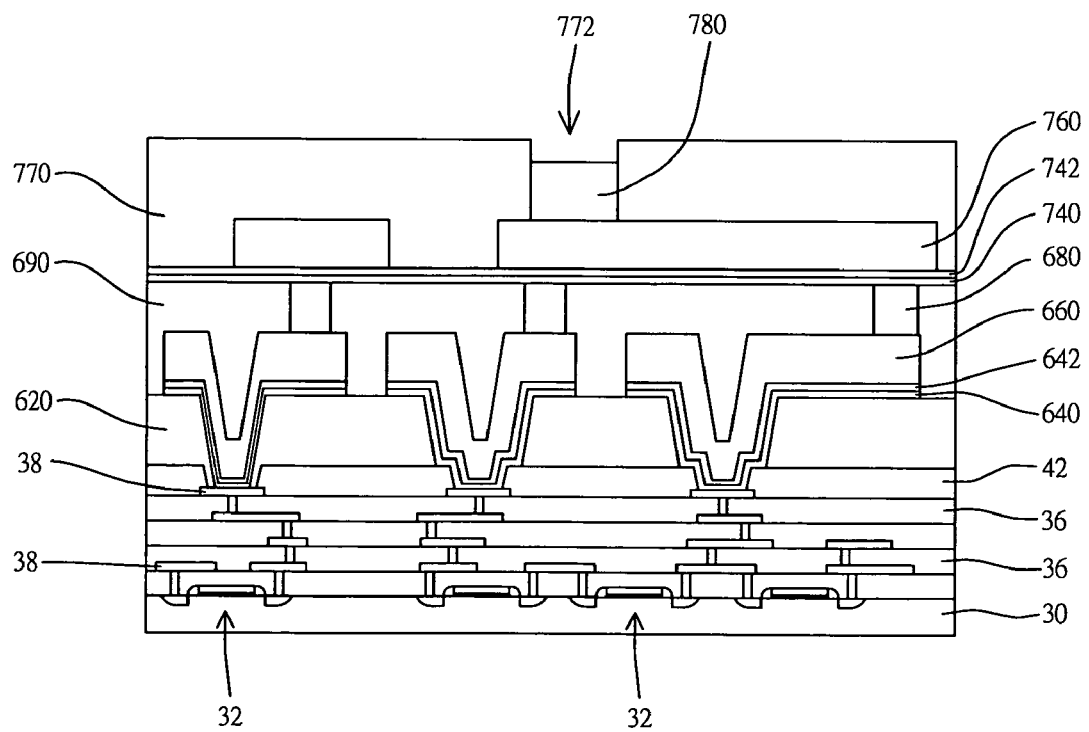

Next, referring to FIG. 48, a metal layer 780 formed for a metal pad used to be wirebonded thereto is electroplated on the metal layer 760 exposed by the opening 772 in the photoresist layer 770. The metal layer 780 can be deposited by electroplating a single layer of gold with a thickness of between 2 and 30 microns on the metal layer 760, whose topmost layer is preferably gold, exposed by the opening 772 in the photoresist layer 770. Alternatively, the metal layer 780 can be deposited by electroplating a single layer of gold with a thickness of between 1 and 30 microns on the metal layer 760, whose topmost layer is preferably nickel, exposed by the opening 772 in the photoresist layer 770. Alternatively, the metal layer 780 can be deposited by electroplating a single layer of silver with a thickness of between 2 and 30 microns on the metal layer 760, whose topmost layer is preferably silver, exposed by the opening 772 in the photoresist layer 770. Alternatively, the metal layer 780 can be deposited by electroplating a single layer of palladium with a thickness of between 2 and 30 microns on the metal layer 760, whose topmost layer is preferably palladium, exposed by the opening 772 in the photoresist layer 770. Alternatively, the metal layer 780 can be deposited by electroplating a single layer of platinum with a thickness of between 2 and 30 microns on the metal layer 760, whose topmost layer is preferably platinum, exposed by the opening 772 in the photoresist layer 770. Alternatively, the metal layer 780 can be deposited by electroplating a single layer of rhodium with a thickness of between 2 and 30 microns on the metal layer 760, whose topmost layer is preferably rhodium, exposed by the opening 772 in the photoresist layer 770. Alternatively, the metal layer 780 can be deposited by electroplating a single layer of ruthenium with a thickness of between 2 and 30 microns on the metal layer 760, whose topmost layer is preferably ruthenium, exposed by the opening 772 in the photoresist layer 770. Alternatively, the metal layer 780 can be deposited by electroplating a single layer of rhenium with a thickness of between 2 and 30 microns on the metal layer 760, whose topmost layer is preferably rhenium, exposed by the opening 772 in the photoresist layer 770. Alternatively, the metal layer 780 can be deposited by electroplating a single layer of copper with a thickness of between 2 and 30 microns on the metal layer 760, whose topmost layer is preferably copper, exposed by the opening 772 in the photoresist layer 770. Alternatively, the metal layer 780 can be deposited by electroplating a nickel layer with a thickness of between 1 and 10 microns on the metal layer 760, whose topmost layer is preferably nickel, exposed by the opening 772 in the photoresist layer 770, and then electroplating a gold layer with a thickness of between 1 and 20 microns on the nickel layer.

Figure 49:
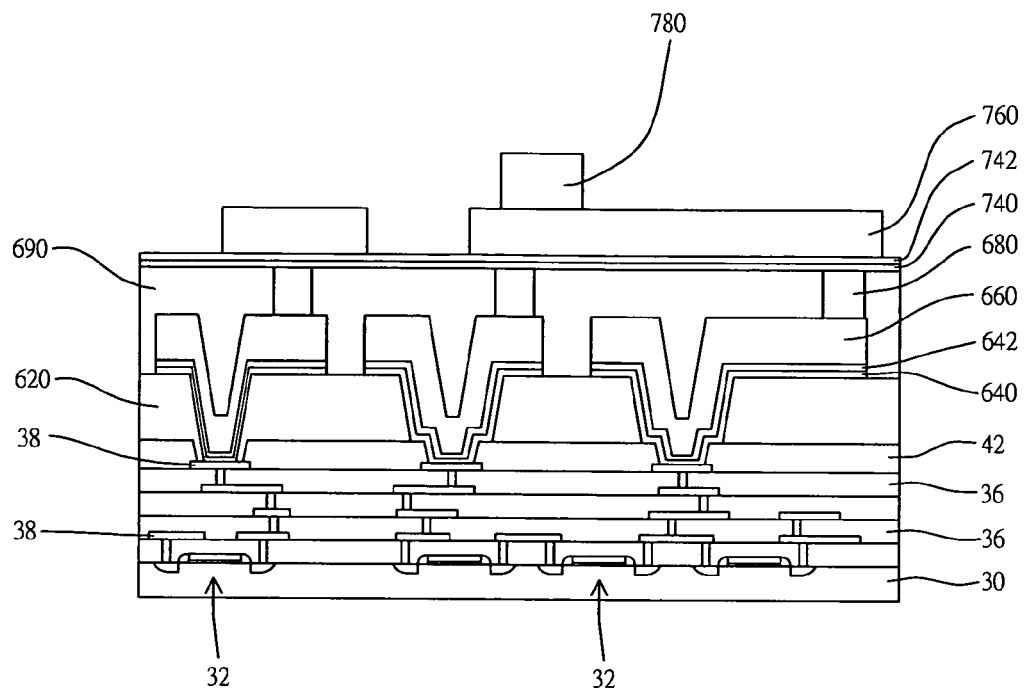

Next, referring to FIG. 49, the photoresist layer 770 is stripped.

Figure 50:
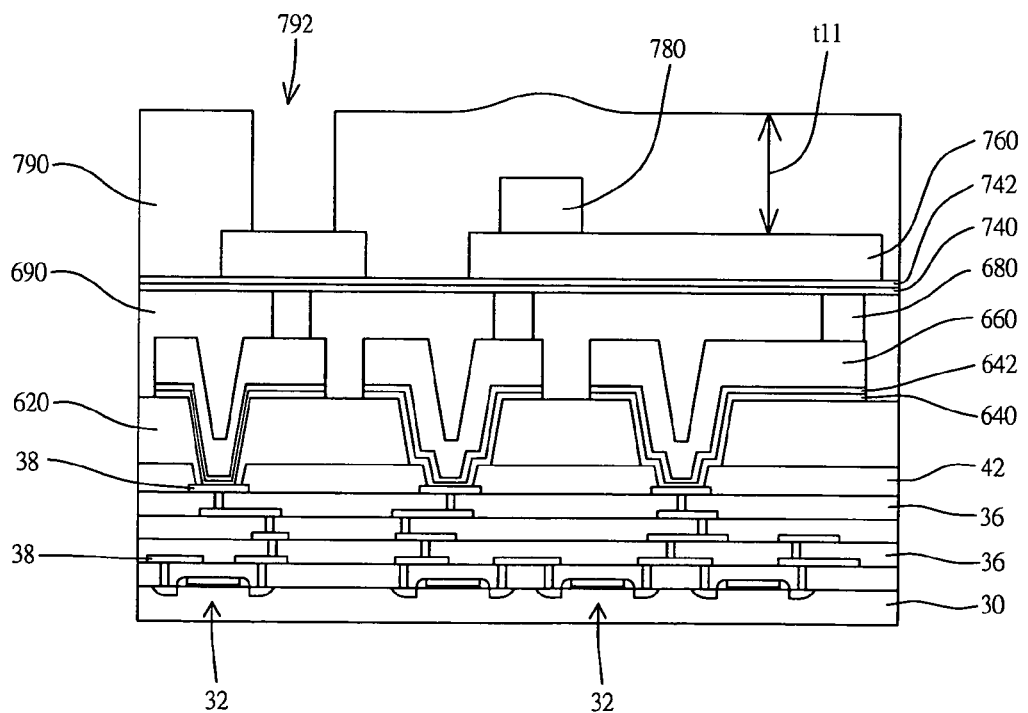

Next, referring to FIG. 50, a photoresist layer 790, such as photosensitive polyimide, photosensitive benzo-cyclo-butene (BCB), photosensitive parylene-based material, photosensitive epoxy-based material, with a thickness t11 of between 4 and 30 microns, is formed on the electroplated metal layers 760 and 780 and on the seed layer 742 using a spin coating process. Next, a photolithography process including exposing and developing steps is used to pattern the photoresist layer 790 and to form an opening 792 in the photoresist layer 790 exposing the electroplated metal layer 760.

Figure 51:
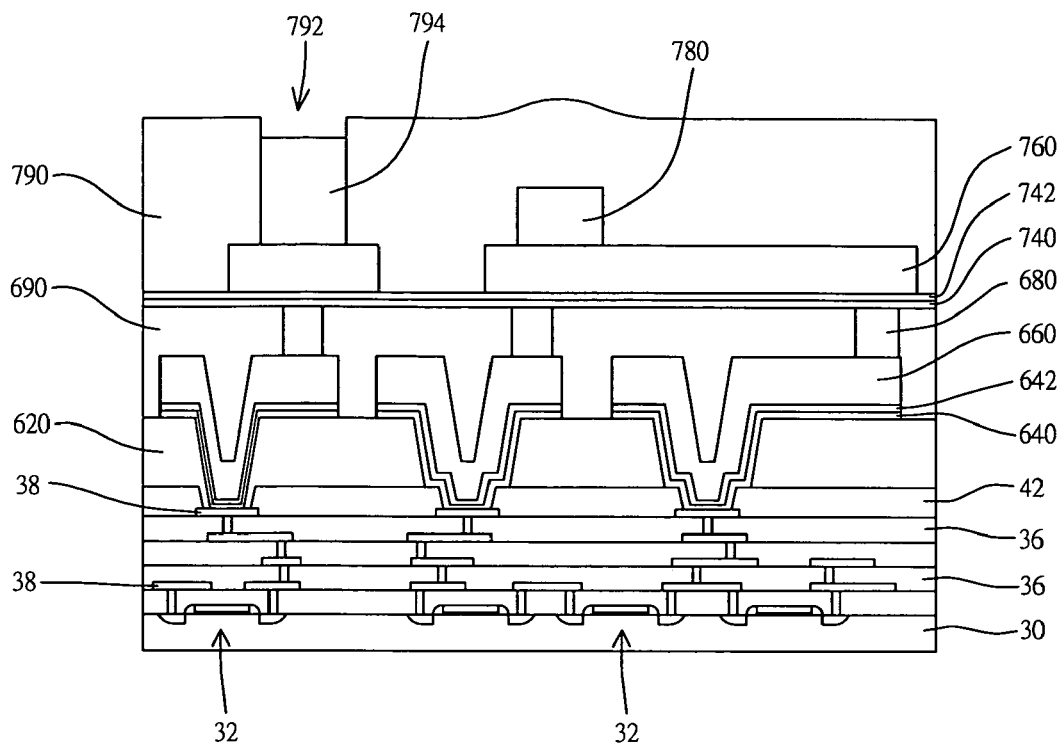

Next, referring to FIG. 51, a metal layer 794 formed for a metal bump is electroplated on the metal layer 760 exposed by the opening 792 in the photoresist layer 790. The metal layer 794 can be deposited by electroplating a single layer of gold with a thickness of between 2 and 30 microns on the metal layer 760, whose topmost layer is preferably gold, exposed by the opening 792 in the photoresist layer 790. Alternatively, the metal layer 794 can be deposited by electroplating a single layer of gold with a thickness of between 1 and 30 microns on the metal layer 360, whose topmost layer is preferably nickel, exposed by the opening 792 in the photoresist layer 790. Alternatively, the metal layer 794 can be deposited by electroplating a single layer of silver with a thickness of between 2 and 30 microns on the metal layer 760, whose topmost layer is preferably silver, exposed by the opening 792 in the photoresist layer 790. Alternatively, the metal layer 794 can be deposited by electroplating a single layer of palladium with a thickness of between 2 and 30 microns on the metal layer 760, whose topmost layer is preferably palladium, exposed by the opening 792 in the photoresist layer 790. Alternatively, the metal layer 794 can be deposited by electroplating a single layer of platinum with a thickness of between 2 and 30 microns on the metal layer 760, whose topmost layer is preferably platinum, exposed by the opening 792 in the photoresist layer 790. Alternatively, the metal layer 794 can be deposited by electroplating a single layer of rhodium with a thickness of between 2 and 30 microns on the metal layer 760, whose topmost layer is preferably rhodium, exposed by the opening 792 in the photoresist layer 790. Alternatively, the metal layer 794 can be deposited by electroplating a single layer of ruthenium with a thickness of between 2 and 30 microns on the metal layer 760, whose topmost layer is preferably ruthenium, exposed by the opening 792 in the photoresist layer 790. Alternatively, the metal layer 794 can be deposited by electroplating a single layer of rhenium with a thickness of between 2 and 30 microns on the metal layer 760, whose topmost layer is preferably rhenium, exposed by the opening 792 in the photoresist layer 790. Alternatively, the metal layer 794 can be deposited by electroplating a single layer of copper with a thickness of between 2 and 30 microns on the metal layer 760, whose topmost layer is preferably copper, exposed by the opening 792 in the photoresist layer 790. Alternatively, the metal layer 794 can be deposited by electroplating a nickel layer with a thickness of between 1 and 10 microns on the metal layer 760, whose topmost layer is preferably nickel, exposed by the opening 792 in the photoresist layer 790, and then electroplating a solder layer, such a tin-lead alloy or a tin-silver alloy, with a thickness of between 10 and 150 microns on the nickel layer in the opening 792 in the photoresist layer 790. Alternatively, the metal layer 794 can be deposited by electroplating a nickel layer with a thickness of between 1 and 10 microns on the metal layer 760, whose topmost layer is preferably nickel, exposed by the opening 792 in the photoresist layer 790, and then electroplating a gold layer with a thickness of between 1 and 20 microns on the nickel layer in the opening 792 in the photoresist layer 790.

Figure 52:
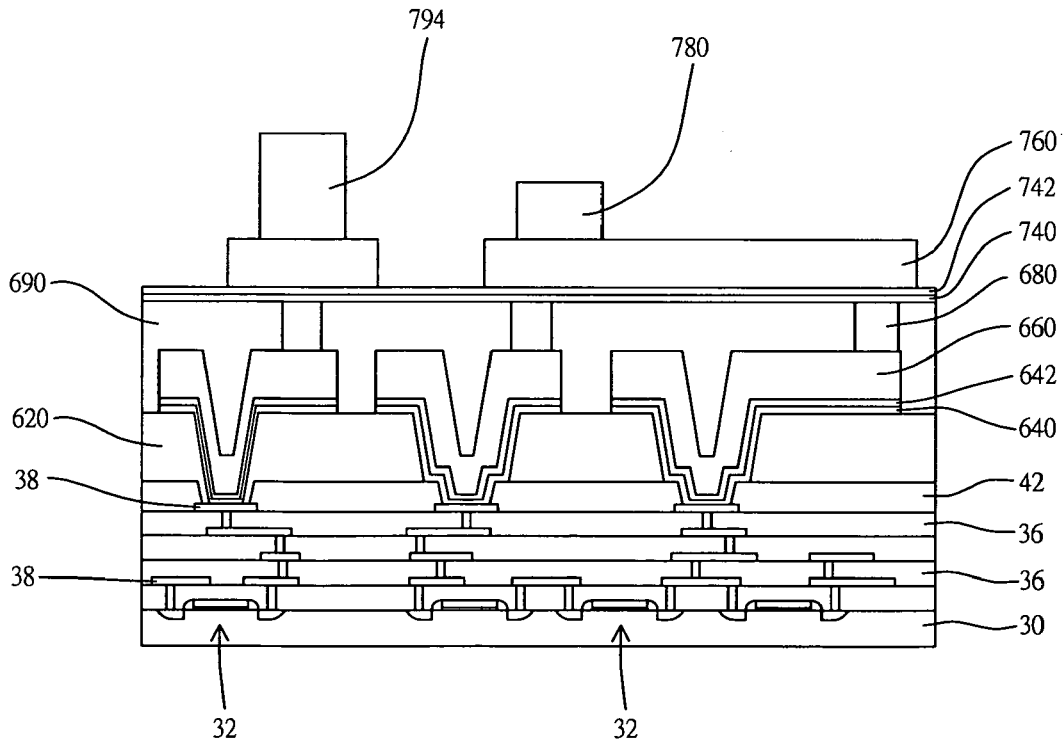
Figure 53:
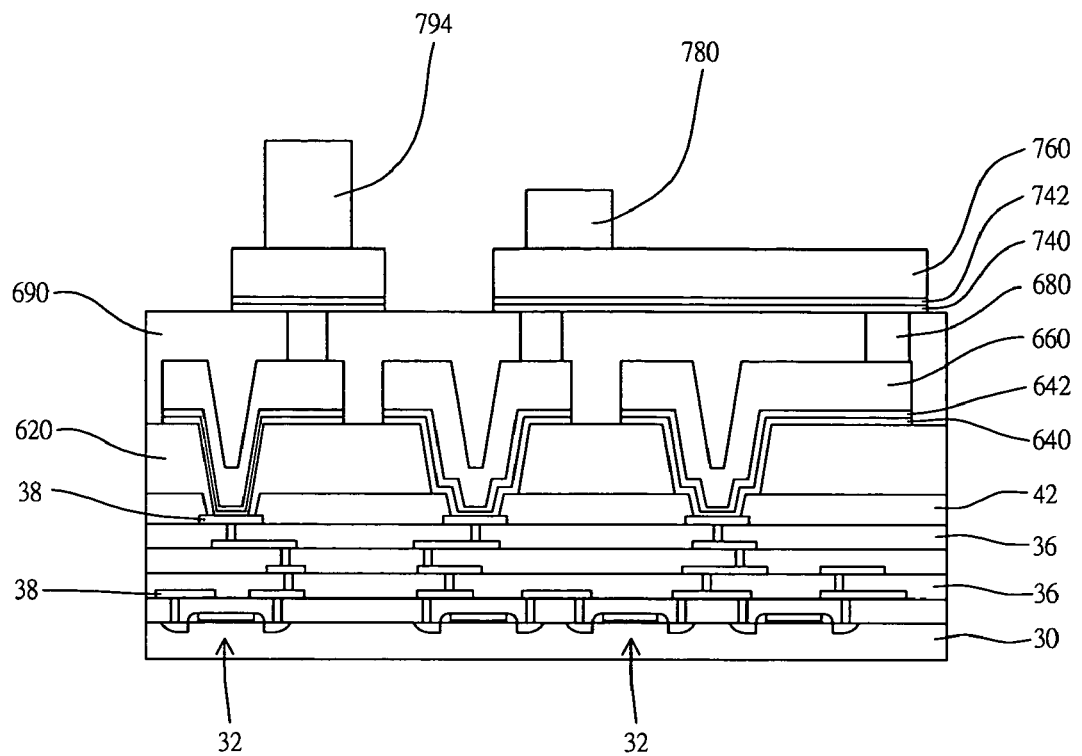

Next, referring to FIG. 52, the photoresist layer 790 is stripped. Next, referring to FIG. 53, the seed layer 742 not under the metal layer 760 is removed using a dry etching process or a wet etching process. If the seed layer 742 is gold and removed by a wet etching process, the etchant for etching the seed layer 742 is potassium iodide. Thereafter, the adhesion/barrier layer 740 not under the metal layer 760 is removed using a dry etching process or a wet etching process. If the adhesion/barrier layer 740 is a titanium tungsten alloy and removed by a wet etching process, the etchant for etching the adhesion/barrier layer 740 is hydrogen peroxide or hydrofluoric acid. If the adhesion/barrier layer 740 is titanium and removed by a wet etching process, the etchant for etching the adhesion/barrier layer 740 is hydrofluoric acid.

Figure 54:
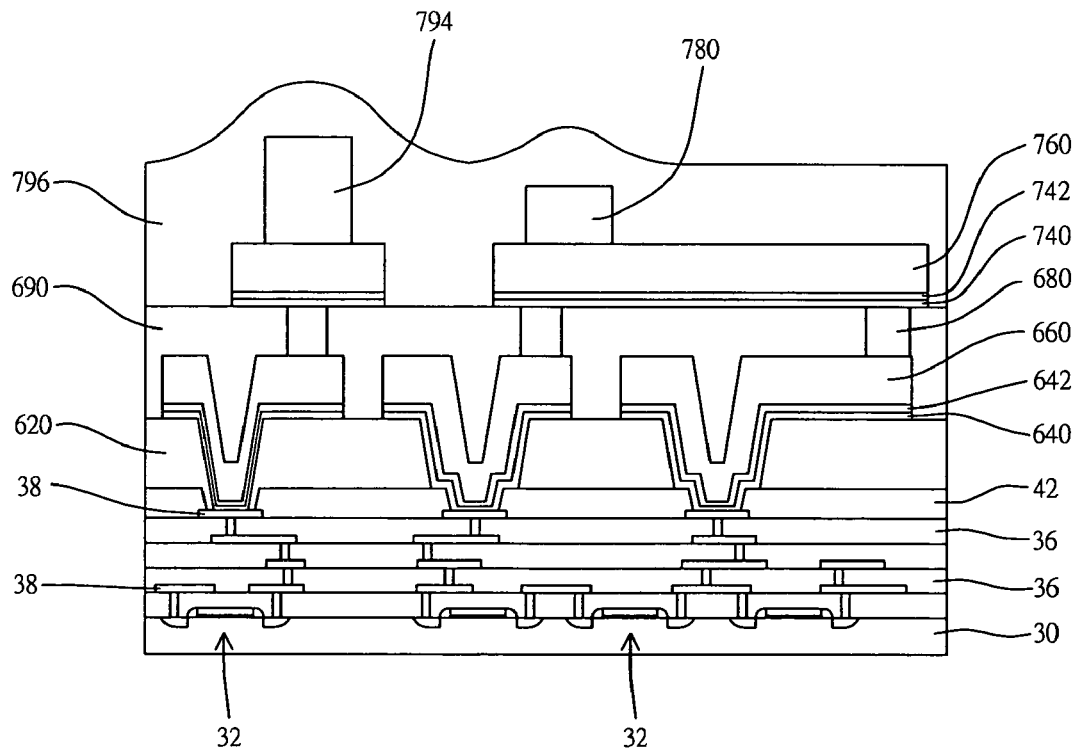
Figure 55:
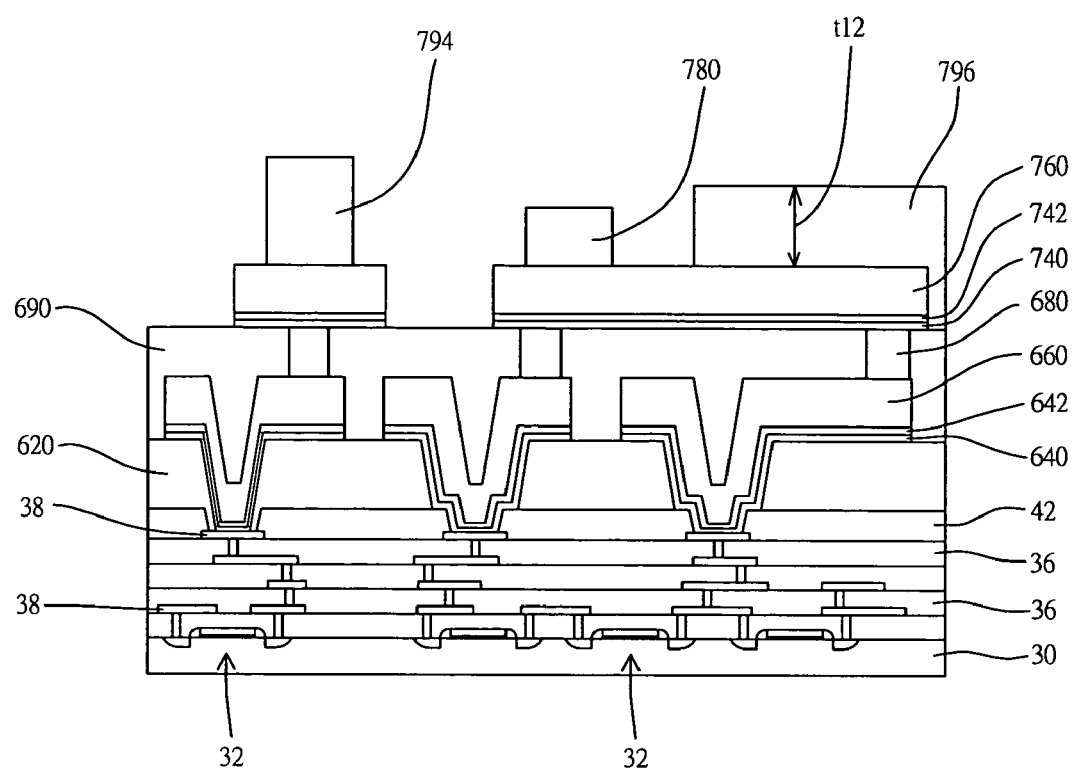

Referring to FIGS. 54-55, it is an optional process to form a patterned polymer layer 796 on the metal layers 794, 780 and 760 and on the patterned polymer layer 690. The patterned polymer layer 796 can be formed by spin coating a polymer layer of polyimide, benzo-cyclo-butene (BCB), parylene-based material, epoxy-based material, or elastomer, with a thickness of between 2 and 50 microns, and preferably between 8 and 30 microns, on the metal layers 794, 780 and 760 and on the patterned polymer layer 690.

Next, if the spin-coated polymer layer is photosensitive, a photolithography process including exposing and developing steps can be used to lead the metal layers 794 and 780 to be exposed to the outside. Next, the spin-coated polymer layer is cured at the temperature of 300 and 450 degrees centigrade if the spin-coated polymer layer is polyimide. The patterned polymer layer 796 after being cured may have a thickness t12 of between 2 and 50 microns, and preferably between 6 and 20 microns.

If the spin-coated polymer layer is non-photosensitive, photolithography and etching processes are typically needed to pattern the spin-coated polymer layer.

Alternatively, the patterned polymer layer 796 can be formed by screen printing a patterned polymer layer of polyimide, benzocyclobutene (BCB), parylene-based material or epoxy-based material, with a thickness of between 5 and 50 microns on the metal layer 760 and on the patterned polymer layer 690, and then curing the screen-printed polymer layer at the temperature of 300 and 450 degrees centigrade if the screen-printed polymer layer is polyimide. Alternatively, the patterned polymer layer 796 can be formed by laminating a patterned dry film of polyimide, benzocyclobutene (BCB), parylene-based material or epoxy, with a thickness of between 10 and 500 microns on the metal layer 760 and on the patterned polymer layer 690.

Figure 56:
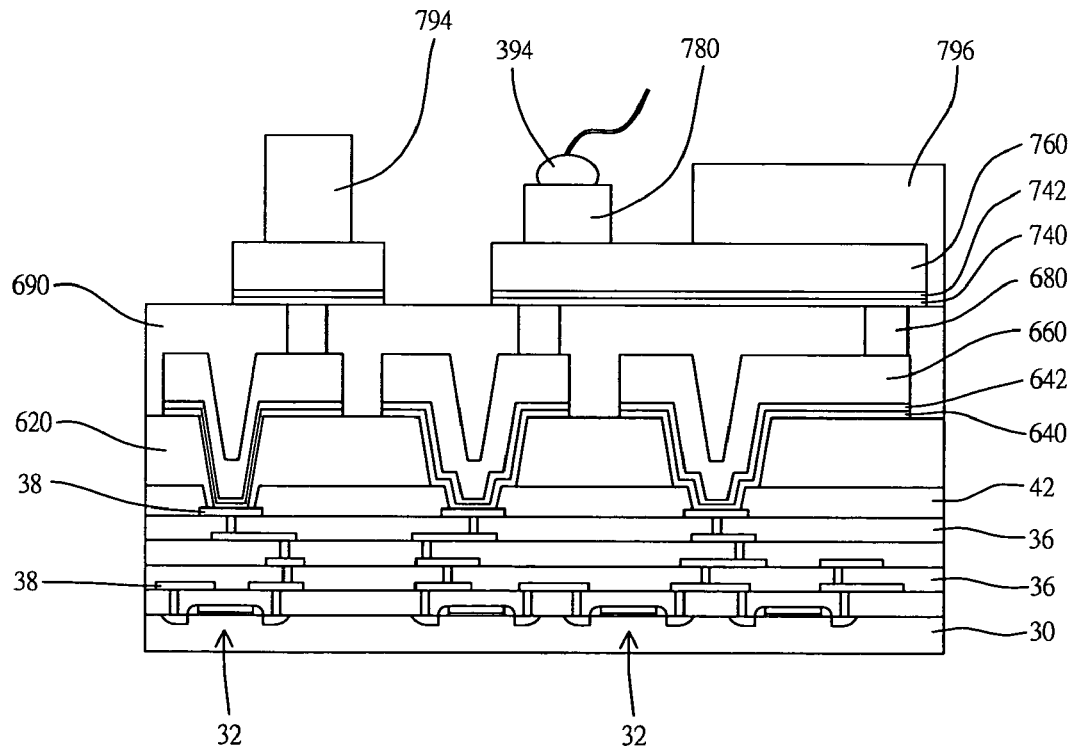

Next, referring to FIG. 56, the metal layer 780 is used as a metal pad for being wirebonded thereto. A gold wire 394 can be connected to the metal layer 780. The metal layer 794 is formed for a metal bump used to be bonded to an external circuitry (not shown), such as a ceramic substrate, a printed circuit board, semiconductor chip for chip-on-chip package, glass substrate for a chip-on-glass (COG) package, flex circuit substrate for a chip-on-film (COF) package, a tape carrier for tape-automated-bonded (TAB) package. In the application for COG, COF or TAB packages, the topmost layer of the metal layer 794 is preferably gold, which can be bonded to a metal layer, preferably of gold, formed on the above-mentioned external circuitry or to a metal layer, preferably of tin-containing material, formed on the above-mentioned external circuitry. Alternatively, an anisotropic conductive film (ACF) can be use to electrically connect the metal layer 794 to the above-mentioned external circuitry, such as glass substrate. In the application for being connected to a ceramic substrate, printed circuit board, or semiconductor chip, the topmost layer of the metal layer 794 is preferably tin-containing material, which can be bonded to a metal layer, preferably of gold, formed on the ceramic substrate, printed circuit board, or semiconductor chip, or to a metal layer, preferably of tin-containing material, formed on the ceramic substrate, printed circuit board, or semiconductor chip.

Figure 57:
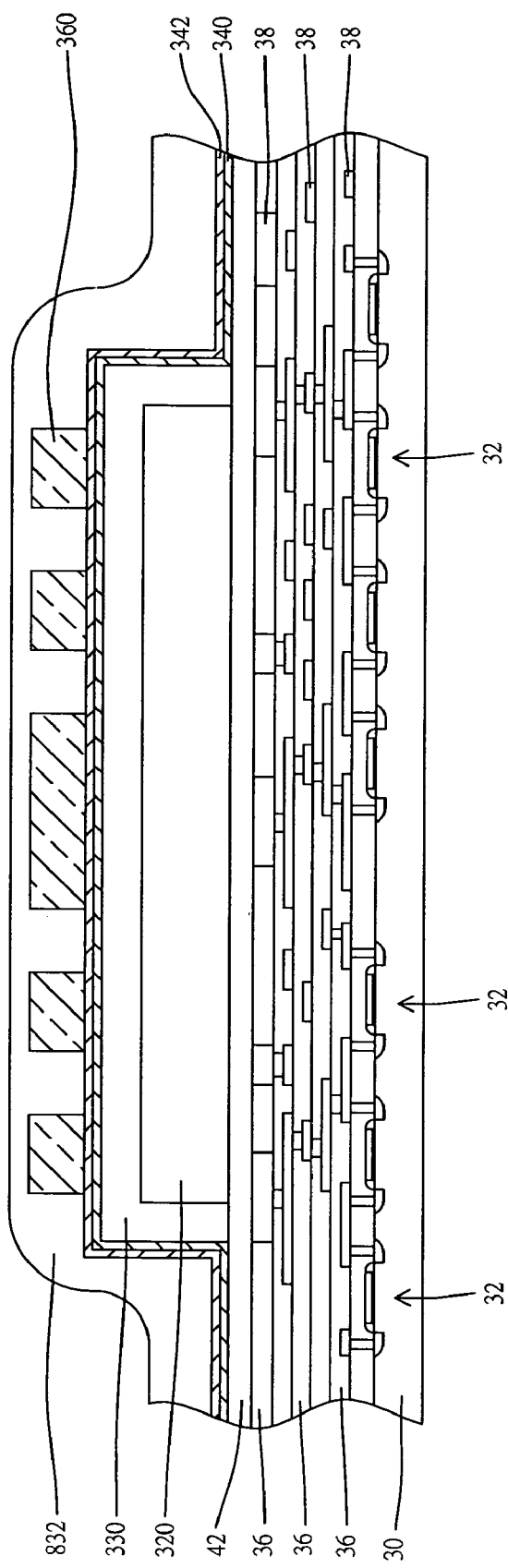
FIGS. 57-68 are cross-sectional views showing a process with a patterned polymer layer formed before a seed layer and adhesion/barrier layer is removed.

Alternatively, a polymer layer covering a metal trace, such as a coil, can be formed before removing the seed layer and the adhesion/barrier layer not under the metal trace, as shown in FIGS. 57-60. The process illustrated by FIGS. 57-60 follows the above-mentioned process of FIG. 6. The elements shown in FIGS. 57-60 having same reference numbers as those shown in FIGS. 1-14 indicate similar ones described above in FIGS. 1-14. After the above-mentioned metal layer 360 is formed, a patterned polymer layer 830 is formed on the metal layer 360 and on the seed layer 342. The patterned polymer layer 830 can be formed by spin coating a polymer layer 832 of polyimide, benzo-cyclo-butene (BCB), parylene-based material, epoxy-based material, or elastomer, with a thickness of between 2 and 50 microns, and preferably between 8 and 30 microns, on the metal layer 360 and on the seed layer 342, as shown in FIG. 57.

Figure 58:
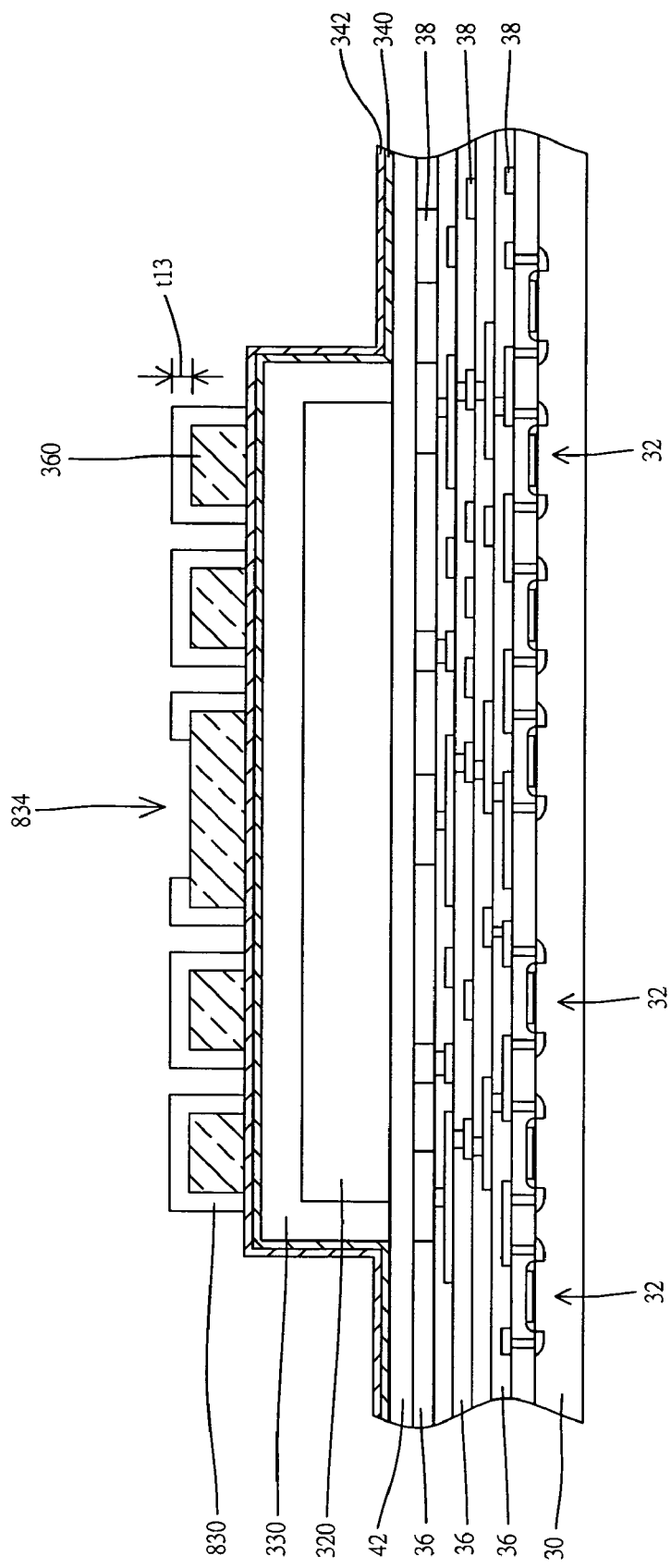

Next, if the spin-coated polymer layer 832 is photosensitive, a photolithography process including exposing and developing steps can be used to lead the spin-coated polymer layer 830 on the metal layer 360 and on the seed layer close to the metal layer 360 to be left and to form an opening 834 in the spin-coated polymer layer 830 exposing the metal layer 360, as shown in FIG. 58. Next, the spin-coated polymer layer 830 is cured at the temperature of 300 and 450 degrees centigrade if the spin-coated polymer layer 830 is polyimide. The patterned polymer layer 830 after being cured may have a thickness t13 of between 2 and 50 microns, and preferably between 6 and 20 microns.

If the spin-coated polymer layer 832 is non-photosensitive, photolithography and etching processes are typically needed to pattern the spin-coated polymer layer 832.

Alternatively, the patterned polymer layer 830 can be formed by screen printing a patterned polymer layer of polyimide, benzocyclobutene (BCB), parylene-based material or epoxy-based material, with a thickness of between 5 and 50 microns on the metal layer 360 and on the seed layer 342 close to the metal layer 360, and then curing the screen-printed polymer layer 830 at the temperature of 300 and 450 degrees centigrade if the screen-printed polymer layer 830 is polyimide. Alternatively, the patterned polymer layer 830 can be formed by laminating a patterned dry film of polyimide, benzocyclobutene (BCB), parylene-based material or epoxy, with a thickness of between 10 and 500 microns on the metal layer 360 and on the seed layer 342 close to the metal layer 360.

Figure 59:
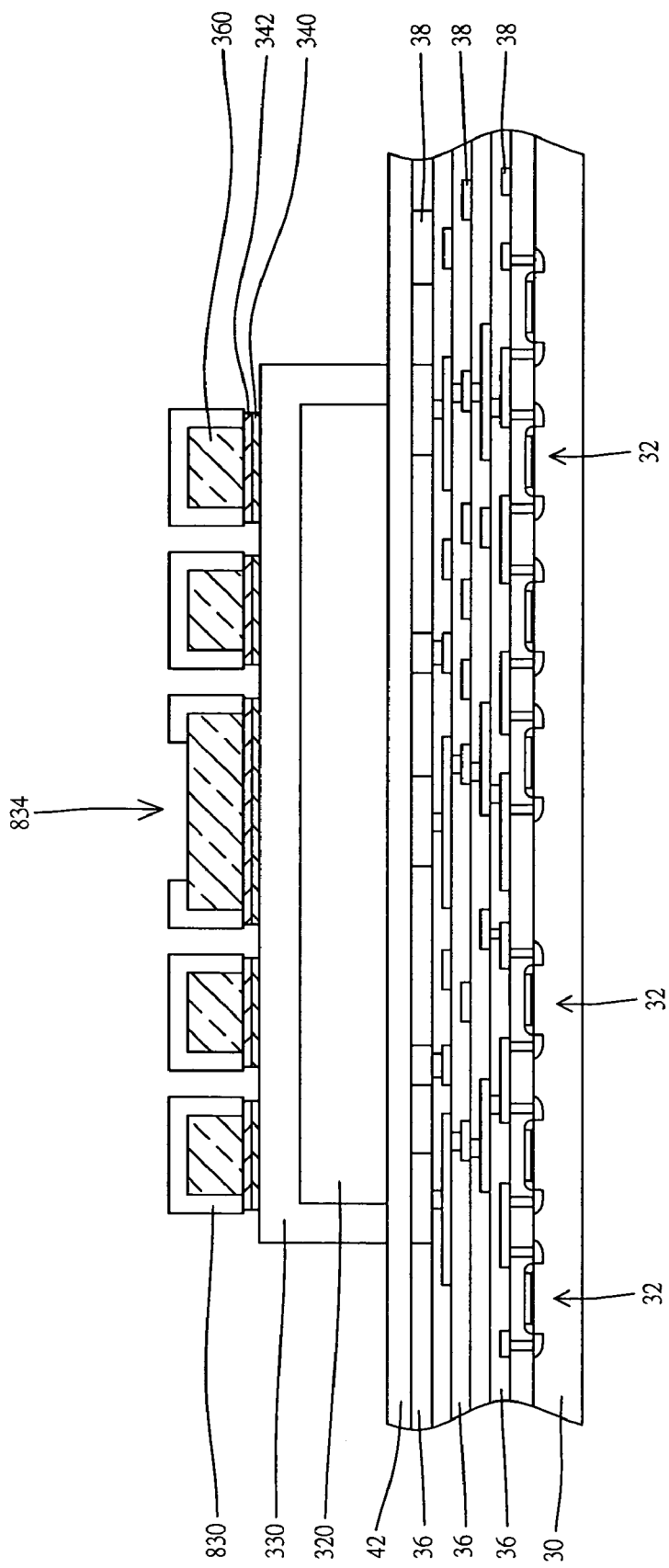

Next, referring to FIG. 59, the seed layer 342 not under the metal layer 360 and not under the patterned polymer layer 830 is removed using a dry etching process or a wet etching process. If the seed layer 342 is gold and removed by a wet etching process, the etchant for etching the seed layer 342 is potassium iodide. Thereafter, the adhesion/barrier layer 340 not under the metal layer 360 and not under the patterned polymer layer 830 is removed using a dry etching process or a wet etching process. If the adhesion/barrier layer 340 is a titanium tungsten alloy and removed by a wet etching process, the etchant for etching the adhesion/barrier layer 340 is hydrogen peroxide or hydrofluoric acid. If the adhesion/barrier layer 340 is titanium and removed by a wet etching process, the etchant for etching the adhesion/barrier layer 340 is hydrofluoric acid.

Figure 60:
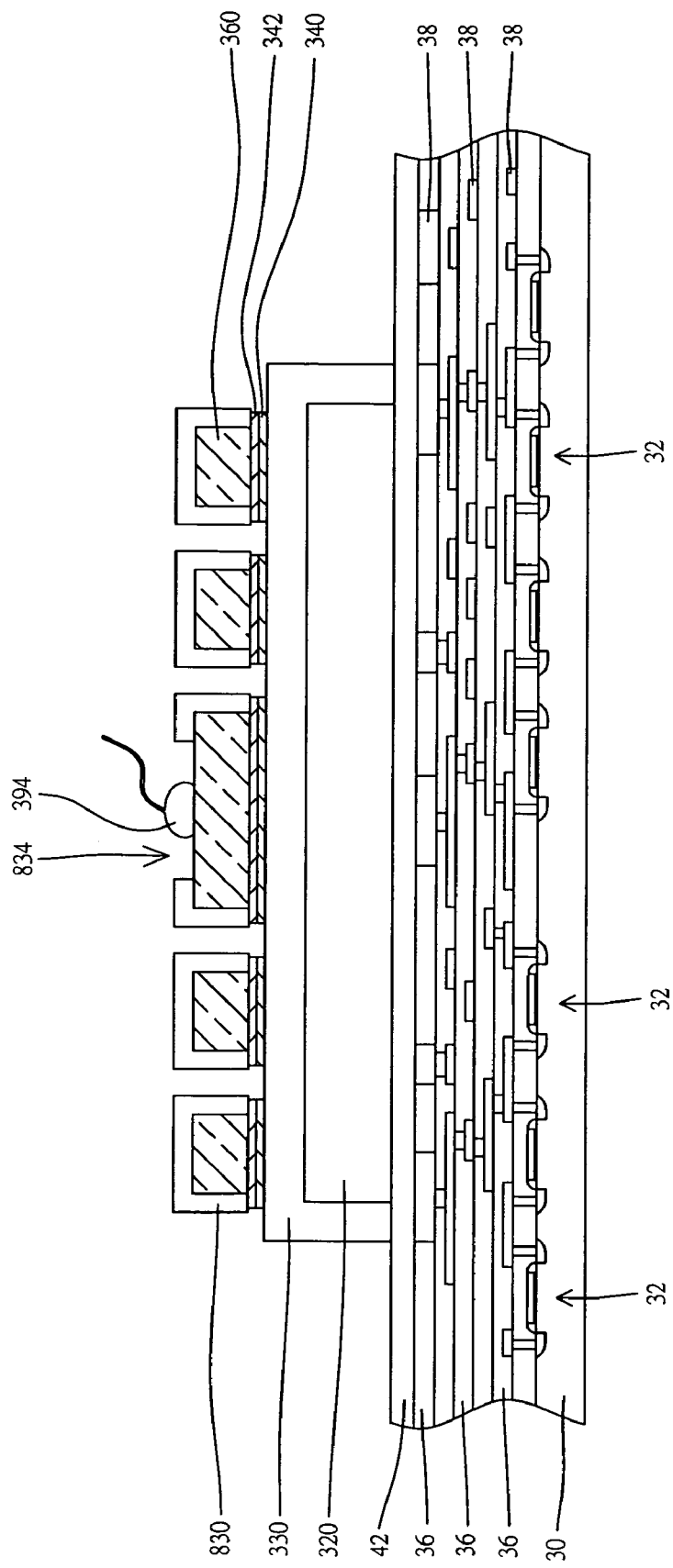
Figure 61:
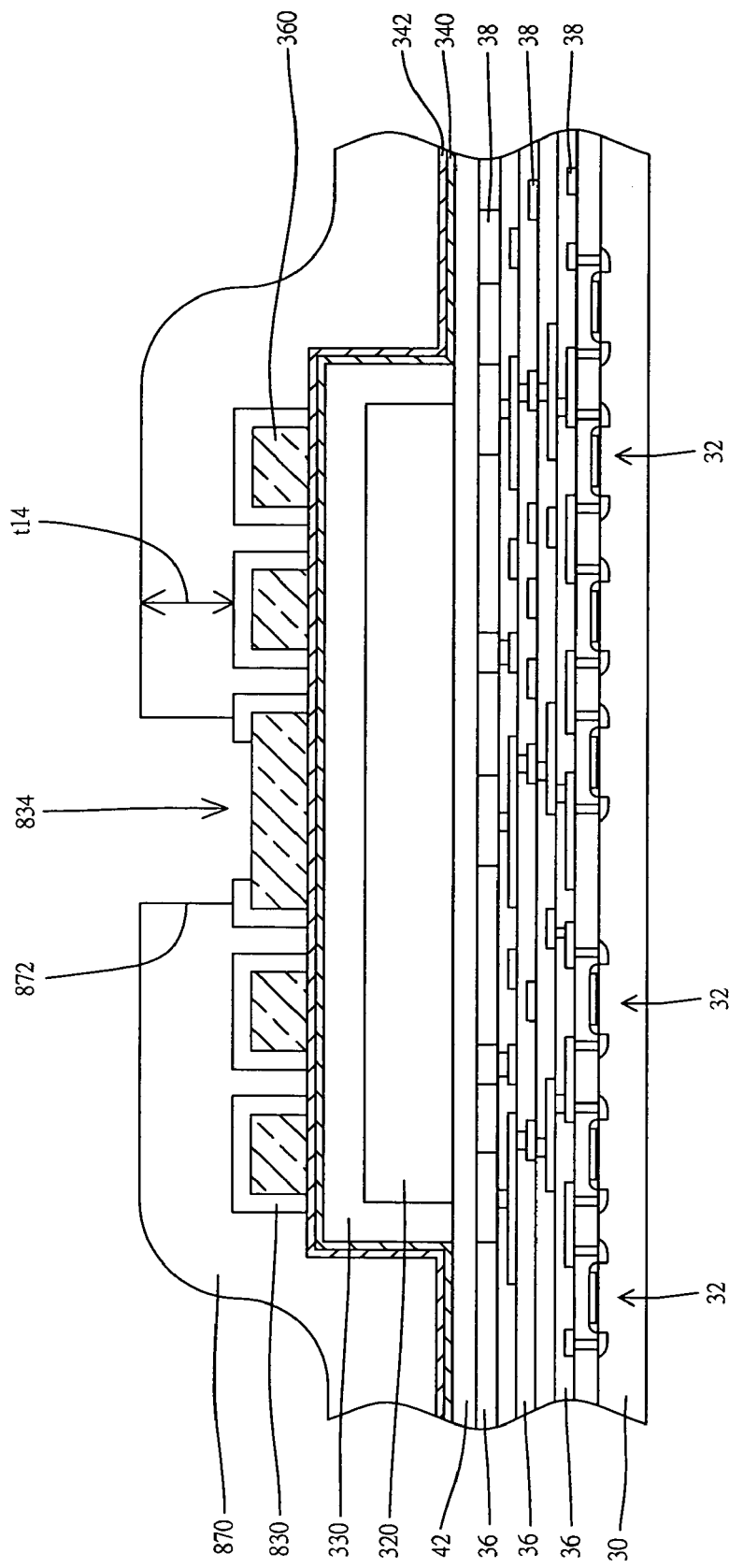

Next, referring to FIG. 60, the metal layer 360 has a metal pad exposed by the opening 834 in the patterned polymer layer 830, for being wirebonded thereto or having a gold bump or solder bump formed thereover. A gold wire 394 can be connected to the metal layer 360 exposed by the opening 834 in the polymer layer 830 using a wirebonding process. Alternatively, a gold bump or tin-containing bump, not shown, can be formed over the above-mentioned metal layer 360 exposed by the opening 834 in the polymer layer 830.

Alternatively, a metal layer, for a metal bump used to be bonded to an external circuitry or a metal pad used to be wirebonded thereto, can be electroplated over the metal layer 360 after forming the patterned polymer layer 830 and before removing the seed layer 342 and adhesion/barrier layer 340 not under the metal layer 360 and not under the patterned polymer layer 830, as shown in FIGS. 61-65. The process illustrated by FIGS. 61-65 follows the above-mentioned process of FIG. 58. The elements shown in FIGS. 61-65 having same reference numbers as those shown in FIGS. 1-14 and 57-58 indicate similar ones described above in FIGS. 1-14 and 57-58. After the patterned polymer layer 830 is formed on the metal layer 360 and on the seed layer 342 close to the metal layer 360, a photoresist layer 870, such as photosensitive polyimide, photosensitive benzo-cyclo-butene (BCB), photosensitive parylene-based material, photosensitive epoxy-based material, with a thickness t14 of between 4 and 30 microns, is formed on the seed layer 342, on the patterned polymer layer 830 and on the metal layer 360 exposed by the opening 834 in the patterned polymer layer 830 using a spin coating process, referring to FIG. 61. Next, a photolithography process including exposing and developing steps is used to pattern the photoresist layer 870 and to form an opening 872 in the photoresist layer 870 exposing the electroplated metal layer 360 exposed by the opening 834 in the patterned polymer layer 830.

Figure 62:
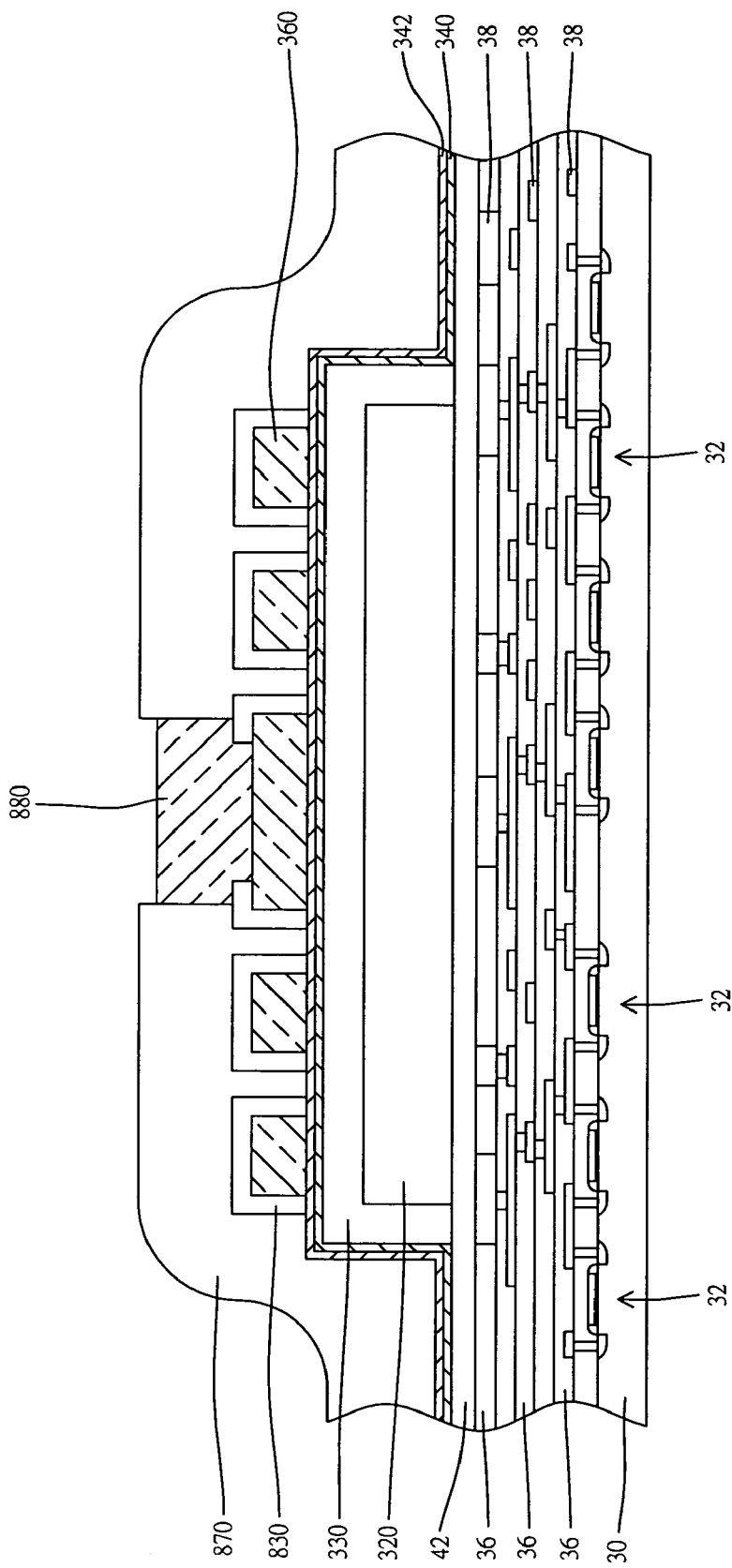

Next, referring to FIG. 62, a metal layer 880 is electroplated on the metal layer 360 exposed by the opening 872 in the photoresist layer 870 and by the opening 834 in the patterned polymer layer 830. The metal layer 880 can be deposited by electroplating a single layer of gold with a thickness of between 2 and 30 microns on the metal layer 360, whose topmost layer is preferably gold, exposed by the opening 872 in the photoresist layer 870 and by the opening 834 in the patterned polymer layer 830. Alternatively, the metal layer 880 can be deposited by electroplating a single layer of gold with a thickness of between 1 and 30 microns on the metal layer 360, whose topmost layer is preferably nickel, exposed by the opening 872 in the photoresist layer 870 and by the opening 834 in the patterned polymer layer 830. Alternatively, the metal layer 880 can be deposited by electroplating a single layer of silver with a thickness of between 2 and 30 microns on the metal layer 360, whose topmost layer is preferably silver, exposed by the opening 872 in the photoresist layer 870 and by the opening 834 in the patterned polymer layer 830. Alternatively, the metal layer 880 can be deposited by electroplating a single layer of palladium with a thickness of between 2 and 30 microns on the metal layer 360, whose topmost layer is preferably palladium, exposed by the opening 872 in the photoresist layer 870 and by the opening 834 in the patterned polymer layer 830. Alternatively, the metal layer 880 can be deposited by electroplating a single layer of platinum with a thickness of between 2 and 30 microns on the metal layer 360, whose topmost layer is preferably platinum, exposed by the opening 872 in the photoresist layer 870 and by the opening 834 in the patterned polymer layer 830. Alternatively, the metal layer 880 can be deposited by electroplating a single layer of rhodium with a thickness of between 2 and 30 microns on the metal layer 360, whose topmost layer is preferably rhodium, exposed by the opening 872 in the photoresist layer 870 and by the opening 834 in the patterned polymer layer 830. Alternatively, the metal layer 880 can be deposited by electroplating a single layer of ruthenium with a thickness of between 2 and 30 microns on the metal layer 360, whose topmost layer is preferably ruthenium, exposed by the opening 872 in the photoresist layer 870 and by the opening 834 in the patterned polymer layer 830. Alternatively, the metal layer 880 can be deposited by electroplating a single layer of rhenium with a thickness of between 2 and 30 microns on the metal layer 360, whose topmost layer is preferably rhenium, exposed by the opening 872 in the photoresist layer 870 and by the opening 834 in the patterned polymer layer 830. Alternatively, the metal layer 880 can be deposited by electroplating a single layer of copper with a thickness of between 2 and 30 microns on the metal layer 360, whose topmost layer is preferably copper, exposed by the opening 872 in the photoresist layer 870 and by the opening 834 in the patterned polymer layer 830. Alternatively, the metal layer 880 can be deposited by electroplating a nickel layer with a thickness of between 1 and 10 microns on the metal layer 360, whose topmost layer is preferably nickel, exposed by the opening 872 in the photoresist layer 870 and by the opening 834 in the patterned polymer layer 830, and then electroplating a solder layer, such a tin-lead alloy or a tin-silver alloy, with a thickness of between 10 and 150 microns on the nickel layer in the opening 872 in the photoresist layer 870 and/or in the opening 834 in the patterned polymer layer 830. Alternatively, the metal layer 880 can be deposited by electroplating a nickel layer with a thickness of between 1 and 10 microns on the metal layer 360, whose topmost layer is preferably nickel, exposed by the opening 372 in the photoresist layer 370 and by the opening 834 in the patterned polymer layer 830, and then electroplating a gold layer with a thickness of between 1 and 20 microns on the nickel layer in the opening 372 in the photoresist layer 370 and/or in the opening 834 in the patterned polymer layer 830.

Figure 63:
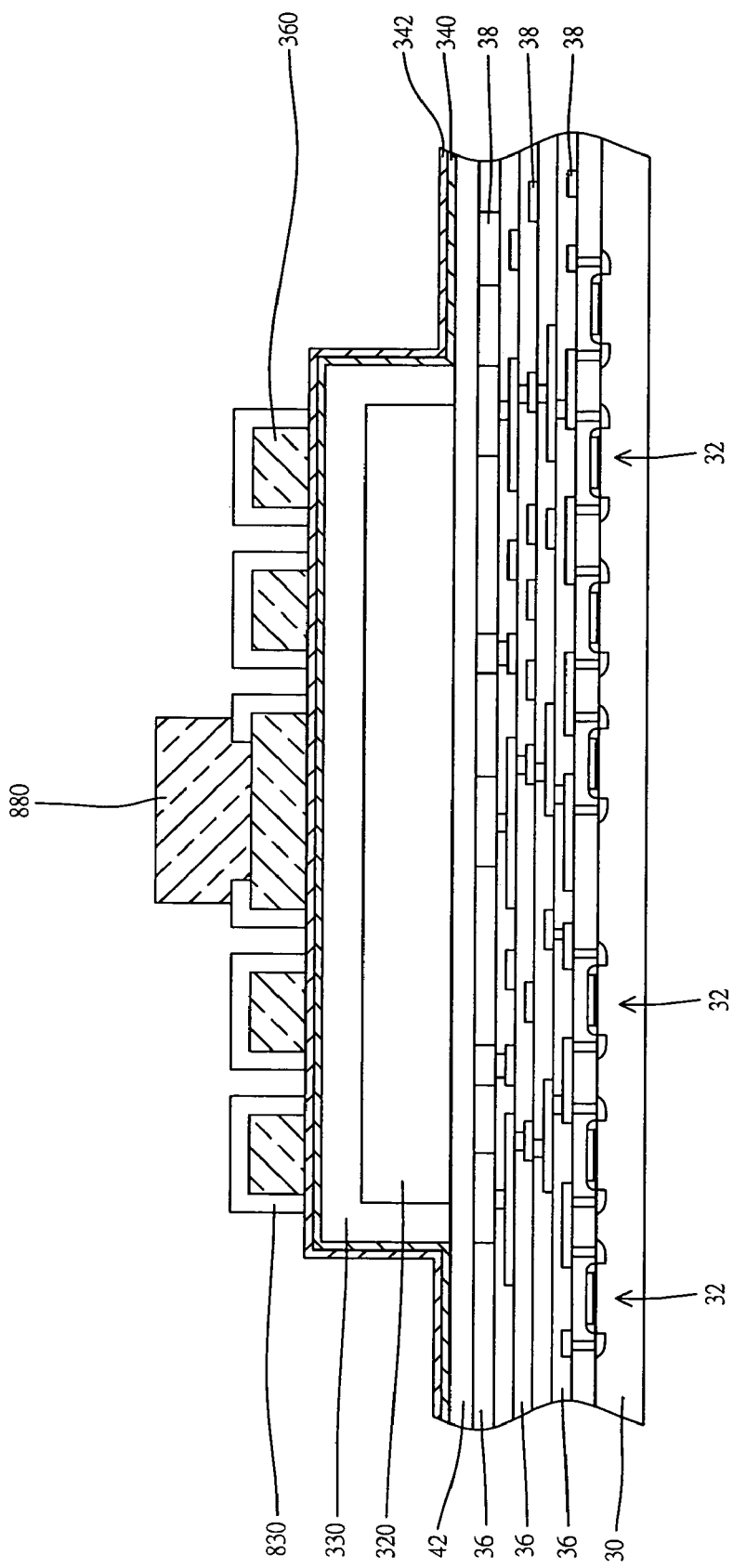

Next, referring to FIG. 63, the photoresist layer 870 is stripped. Next, referring to FIG. 64, the seed layer 342 not under the metal layer 360 and not under the patterned polymer layer 830 is removed using a dry etching process or a wet etching process. If the seed layer 342 is gold and removed by a wet etching process, the etchant for etching the seed layer 342 is potassium iodide. Thereafter, the adhesion/barrier layer 340 not under the metal layer 360 and not under the patterned polymer layer 830 is removed using a dry etching process or a wet etching process. If the adhesion/barrier layer 340 is a titanium tungsten alloy and removed by a wet etching process, the etchant for etching the adhesion/barrier layer 340 is hydrogen peroxide or hydrofluoric acid. If the adhesion/barrier layer 340 is titanium and removed by a wet etching process, the etchant for etching the adhesion/barrier layer 340 is hydrofluoric acid.

Figure 64:
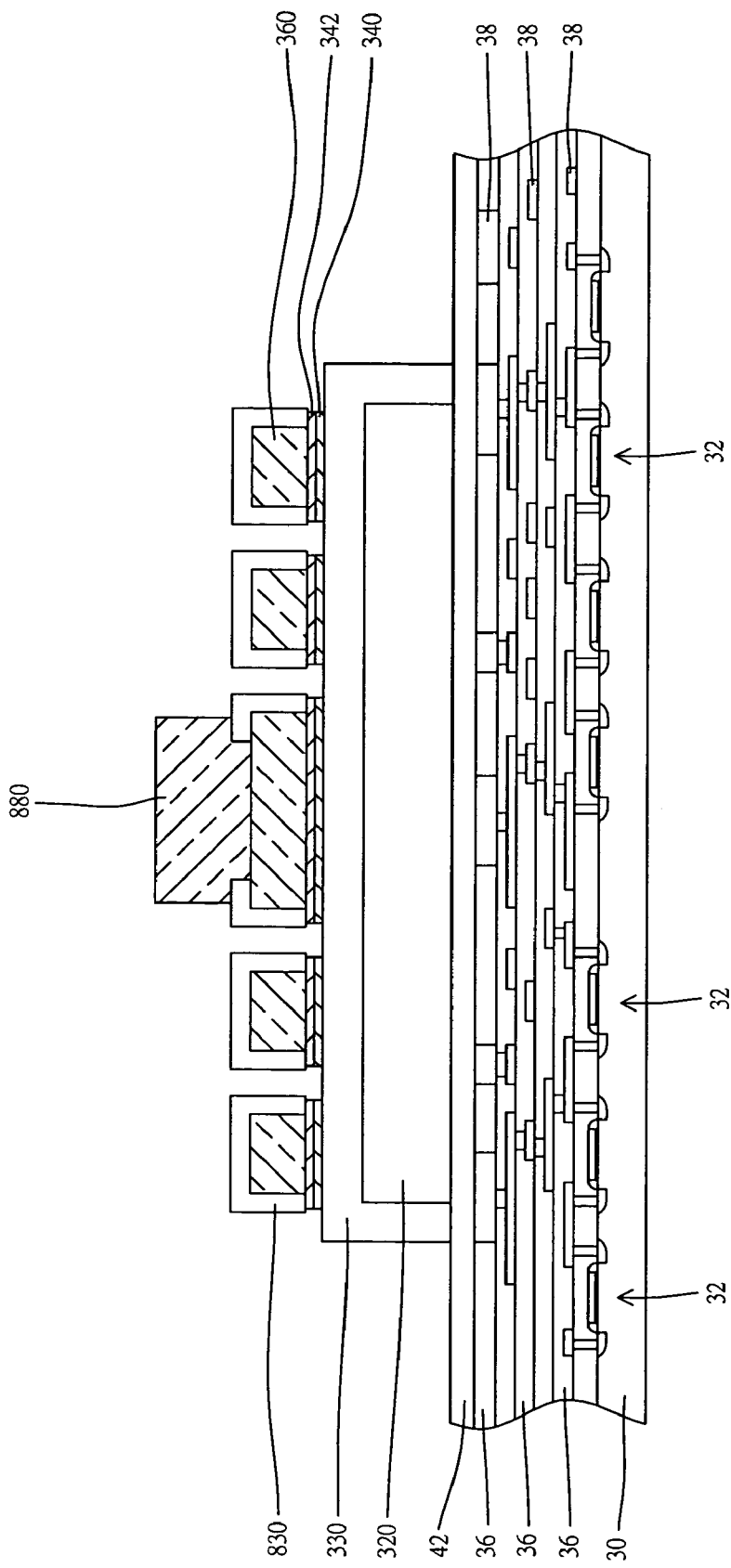

Referring to FIG. 64, the above-mentioned metal layer 880 may be used as a metal bump capable of being connected to an external circuitry (not shown), such as a ceramic substrate, a printed circuit board, semiconductor chip for chip-on-chip package, glass substrate for a chip-on-glass (COG) package, flex circuit substrate for a chip-on-film (COF) package, a tape carrier for tape-automated-bonded (TAB) package. In the application for COG, COF or TAB packages, the topmost layer of the metal layer 880 is preferably gold, which can be bonded to a metal layer, preferably of gold, formed on the above-mentioned external circuitry or to a metal layer, preferably of tin-containing material, formed on the above-mentioned external circuitry. Alternatively, an anisotropic conductive film (ACF) can be use to electrically connect the metal layer 880 to the above-mentioned external circuitry, such as glass substrate. In the application for being connected to a ceramic substrate, printed circuit board, or semiconductor chip, the topmost layer of the metal layer 880 is preferably tin-containing material, which can be bonded to a metal layer, preferably of gold, formed on the ceramic substrate, printed circuit board, or semiconductor chip, or to a metal layer, preferably of tin-containing material, formed on the ceramic substrate, printed circuit board, or semiconductor chip.

Figure 65:
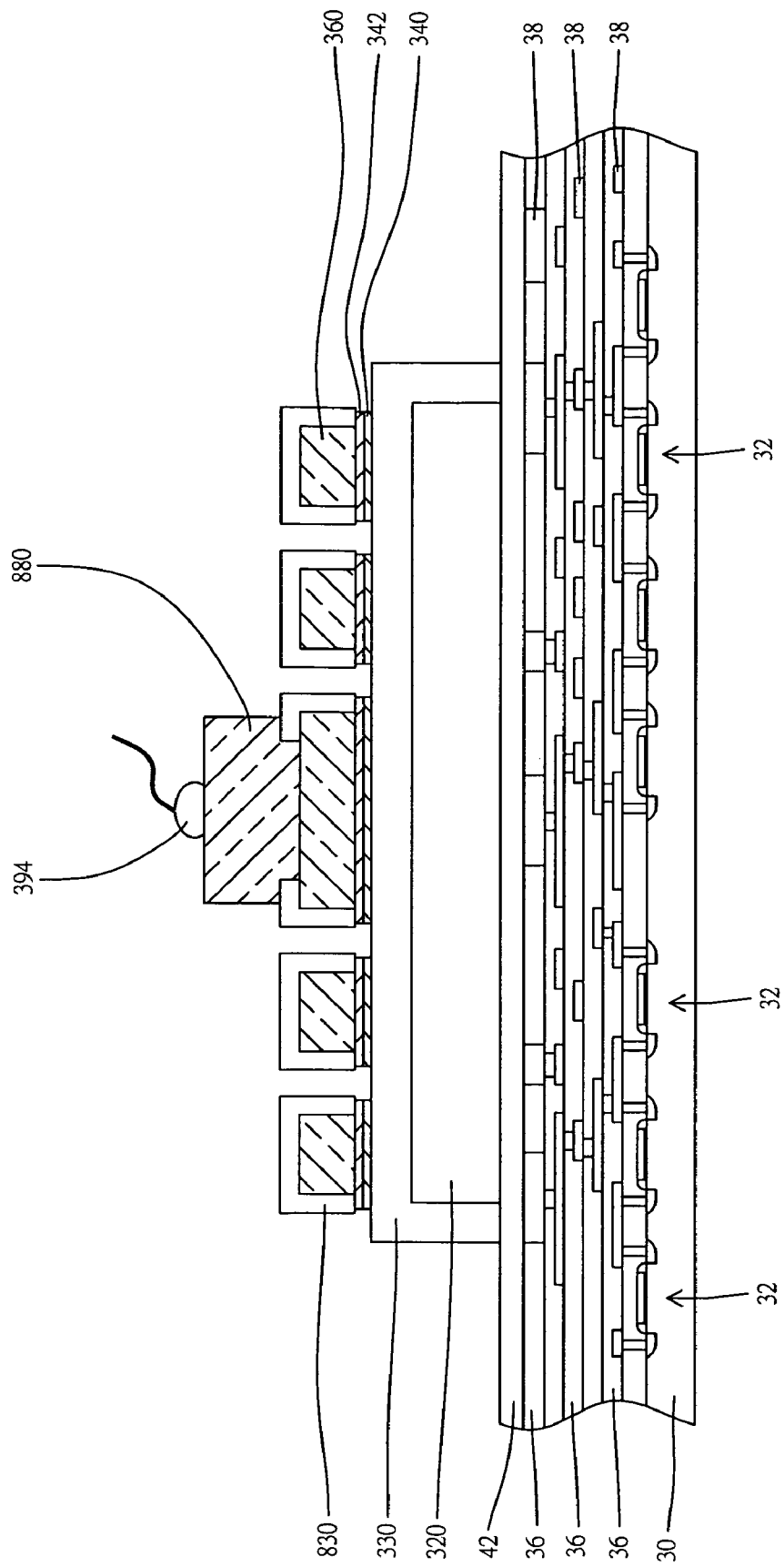

Alternatively, the metal layer 880 is used as a metal pad for being wirebonded thereto. A gold wire 394 can be bonded to the metal layer 880 using a wirebonding process, as shown in FIG. 65. The elements shown in FIG. 65 having same reference numbers as those shown in FIGS. 1-14, 57-58 and 61-64 indicate similar ones described above in FIGS. 1-14, 57-58 and 61-64.

Figure 66:
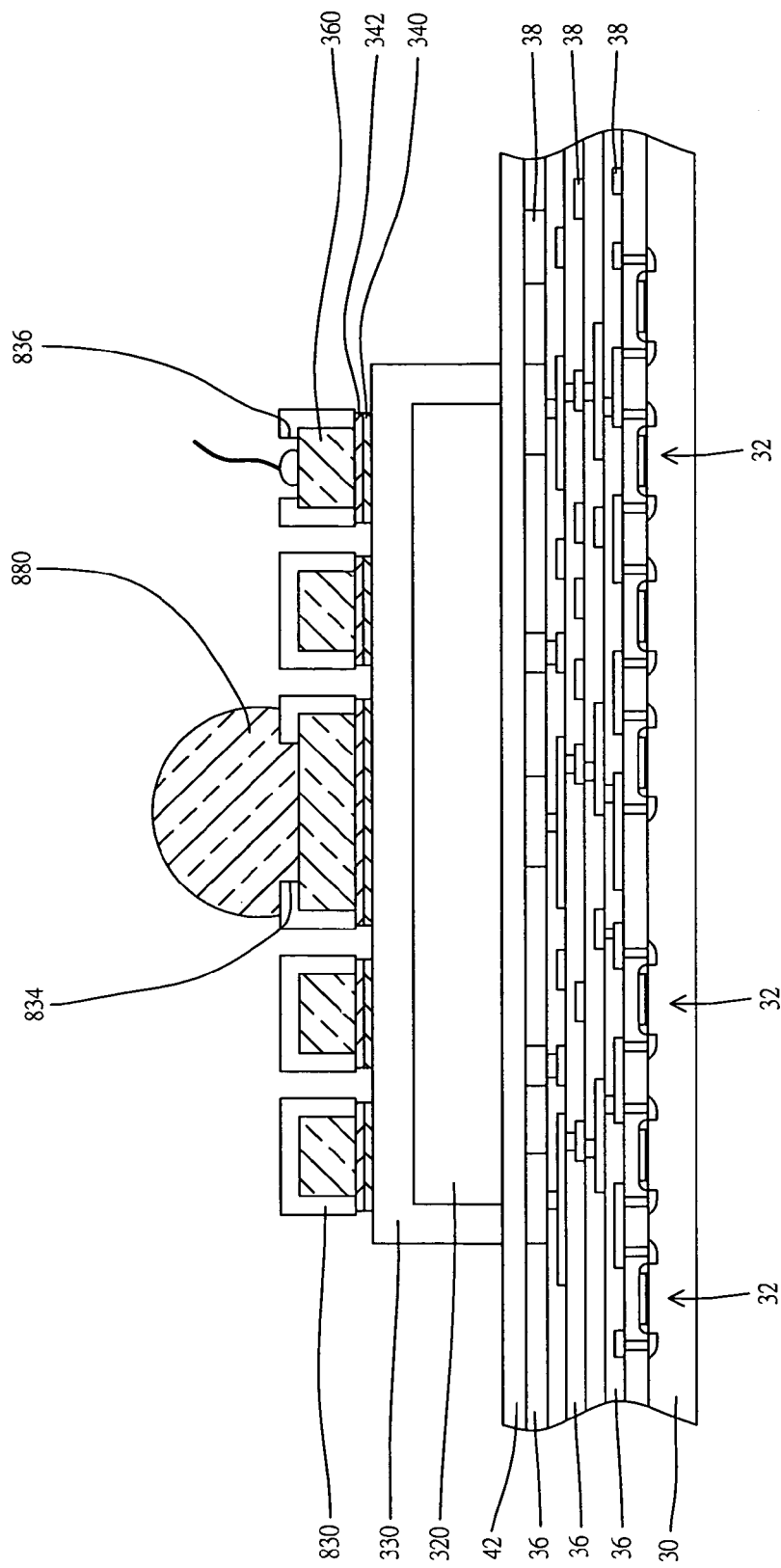

Alternatively, referring to FIG. 66, if the metal layer 880 includes a solder material, such as tin-lead alloy or a tin-silver alloy, the metal layer 880 after being reflowed may be shaped like a ball. Furthermore, the metal layer 360 may have another metal pad, exposed by another opening 836 in the patterned polymer layer 830, used to be wirebonded thereto. A gold wire 394 can be bonded to the metal layer 360 exposed by another opening 836 in the patterned polymer layer 830 using a wirebonding process. The openings 836 and 834 may be simultaneously formed using a photolithography process. The elements shown in FIG. 66 having same reference numbers as those shown in FIGS. 1-14, 57-58 and 61-64 indicate similar ones described above in FIGS. 1-14, 57-58 and 61-64.

Figure 67:
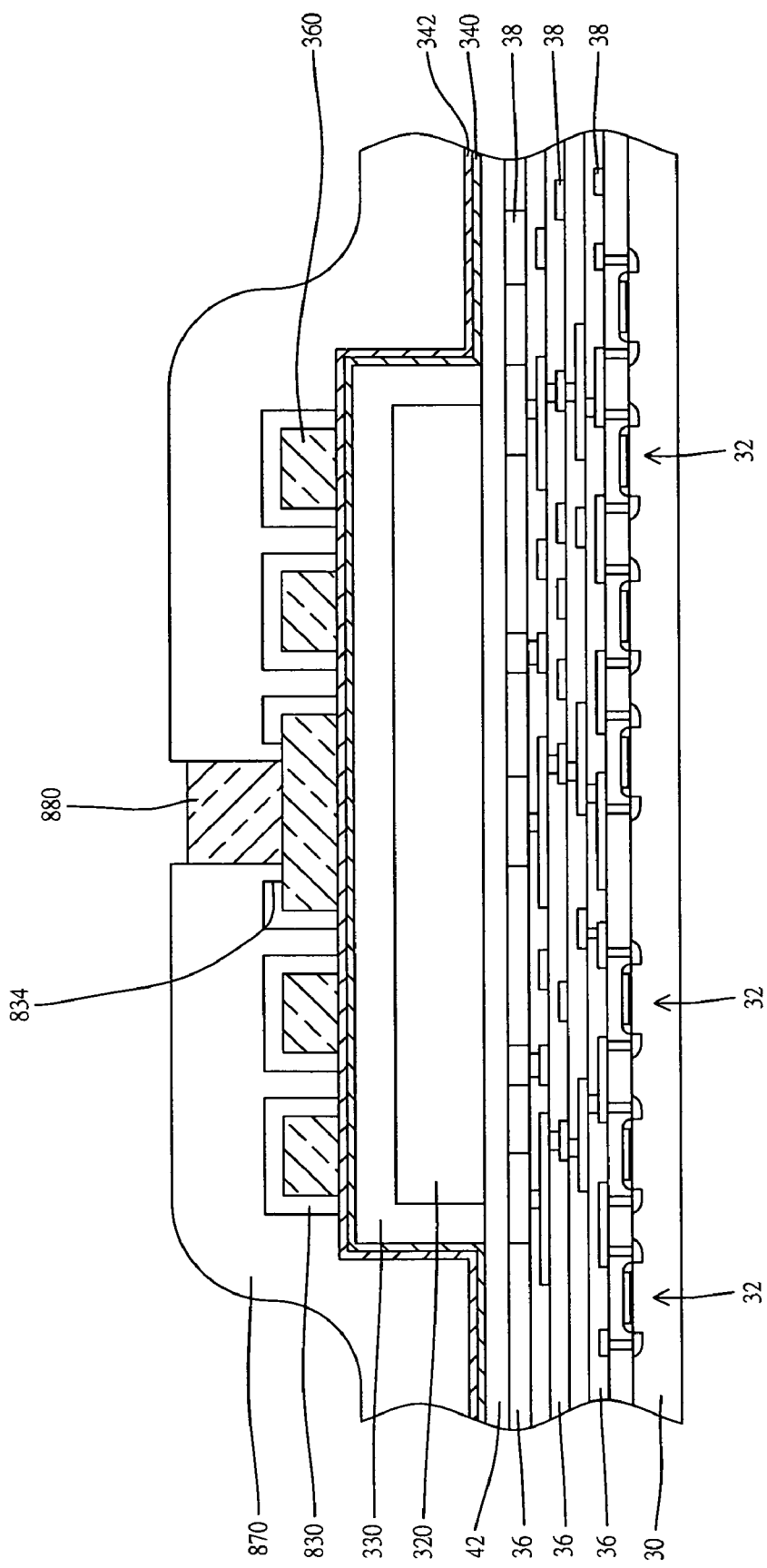

Alternatively, referring to FIG. 67, the above-mentioned metal layer 880 used to be wirebonded thereto or used as a metal bump bonded to an external circuitry may not cover the patterned polymer layer 830 close to the opening 834 therein. Accordingly, the photoresist layer 870 covers the peripheral region of the exposed surface of the metal layer 360 exposed by the opening 834 in the patterned polymer layer 830 and covers the patterned polymer layer 830 close to the opening 834 therein. The above-mentioned ideas in the paragraph can be incorporated into the process shown in FIGS. 61-64. The elements shown in FIG. 67 having same reference numbers as those shown in FIGS. 1-14, 57-58 and 61-64 indicate similar ones described above in FIGS. 1-14, 57-58 and 61-64.

Figure 68:
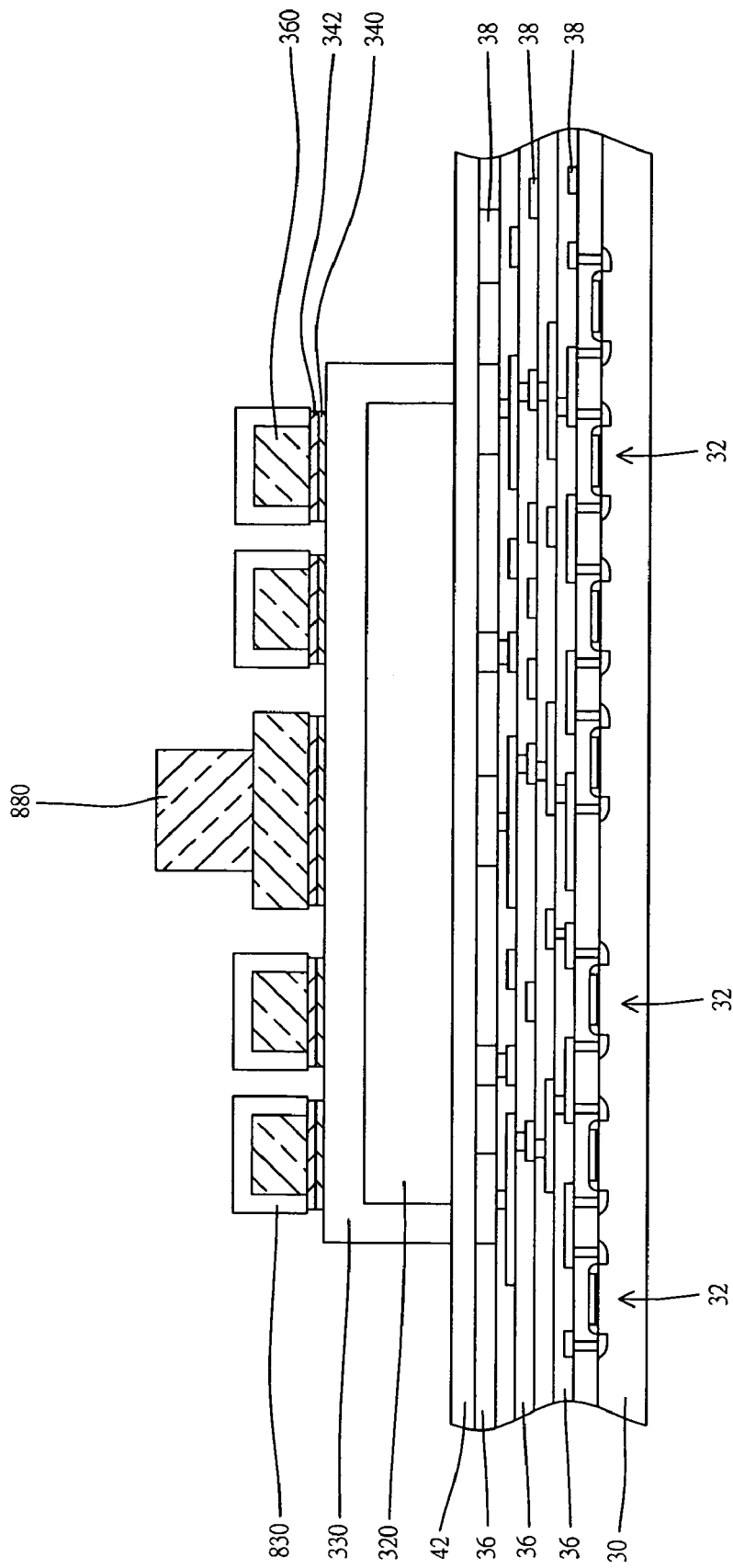

Alternatively, the metal layer 360 close to the metal layer 880 used to be wirebonded thereto or used as a metal bump bonded to an external circuitry may not be covered by the patterned polymer layer 830, as shown in FIG. 68. The elements shown in FIG. 68 having same reference numbers as those shown in FIGS. 1-14, 57-58 and 61-64 indicate similar ones described above in FIGS. 1-14, 57-58 and 61-64.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method for fabricating a circuit component, comprising:

providing a silicon substrate, a transistor in and on said silicon substrate, a first dielectric layer over said silicon substrate, a first circuit layer over said first dielectric layer, a second dielectric layer over said first circuit layer and over said first dielectric layer, a second circuit layer over said second dielectric layer, and a passivation layer over said first and second circuit layers and over said first and second dielectric layers, wherein said passivation layer comprises a nitride layer;

forming a first metal layer over said passivation layer;

forming a first photoresist layer on said first metal layer, wherein a first opening in said first photoresist layer exposes a first region of said first metal layer;

after said forming said first photoresist layer, forming a second metal layer over said first region;

after said forming said second metal layer, removing said first photoresist layer;

forming a second photoresist layer on said second metal layer, wherein a second opening in said second photoresist layer exposes a second region of said second metal layer;

after said forming said second photoresist layer, forming a third metal layer over said second region;

after said forming said third metal layer, removing said second photoresist layer;

after said removing said second photoresist layer and said removing said first photoresist layer, removing said first metal layer not under said second metal layer;

after said removing said first metal layer not under said second metal layer, forming a polymer layer on said second metal layer and on a top of said third metal layer;

removing said polymer layer on said top;

after said removing said polymer layer on said top, forming a fourth metal layer over said polymer layer and over said top;

after said forming said fourth metal layer, forming a third photoresist layer on said fourth metal layer, wherein a third opening in said third photoresist layer exposes a third region of said fourth metal layer;

after said forming said third photoresist layer, forming a fifth metal layer over said third region;

after said forming said fifth metal layer, removing said third photoresist layer;

after said forming said fifth metal layer, forming a fourth photoresist layer on said fifth metal layer, wherein a fourth opening in said fourth photoresist layer exposes a fourth region of said fifth metal layer;

after said forming said fourth photoresist layer, forming a sixth metal layer over said fourth region;

after said forming said sixth metal layer, removing said fourth photoresist layer; and after said removing said fourth photoresist layer and said removing said third photoresist layer, removing said fourth metal layer not under said fifth metal layer.

2. The method of claim 1, wherein said forming said second metal layer comprises electroplating a copper layer with a thickness between 1 and 20 micrometers on said first region and in said first opening.

3. The method of claim 1, wherein said forming said fifth metal layer comprises electroplating a copper layer with a thickness between 1 and 20 micrometers on said third region and in said third opening.

4. The method of claim 1, wherein said removing polymer on said top comprises polishing said polymer layer.

5. The method of claim 1, wherein said forming said third metal layer comprises electroplating a copper layer on said second region and in said second opening.

6. The method of claim 1, wherein said forming said sixth metal layer comprises electroplating a copper layer on said fourth region and in said fourth opening.

7. The method of claim 1, wherein said nitride layer has a thickness between 0.2 and 1.2 micrometers.

8. A method for fabricating a circuit component, comprising:

providing a silicon substrate, a transistor in and on said silicon substrate, a first dielectric layer over said silicon substrate, a first circuit layer over said first dielectric layer, a second dielectric layer over said first circuit layer and over said first dielectric layer, a second circuit layer in a first opening in said second dielectric layer, and a passivation layer over said first and second circuit layers and over said first and second dielectric layers, wherein said second circuit layer comprises a barrier layer at a bottom and a sidewall of said first opening and a first copper layer on said barrier layer, wherein said first copper layer comprises electroplated copper, wherein said passivation layer comprises a nitride layer;

forming a first metal layer over said passivation layer;

forming a first photoresist layer on said first metal layer, wherein a second opening in said first photoresist layer exposes a first region of said first metal layer;

after said forming said first photoresist layer, forming a second metal layer over said first region;

after said forming said second metal layer, removing said first photoresist layer;

after said removing said first photoresist layer, removing said first metal layer not under said second meter layer;

after said removing said first metal layer not under said second metal layer, forming a first polymer layer on said second metal layer and over said passivation layer;

forming a third metal layer over said first polymer layer and over said second metal layer, wherein said third metal layer is connected to said second metal layer through a third opening in said first polymer layer;

forming a second photoresist layer on said third metal layer, wherein a fourth opening in said second photoresist layer exposes a second region of said third metal layer;

after said forming said second photoresist layer, forming a fourth metal layer over said second region;

after said forming said fourth metal layer, removing said second photoresist layer;

after said forming said fourth metal layer, forming a third photoresist layer on said fourth metal layer, wherein a fifth opening in said third photoresist layer exposes a third region of said fourth metal layer;

after said forming said third photoresist layer, forming a fifth metal layer over said third region;

after said forming said fifth metal layer, removing said third photoresist layer; and after said removing said second photoresist layer and said removing said third photoresist layer, removing said third metal layer not under said fourth metal layer.

9. The method of claim 8, wherein said forming said second metal layer comprises electroplating a second copper layer with a thickness between 1 and 20 micrometers on said first region and in said second opening.

10. The method of claim 8, wherein said forming said first polymer layer comprises a spin coating process.

11. The method of claim 8 further comprising forming a second polymer layer on said passivation layer, followed by said forming said first metal layer further over said second polymer layer.

12. The method of claim 8, wherein said forming said fourth metal layer comprises electroplating a second copper layer on said second region and in said fourth opening.

13. The method of claim 8, wherein said nitride layer has a thickness between 0.2 and 1.2 micrometers.

14. A method for fabricating a circuit component, comprising:
   forming a first metal layer over a substrate;
   forming a first photoresist layer on said first metal layer, wherein a first opening in said first photoresist layer exposes a first region of said first metal layer;
   after said forming said first photoresist layer, forming a second metal layer over said first region;
   after said forming said second metal layer, removing said first photoresist layer;
   after said removing said first photoresist layer, forming a polymer layer on said second metal layer and on said first metal layer, wherein a second opening in said polymer layer exposes a second region of said second metal layer; and
   removing said first metal layer not under said polymer layer.

15. The method of claim 14, after said forming said polymer layer, further comprising:
   forming a second photoresist layer on said first metal layer and on said polymer layer, wherein a third opening in said second photoresist layer exposes said second region;
   after said forming said second photoresist layer, forming a third metal layer over said second region; and
   after said forming said third metal layer, removing said second photoresist layer, followed by said removing said first metal layer not under said polymer layer.

16. The method of claim 15, wherein said forming said third metal layer comprises forming a gold layer over said second region and in said second opening.

17. The method of claim 15, wherein said forming said third metal layer comprises electroplating a tin-containing layer over said second region and in said second opening.

18. The method of claim 15, wherein said forming said third metal layer comprises electroplating a copper layer on said second region and in said second opening.

19. The method of claim 14, wherein said forming said second metal layer comprises electroplating a copper layer with a thickness between 1 and 20 micrometers on said first region and in said first opening.

20. The method of claim 14, wherein said forming said polymer layer comprises a spin coating process.

21. A method for fabricating a circuit component, comprising:
   forming a first metal layer over a substrate;
   forming a first photoresist layer on said first metal layer, wherein a first opening in said first photoresist layer exposes a first region of said first metal layer;
   forming a second metal layer over said first region;
   after said forming said second metal layer, removing said first photoresist layer;
   after said removing said first photoresist layer, removing said first metal layer not under said second metal layer;
   after said removing said first metal layer not under said second metal layer, forming a polymer layer over said second metal layer and over said substrate;
   forming a third metal layer over said polymer layer and over said second metal layer, wherein said third metal layer is connected to said second metal layer through a second opening in said polymer layer;
   forming a second photoresist layer on said third metal layer, wherein a third opening in said second photoresist layer exposes a second region of said third metal layer;
   forming a fourth metal layer over said second region;
   after said forming said fourth metal layer, removing said second photoresist layer;
   forming a third photoresist layer on said fourth metal layer, wherein a fourth opening in said third photoresist layer exposes a third region of said fourth metal layer;
   forming a fifth metal layer over said third region;
   after said forming said fifth metal layer, removing said third photoresist layer; and
   after said removing said third photoresist layer and said removing said second photoresist layer, removing said third metal layer not under said fourth metal layer.

22. The method of claim 21, wherein said forming said second metal layer comprises electroplating a copper layer with a thickness between 1 and 20 micrometers on said first region and in said first opening.

23. The method of claim 21, wherein said forming said fourth metal layer comprises electroplating a copper layer on said second region and in said third opening.

* * * * *